(12) United States Patent
Jain

(10) Patent No.: US 7,259,106 B2
(45) Date of Patent: Aug. 21, 2007

(54) METHOD OF MAKING A MICROELECTRONIC AND/OR OPTOELECTRONIC CIRCUITRY SHEET

(75) Inventor: Ajaykumar R. Jain, San Carlos, CA (US)

(73) Assignee: Versatilis LLC, Shelburne, VT (US)

( * ) Notice: Subject to any disclaimer, the term of this patent is extended or adjusted under 35 U.S.C. 154(b) by 0 days.

(21) Appl. No.: 11/223,515

(22) Filed: Sep. 9, 2005

(65) Prior Publication Data

US 2006/0063351 A1 Mar. 23, 2006

Related U.S. Application Data

(60) Provisional application No. 60/673,519, filed on Apr. 22, 2005, provisional application No. 60/616,530, filed on Oct. 7, 2004, provisional application No. 60/608,328, filed on Sep. 10, 2004.

(51) Int. Cl.
*H01L 21/027* (2006.01)
(52) U.S. Cl. .................. 438/737; 257/E21.027
(58) Field of Classification Search ............. 438/705, 438/734, 736, 737; 257/E21.023, E21.024, 257/E21.027, E21.037
See application file for complete search history.

(56) References Cited

U.S. PATENT DOCUMENTS

| | | | | |
|---|---|---|---|---|
| 4,023,197 A * | 5/1977 | Magdo et al. | ............... | 257/700 |
| 4,237,600 A * | 12/1980 | Rosen et al. | ................. | 438/109 |
| 5,817,550 A | 10/1998 | Carey et al. | ................. | 438/166 |
| 6,028,362 A * | 2/2000 | Omura | ........................ | 257/774 |
| 6,150,256 A * | 11/2000 | Furukawa et al. | .......... | 438/618 |
| 6,291,266 B1 | 9/2001 | Sayyah | ........................ | 438/107 |
| 6,376,290 B1 | 4/2002 | Gosain et al. | .............. | 438/166 |
| 6,517,995 B1 | 2/2003 | Jacobson et al. | ........... | 430/320 |
| 6,642,092 B1 | 11/2003 | Voutsas et al. | ............. | 438/166 |
| 6,653,030 B2 | 11/2003 | Mei et al. | ........................ | 430/5 |
| 6,680,485 B1 | 1/2004 | Carey et al. | ................... | 257/57 |
| 6,861,365 B2 | 3/2005 | Taussig et al. | | |
| 6,885,032 B2 | 4/2005 | Forbes et al. | .................. | 257/72 |
| 6,887,792 B2 | 5/2005 | Perlov et al. | ................ | 438/703 |
| 6,930,020 B2 | 8/2005 | Sayyah | ........................ | 438/455 |
| 7,056,834 B2 | 6/2006 | Mei et al. | | |
| 2001/0026444 A1 * | 10/2001 | Matsushima et al. | ........ | 361/763 |
| 2002/0019081 A1 | 2/2002 | Denis | ......................... | 438/149 |
| 2002/0020875 A1 | 2/2002 | Arao et al. | ................... | 257/347 |
| 2002/0064902 A1 | 5/2002 | Sayyah | ......................... | 438/107 |
| 2003/0040164 A1 | 2/2003 | Inoue et al. | ................. | 438/438 |
| 2003/0134460 A1 | 7/2003 | Forbes et al. | ................ | 438/158 |
| 2003/0138704 A1 | 7/2003 | Mei et al. | | |

(Continued)

*Primary Examiner*—Wael Fahmy
*Assistant Examiner*—Jennifer M Dolan
(74) *Attorney, Agent, or Firm*—Downs Rachlin Martin PLLC

(57) ABSTRACT

A circuitry sheet (322) comprising an electronic device layer stack (304) containing electronic devices, e.g., thin-film transistors, or portions thereof, formed by removing material from both sides of the device layer stack. The circuitry sheet may be made by an electronic/optoelectronic device manufacturing method (200) that includes the steps of forming the device layer stack on a temporary substrate (300), removing material from both sides of the device layer stack, and then attaching a permanent substrate (348) to the device layer stack. The method uses one or more resist layers (600) that may be activated simultaneously and independently to impart distinct circuit pattern images (603, 608, 612) into each of a plurality of image levels (612, 616, 620) within each resist layer, thereby obviating repetitive sequential exposure, registration and alignment steps.

11 Claims, 58 Drawing Sheets

U.S. PATENT DOCUMENTS

| | | | |
|---|---|---|---|
| 2003/0142062 A1 | 7/2003 | Turner et al. | 345/107 |
| 2003/0157783 A1 | 8/2003 | Fonash et al. | 438/458 |
| 2003/0172873 A1 | 9/2003 | Fischer et al. | 118/718 |
| 2003/0173890 A1 | 9/2003 | Yamazaki et al. | 313/498 |
| 2003/0178623 A1 | 9/2003 | Nishiki et al. | 257/59 |
| 2003/0188426 A1 | 10/2003 | Naugler, Jr. | 29/831 |
| 2003/0219923 A1 | 11/2003 | Nathan et al. | 438/99 |
| 2003/0222315 A1 | 12/2003 | Amundson et al. | 257/368 |
| 2003/0224582 A1 | 12/2003 | Shimoda et al. | 438/458 |
| 2004/0002216 A1 | 1/2004 | Taussig et al. | |
| 2004/0014265 A1 | 1/2004 | Kazlas et al. | 438/200 |
| 2004/0022513 A1* | 2/2004 | Hryniewicz et al. | 385/131 |
| 2004/0038497 A1 | 2/2004 | Sayyah | 438/464 |
| 2004/0054980 A1 | 3/2004 | Perlov et al. | |
| 2004/0087066 A1 | 5/2004 | Voutsas | 438/147 |
| 2004/0090415 A1 | 5/2004 | Albert et al. | 345/107 |
| 2004/0095457 A1 | 5/2004 | Pokorny et al. | 347/171 |
| 2004/0101998 A1 | 5/2004 | Voutsas et al. | 438/166 |
| 2004/0108504 A1 | 6/2004 | Forbes et al. | 257/72 |
| 2004/0110326 A1 | 6/2004 | Forbes et al. | 438/149 |
| 2004/0144988 A1 | 7/2004 | Jung | 257/98 |
| 2004/0180295 A1* | 9/2004 | Chang | 430/313 |
| 2004/0256352 A1 | 12/2004 | Perlov et al. | |

* cited by examiner

FIG. 3H5
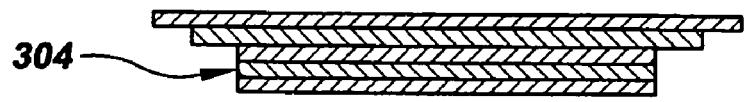
FIG. 3I
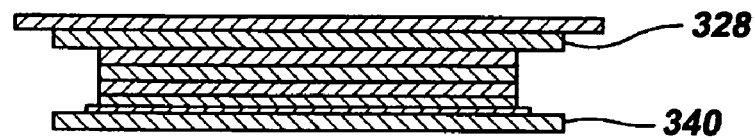
FIG. 3J
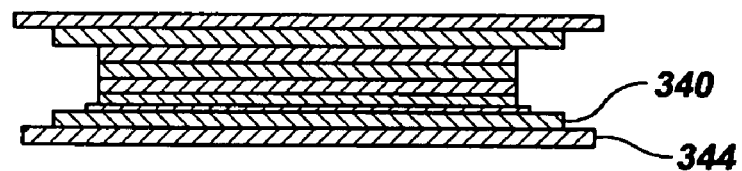
FIG. 3K
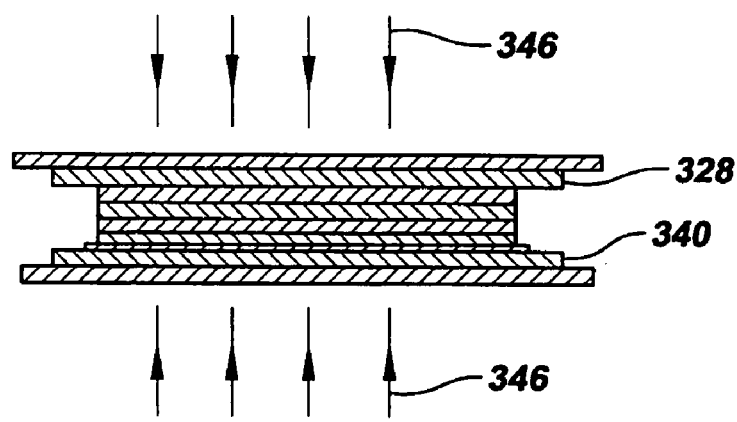

FIG.8O1

FIG.8O2
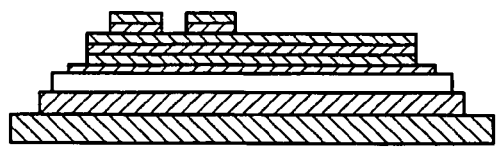
FIG.8P
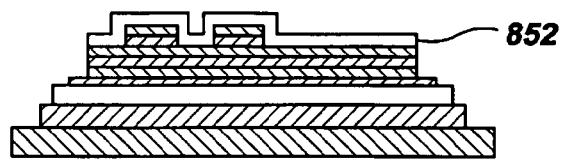
FIG.8Q1
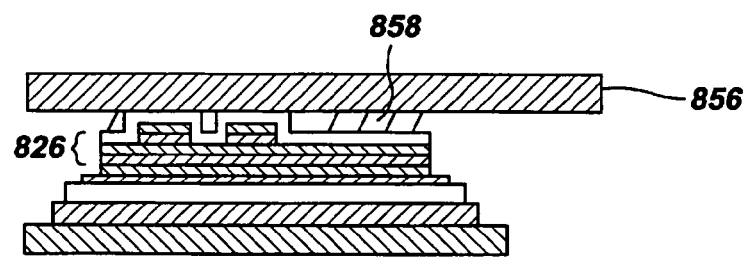
FIG.8Q2
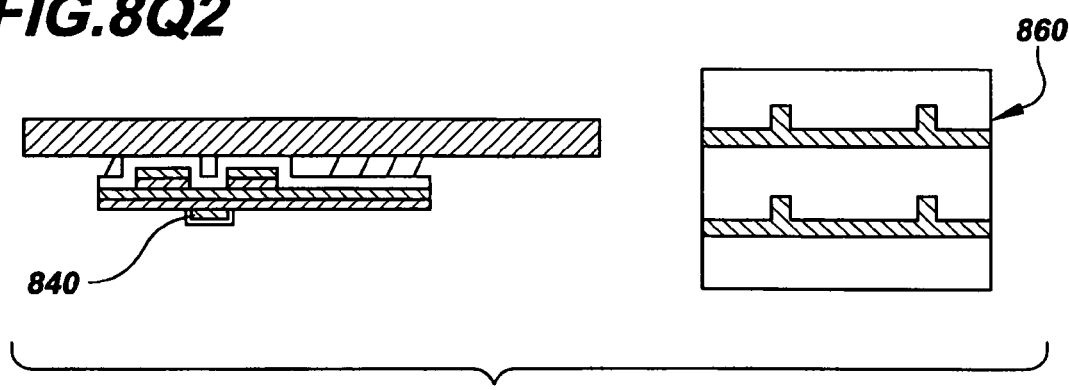

FIG.8Q3
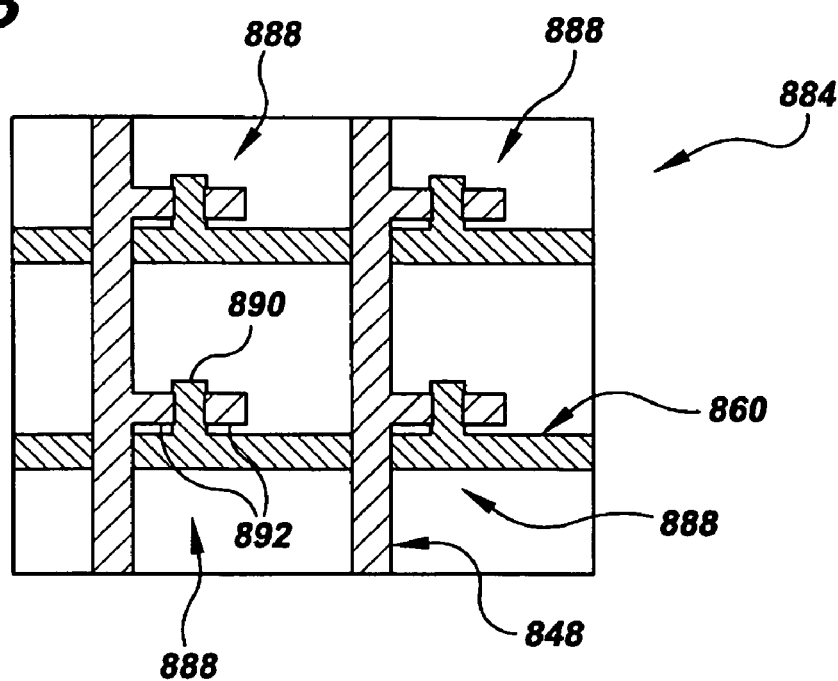
FIG.8R
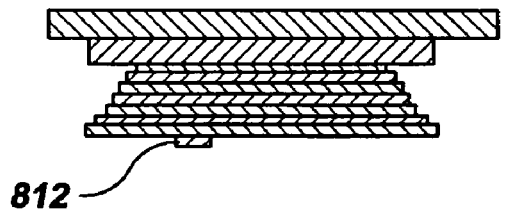

FIG.9P1
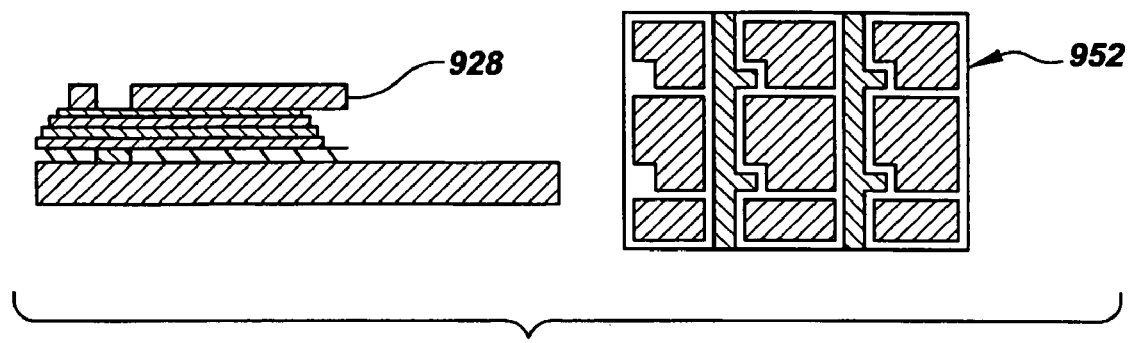
FIG.9Q
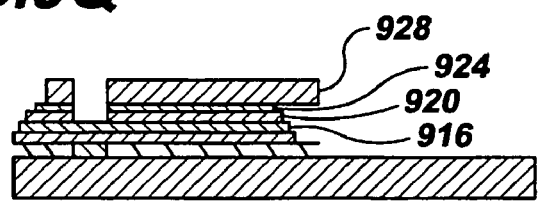
FIG.9R
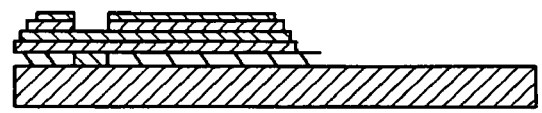
FIG.9S
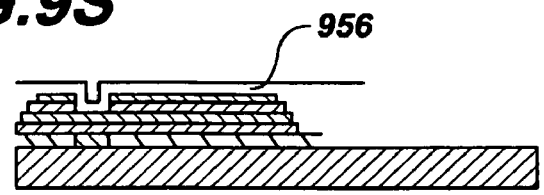

FIG.9P2
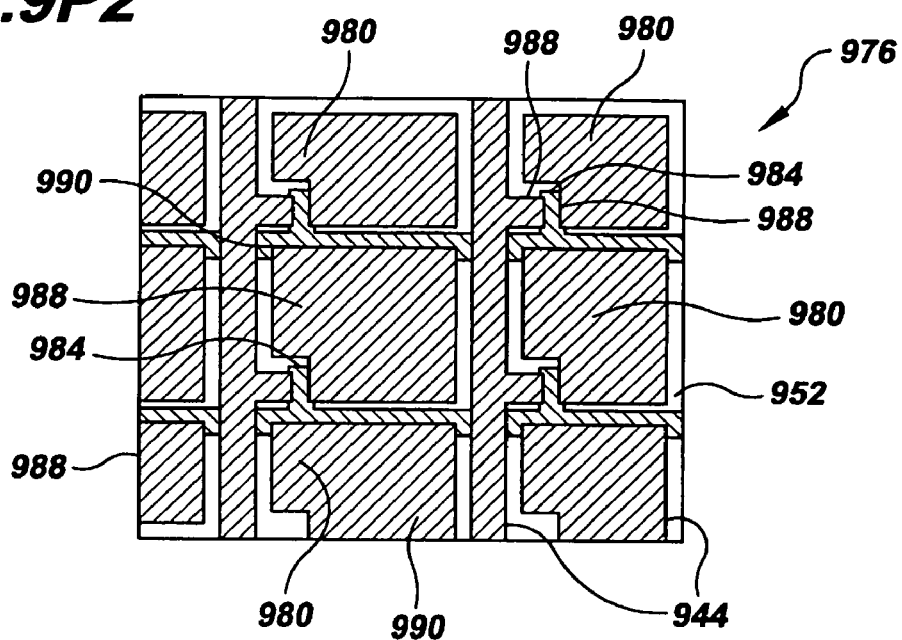
FIG.9T
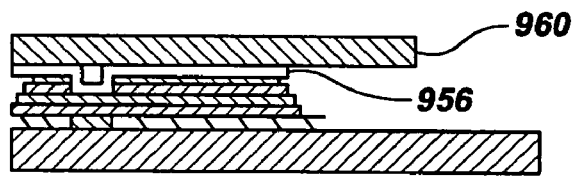
FIG.9U
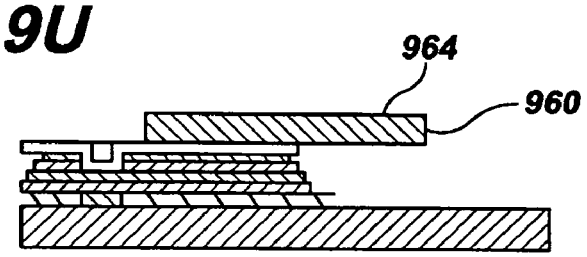
FIG.9V
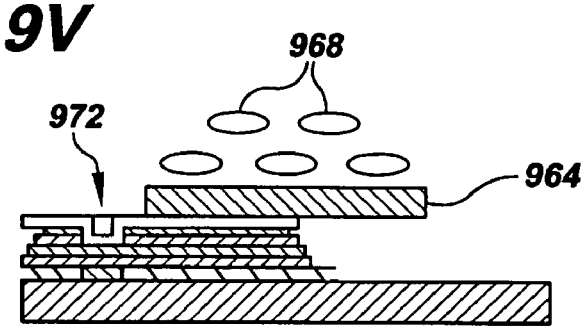

FIG.11O3
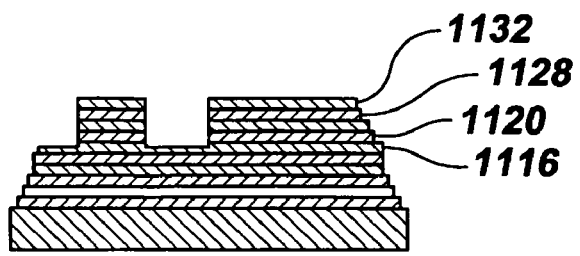
FIG.11P
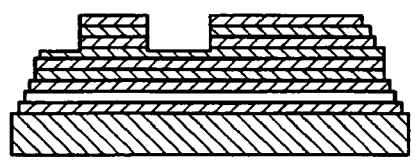
FIG.11Q
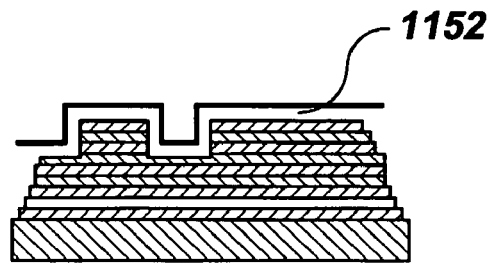
FIG.11R
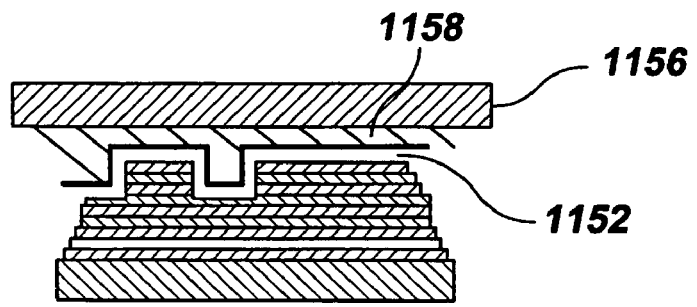
FIG.11S1
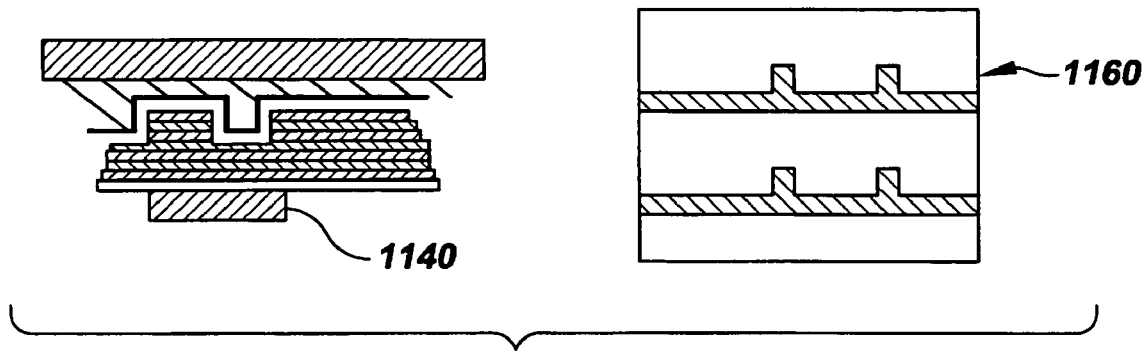

FIG.11S2
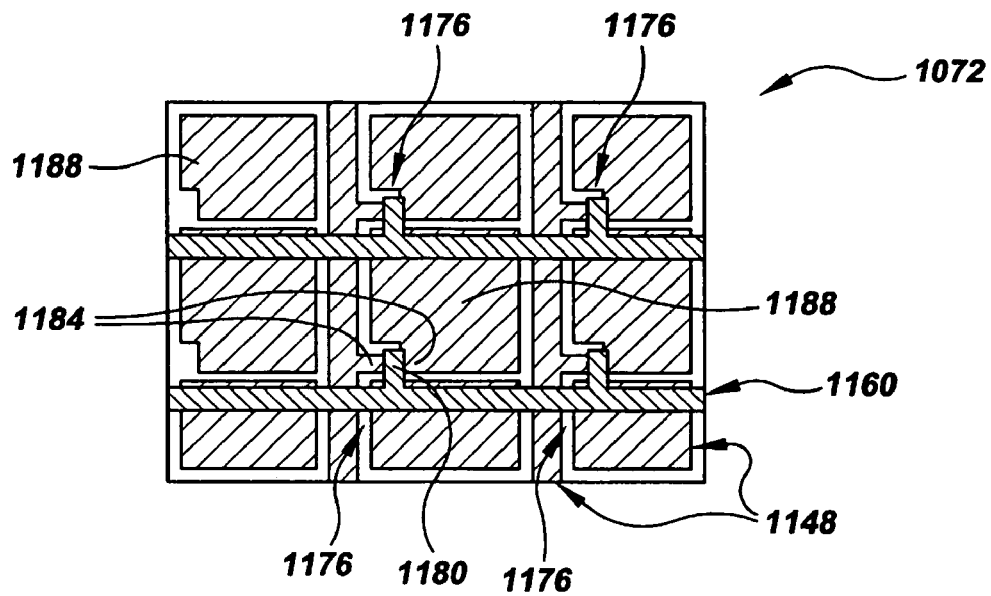
FIG.11T
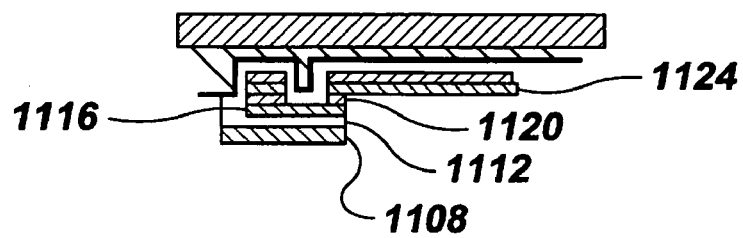
FIG.11U
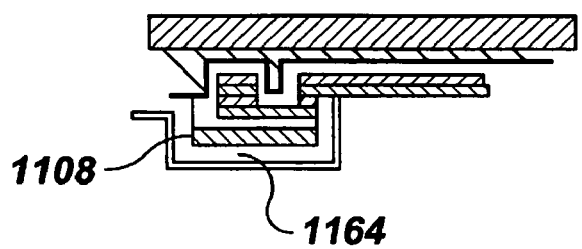
FIG.11V
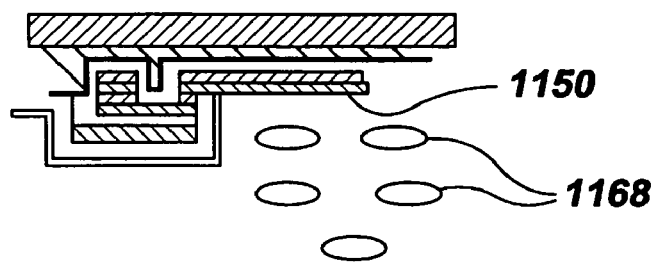

METHOD OF MAKING A MICROELECTRONIC AND/OR OPTOELECTRONIC CIRCUITRY SHEET

RELATED APPLICATION DATA

This application claims the benefit of priority of U.S. Provisional Patent Application Ser. No. 60/608,328, filed Sep. 10, 2004, and titled "Method For Manufacturing Roll To Roll Electronics," U.S. Provisional Patent Application Ser. No. 60/616,530, filed Oct. 7, 2004, and titled "Additional Manufacturing Methods For Roll To Roll Electronics," and U.S. Provisional Patent Application Ser. No. 60/673,519, filed Apr. 22, 2005, titled "Additional Addendum To Method Of Manufacturing Roll To Roll Electronics," each of which is incorporated by reference herein in its entirety.

FIELD OF THE INVENTION

The present invention generally relates to the field of microelectronics and optoelectronics. In particular, the present invention is directed to a microelectronic or optoelectronic circuitry sheet and method of making same.

BACKGROUND OF THE INVENTION

The electronic display industry, in its continual quest for increasing efficiency, is constantly scaling up the areal, or sheet, size of the substrates (typically glass) carrying the pixel matrices of the displays. However, the ever-increasing substrate sizes create significant manufacturing and engineering challenges relative to their use, handling and transportation. Furthermore, the upfront capital investment in infrastructure needed to process these large sheets of glass for each subsequent generation of fabrication facility has ballooned to upwards of $2 Billion. It is interesting to note that even though the underlying substrate sizes have increased, the photolithography used in fabricating electronic displays is still performed using step and scan exposure systems, in which the exposure size is typically much smaller than the substrate size. Similarly, semiconductors in general are manufactured using multiple photolithographic steps on ever larger wafers (substrates).

Trends in the display industry, and electronics industry generally, suggest that further display and electronic products will be made on flexible/conformal substrates, and optimally although not necessarily in a roll-to-roll, or reel-to-reel fashion. This transition is seen as inevitable to service the ever-present need and desire to reduce the size, weight and cost of the products without sacrificing performance. A wide gamut of products from displays, electronics and sensors, to name a few, would benefit from processes that result in the mass production of ruggedized, lightweight, portable, small form factor, less power hungry and lower cost electronic components. In addition, new and novel markets and opportunities could be addressed and opened up if these components could be made flexible and/or conformal.

In order to counter the ever-growing substrate size dilemma and to service future flexible needs, attempts have been made, and are ongoing, to develop manufacturing processes that would allow for roll-to-roll, or reel-to-reel (also called "web coaters"), technologies to be implemented such that flexible substrates, such as polymers/plastic foils and metal foils, may be substituted for rigid glass substrates. However, attempts made have had limited success, primarily due to the complexity of manufacturing the electronic devices, such as thin-film transistors (TFTs), of the displays. Typical manufacturing processes for such devices include multiple coatings, or layers, deposited at high temperature, interspaced with multiple photolithography patterning steps.

It is commonly known that polymers/plastics, if used as substrate material for electronic devices, severely limit the maximum temperature that may be used during the manufacturing of the end product. In addition, in order to inhibit undue out-gassing and contamination of equipment and devices during coating depositions, plastic substrates need to undergo a complex and time consuming pre-bake thermal cycling step. This pre-bake step also serves to expel moisture from the native polymer substrate, thereby stabilizing its coefficient of thermal expansion, which assists in the photolithography patterning and alignment steps.

Metal foils, on the other hand, are more resilient than polymers/plastics and tend to be immune from the temperature limit imposed by polymers/plastics. However, to date, TFTs made on metal foils have exhibited low electronic performance due to contamination effects and other unknowns attributed to high surface roughness of starting metal substrates. They are also typically opaque which limits their usefulness for displays.

Furthermore, the use of flexible substrates has placed heavy demands on engineering new ways and equipment to address: dimensional stability of substrates during lithography; mechanics for handling substrate curvature; registration accuracy; and consistency of placement of TFTs and electrodes. In this connection, flexible polymer/plastic substrates have had issues with moisture absorption, resistance to chemicals and solvents.

One of the more significant of the technical challenges to using flexible substrates that has slowed or stymied attempts at roll-to-roll manufacturing of electronic devices on either polymers/plastics or metal foils is the issue with photolithography registration and photolithography alignment due to the number of coatings and photo masking steps involved in manufacturing traditional TFTs.

FIGS. 1A and 1B illustrate, respectively, a portion of an array 10 of conventional pixel cells, such as may be found in a number of active matrix backplane type displays, and a cross-section through a portion of one of the pixel cells. In this example each pixel cell 14 generally comprises a TFT 18, a storage capacitor 22 and a pixel electrode 24 made of indium tin oxide (ITO). Referring particularly to FIG. 1B, the various layers that make up each cell include a glass substrate layer 28 (e.g., a 0.7 mm thick piece of Corning 1737 glass), a gate electrode layer 32 (made of, e.g., chromium (Cr)), a gate insulator layer 36 (e.g., a silicon nitride (SiNx) layer), a pixel electrode layer 40 (made of, e.g., ITO), a channel layer 44 (e.g., an amorphous silicon (a-Si) layer), an ohmic contact layer 48 (e.g., an n+ a-Si layer), a source/drain metal electrode layer 52 (made of, e.g., Cr) and a passivation layer 56 (e.g., a SiN layer).

Following is a typical conventional set of steps, or recipe, that a manufacturer may use to form pixel cells 14 of FIGS. 1A-B:

| | |
|---|---|
| Step #1: | prepare staging area; |
| Step #2: | clean glass substrate 28; |
| Step #3: | sputter deposit gate metal layer 32; |
| Step #4: | clean, coat and cure photoresist (not shown); |
| Step #5: | align mask 1 (not shown) and expose; |

-continued

| Step #6: | develop resist, etch gate metal, strip photoresist and dry with air knives; |
|---|---|
| Step #7: | deposit silicon nitride layer 36, amorphous silicon (or polysilicon) layer 44 and n+ dopant layer 48; |
| Step #8: | clean, coat and cure photoresist (not shown); |
| Step #9: | align mask 2 (not shown) and expose; |
| Step #10: | develop resist, rinse and dry with air knives; |
| Step #11: | dry etch a-Si pattern into layers 44 and 48 and strip photoresist; |
| Step #12: | ultrasonic clean; |
| Step #13: | sputter deposit ITO layer 40; |
| Step #14: | clean, coat and cure photoresist (not shown); |
| Step #15: | align mask 3 (not shown) and expose; |
| Step #16: | develop, etch ITO layer 40, strip photoresist and dry with air knives; |
| Step #17: | sputter deposit S/D and interconnect metal layer 52; |
| Step #18: | clean, coat and cure photoresist (not shown); |
| Step #19: | align mask 4 (not shown) and expose; |
| Step #20: | develop, etch S/D and interconnect metal layer 48, strip photoresist and dry with air knives; |
| Step #21: | dry etch n+ doped layer 48; |
| Step #22: | deposit passivation layer 56 using plasma-enhanced chemical vapor deposition; |
| Step #23: | clean, coat and cure photoresist (not shown); |
| Step #24: | align mask 5 (not shown) and expose; |
| Step #25: | develop and rinse photoresist and dry with air knives; |
| Step #26: | dry etch passivation layer and strip photoresist; |
| Step #27: | ultrasonic clean; |
| Step #28: | test and review; and |
| Step #29: | laser repair shorts. |

It is noted that this recipe is for a traditional rigid platform. Converting this to a roll-to-roll process may also require intermediary steps of unwinding and rewinding the substrate roll between steps if the process is not continuous, and some degree of winding and unwinding is unavoidable in transporting the working substrate between stations in a continuous process. Note in the foregoing recipe the number of masks required, each requiring that a mask must be aligned in order for the corresponding subsequently patterned layer to be in proper registration with the other layers so as to create properly functioning devices. These alignment steps are a hindrance to achieving high device yield and efficient processing, especially in a roll-to-roll process wherein these alignment steps must be performed in conjunction with unwinding and rewinding, which makes the aligning all the more difficult.

Various efforts to date have demonstrated low pixel density TFTs having marginal performance on metal/polyimide substrates. However, what is really needed by the industry as a whole is a methodology that uses a low mask count TFT design and that has roll-to-roll continuous processing capability and that utilizes techniques and equipment that circumvent issues such as photolithography registration and alignment. The present invention includes such a methodology that essentially renders irrelevant dimensional stability of the substrate due to temperature and allows for the realization of high-resolution displays and the fabrication of other electronic products.

SUMMARY OF THE INVENTION

One aspect of the present invention is a method of manufacturing an electronic or optoelectronic circuitry sheet. One step of the method comprises forming a stack having a plurality of unpatterned device layers. The stack has a first surficial side and a second surficial side opposite said first surficial side. A next step involves removing material from the stack on the first surficial side in a first predetermined pattern so as to at least partially form a plurality of devices. Then, material is removed from the stack on the second surficial side in a second predetermined pattern so as to at least partially form the plurality of devices.

Another aspect of the present invention is a method of manufacturing an electronic or optoelectronic circuitry sheet comprising providing a first substrate and forming on the first substrate a stack comprising a plurality of unpatterned electronic device layers. The stack has a first surficial side facing the substrate. Next, the first substrate is removed. Then, material is removed from the stack on the first surficial side in a predetermined pattern so as to at least partially form a plurality of electronic devices.

Yet another aspect of the invention is a method of manufacturing an electronic or optoelectronic circuitry sheet that comprises forming a device layer stack having a plurality of unpatterned device layers. Next, a resist layer is located in working relation with the device layer stack. Then, the resist layer is activated so as to impart a plurality of images distinct from one another at different imaging levels within the resist layer.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein:

FIGS. 8M and 8Q2 each also contain a plan view of a mask pattern applicable to the corresponding respective step of the recipe, and FIG. 8Q3 shows an overlay of the mask patterns of FIGS. 8M and 8Q2;

FIGS. 9A-9V contain partial cross-sectional views of layered structures formed during various steps of the particular recipe of Example 2 for the EDM method of FIGS. 2A-B; FIGS. 9M and 9P1 each also contain a plan view of a mask pattern applicable to the corresponding respective step of the recipe, and FIG. 9P2 shows and overlay of the mask patterns of FIGS. 9M and 9P1;

FIGS. 10M and 10R1 each also contain a plan view of a mask pattern applicable to the corresponding respective step of the recipe, and FIG. 10R2 shows an overlay of the mask patterns of FIGS. 10M and 10R1;

FIGS. 11A-11V contain partial cross-sectional views of layered structures formed during various steps of the particular recipe of Example 4 for the EDM method of FIGS. 2A-B; FIGS. 11N and 11S1 each also contain a plan view of a mask pattern applicable to the corresponding respective step of the recipe, and FIG. 11S2 shows an overlay of the mask patterns of FIGS. 11N and 11S1;

FIGS. 13N, 13Q and 13W1 each also contain a plan view of a mask pattern applicable to the corresponding respective step of the recipe, and FIG. 13W2 shows an overlay of the mask patterns of FIGS. 13N, 13Q and 13W1;

FIGS. 14P, 14T, 14Z and 14AB1 each also contain a plan view of a mask pattern applicable to the corresponding respective step of the recipe, and FIG. 14AB2 shows an overlay of the mask patterns of FIGS. 14P, 14T, 14Z and 14AB1;

FIGS. 15Q, 15U, 15AA and 15AE each also contain a plan view of a mask pattern applicable to the corresponding respective step of the recipe.

DETAILED DESCRIPTION

Figure 1A:
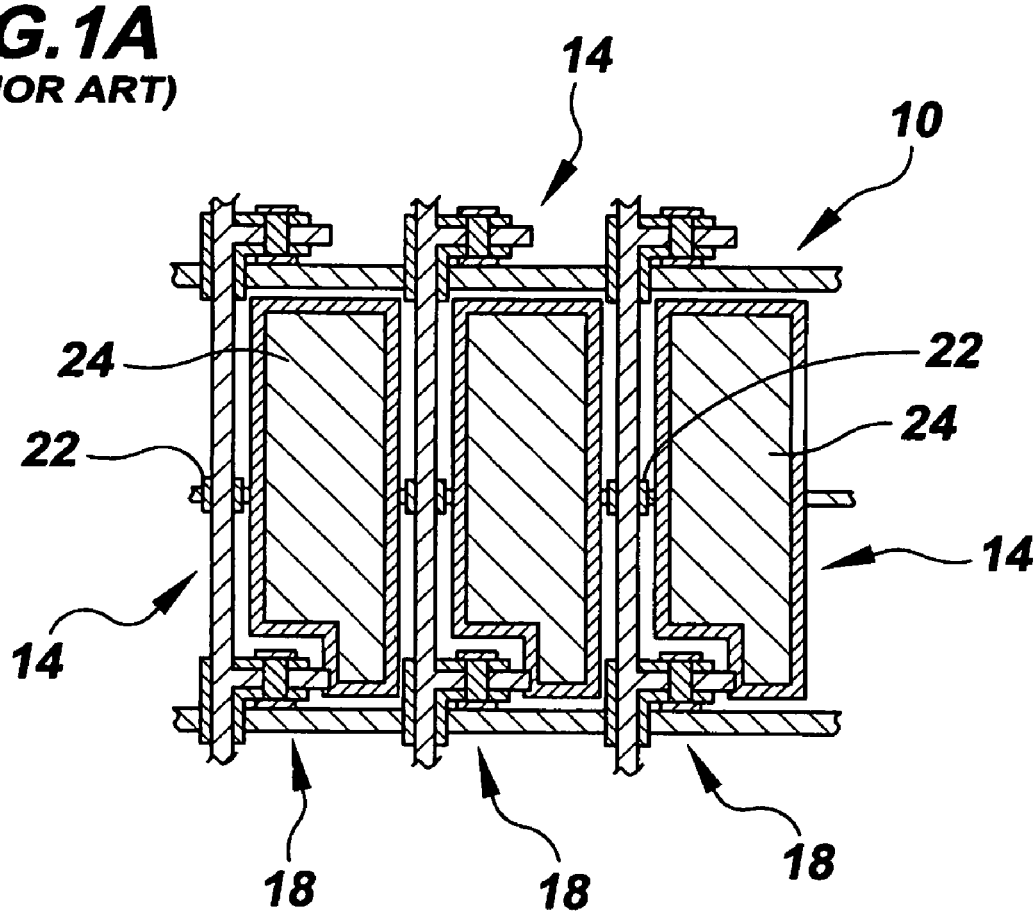
FIGS. 1A and 1B are, respectively, a plan view of a portion of a conventional active matrix backplane and an enlarged partial cross-sectional view of a pixel cell of the backplane as taken along line 1B—1B of FIG. 1A.
Figure 1B:
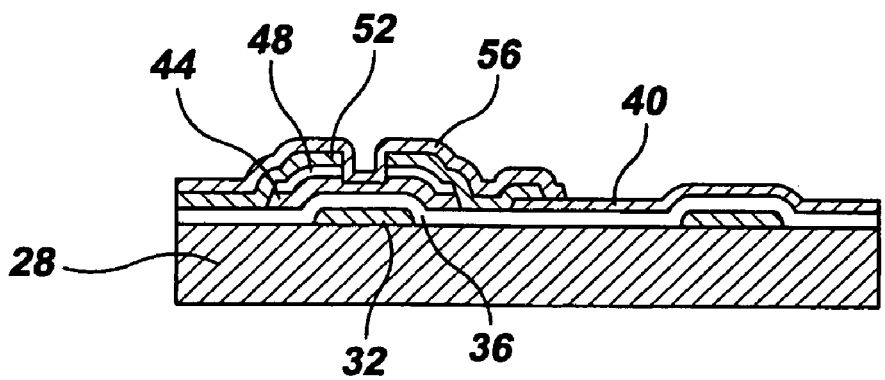
Figure 2A:
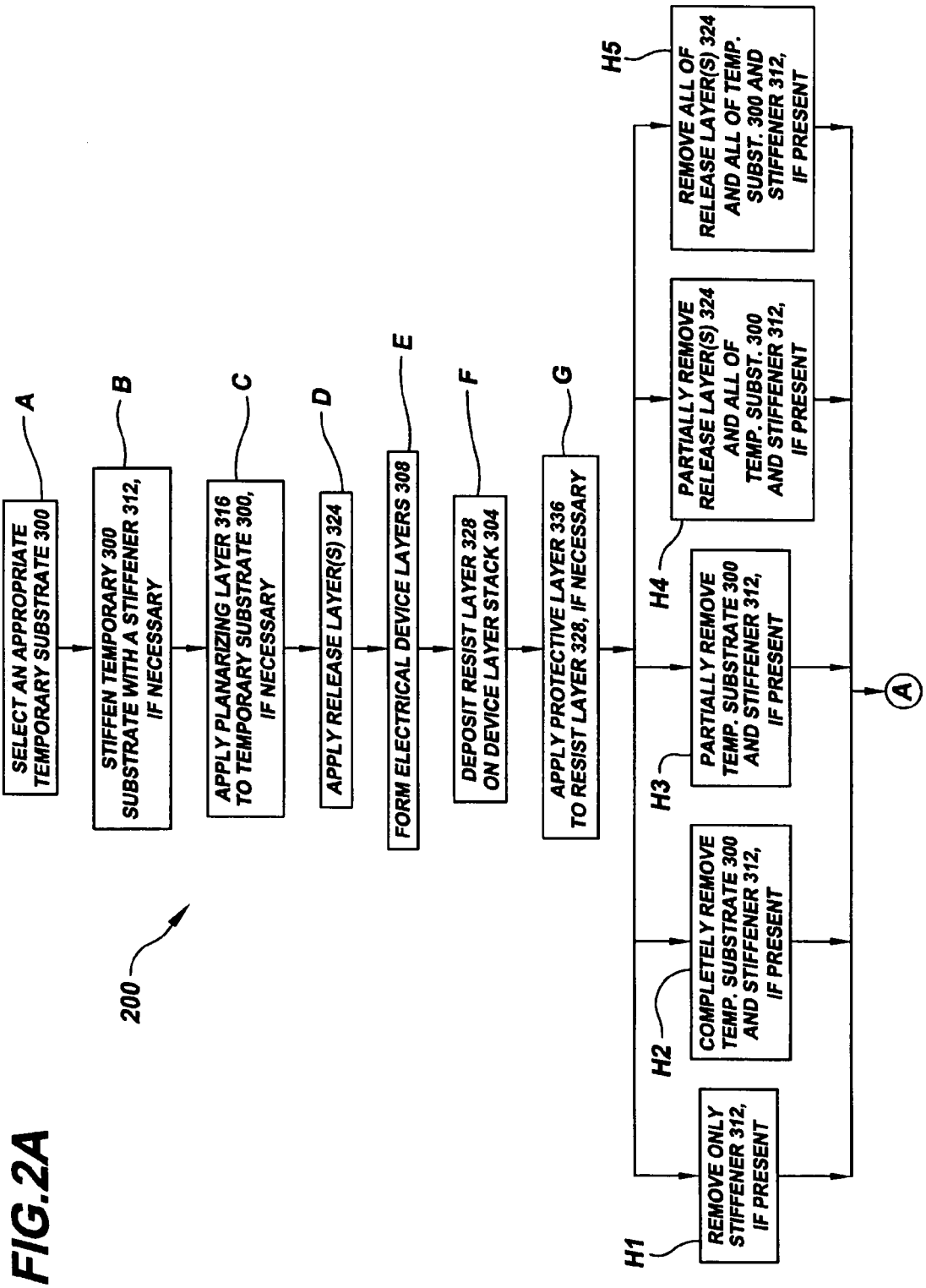
FIGS. 2A-2B is a flow diagram illustrating an electronic device manufacturing (EDM) method of the present invention.
Figure 2B:
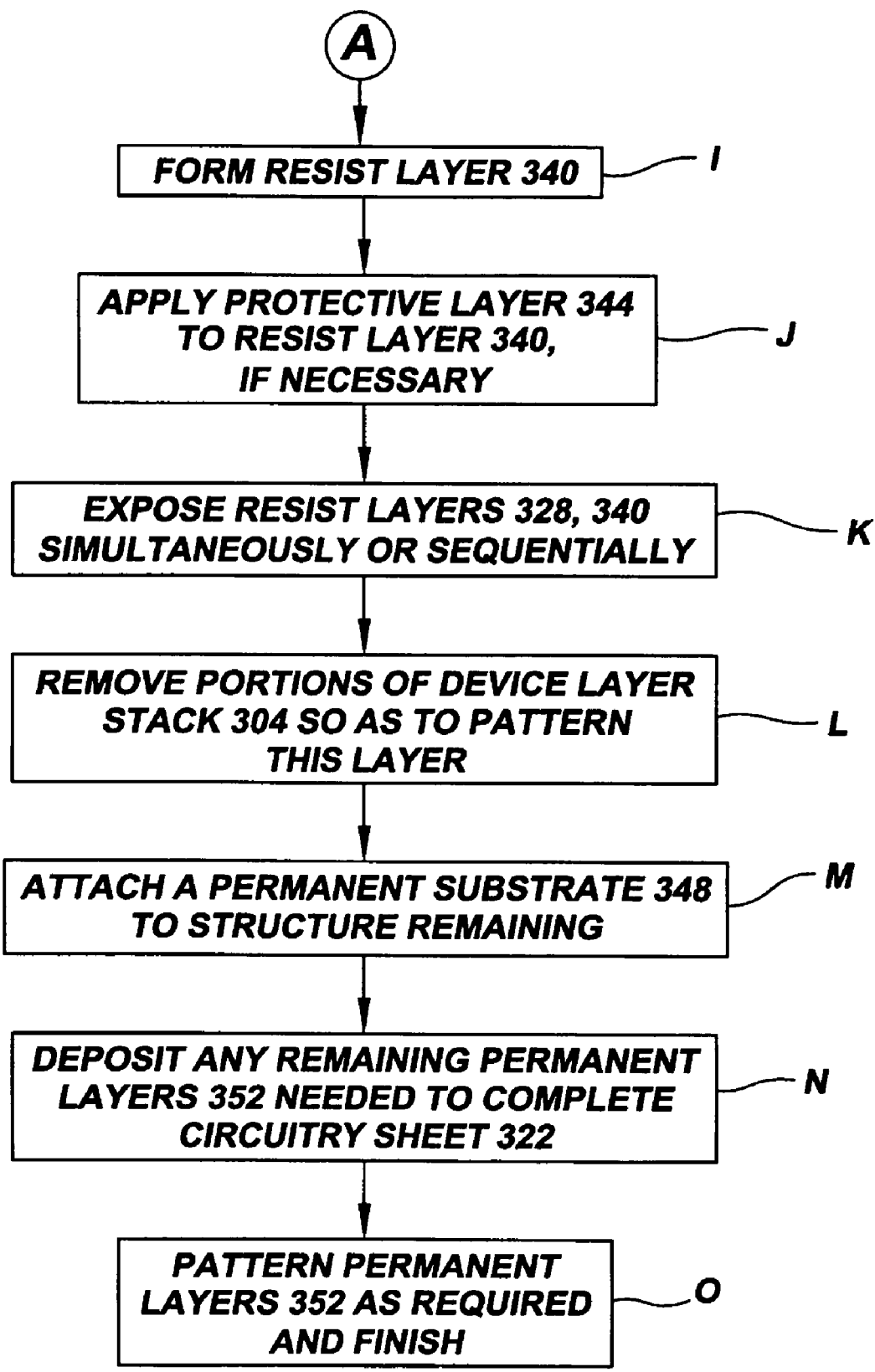

FIGS. 2A-B illustrate in accordance with the present invention an electronic/optoelectronic device manufacturing (EDM) method, which is generally indicated by the numeral 200. EDM method 200 includes a number of unique steps and series of steps for efficiently producing any of a wide variety of electronic devices and electrical interconnecting structures. Examples of electronic devices that can be made using an EDM method of the present invention, such as EDM method 200, include, among others: transistors, e.g., thin-film transistors (TFTs) and thick-film transistors; diodes, e.g., metal-insulator-metal diodes, laser diodes, ring oscillators, etc.; interconnect metallization layers; passive elements such as capacitors, resistors, and inductors; and complete sensors and transducers, among others. Regarding TFTs in particular, they may be made of any of a variety of materials, e.g., CdSe, amorphous silicon, high temperature poly silicon, low temperature poly silicon, ultra-low temperature poly silicon and polymers, among others. TFTs made in accordance with the present invention may be of either of the PMOS or NMOS types. In addition, they may have planar or staggered structures and may be of the bottom- or top-gate variety, etc. As will be apparent from reading this entire disclosure, there is virtually an infinite variety of device architectures in current use, each tailored for optimum devices performance, that can be readily translated to an EDM method of the present invention, such as EDM method 200. Examples of electrical interconnecting structures include wires, studs, electrodes and pixel conducting elements, e.g., pixel electrodes, among other. Those skilled in the art will readily appreciate that the foregoing lists of devices and electrical interconnecting structures are merely representative and by no means exhaustive.

In general, an EDM method of the present invention may be used to make an electronic and/or optoelectronic circuitry sheet, such as circuitry sheet 322 of FIG. 30, that contains, or contains precursors to, a plurality of one or more types of electronic device arranged and interconnected with one another so as to form a functional component of an electronic product. For example, a circuitry sheet of the present invention may be, or may be a precursor to, an active matrix backplane for a display device, a sensor array for a sensing device, an antenna element of a phased array antenna, radio frequency identification (RFID) circuitry for an RFID tag or a microprocessor for an electronic product containing one or more microprocessors, among many others. Those skilled in the art will readily appreciate that a circuitry sheet of the present invention is in no way limited to any particular function or set of functions. In addition, it should be appreciated that the word "sheet" as used herein and in the claims appended hereto in connection with the term "circuitry sheet" and similar terms does not imply any particular facial area or thickness or that the structure described thereby is flexible or rigid to one extent or another. Rather, the use of "sheet" in this context is used to indicate that the structure has at least one lineal facial dimension that is greater than the maximum thickness of the structure.

At a very high level, novel features of an EDM method of the present invention include, but are not limited to: (1) using a temporary substrate to deposit a stack device electronic device layers and the subsequent transfer process onto another permanent substrate; (2) dual-sided processing of a device layer stack; (3) simultaneously exposing either one or both top and bottom resist layers of the device layer stack with different patterns; (4) using resist layers each containing a plurality of imaging levels; (5) using more than one wavelength (or other resist actuation impulse/stimuli) per surface of the device layer stack to expose of the resist layer(s) at the same time; and (6) allowing for unique recipes that decouple the electronic device layers from multiple lithography alignment steps.

In addition, as will become apparent from the reading this entire disclosure, an EDM method of the present invention may be used to create a variety of devices having novel structures that result from the order in which the steps of the EDM method are performed. For example, FIG. 8V, described in detail below, illustrates a unique pixel cell made using an EDM method of the present invention. In addition, it will also become apparent from reading the entire disclosure that an EDM method of the present invention is readily, though not exclusively, suited to implementation in a roll-to-roll manufacturing system, such as roll-to-roll system 1600 illustrated in FIG. 16 and described below in more detail.

In sharp contrast to prior art, an EDM method of the present invention reveals a methodology that significantly reduces the number of manufacturing steps needed to create functioning electronic devices and circumvents a number of the shortcomings of the prior art. In addition, an EDM method of the present invention allows for adapting and adopting the best-of-breed current and evolving manufacturing techniques, technological base and capital investments, and tailors the manufacturing process parameters to suit device performance rather than substrate selection. An EDM of the present invention thus decouples the choice of final substrate from the device performance needed.

Prior to describing particular aspects, results and implementations of the present invention, attention will first be directed to presenting a high-level description of EDM method 200, which is a representative method of the present invention. Following the high-level description, various aspects of the various step EDM method 200 will be described in some detail, followed still by some examples of recipes for making pixel cells using an EDM method of the present invention and some disclosure directed to other implementations of the present invention.

EXEMPLARY METHODOLOGY OF THE PRESENT INVENTION

Figure 3A:
FIGS. 3A-3O are partial cross-sectional views of layered structures formed during various steps of the EDM method of FIGS. 2A-B.
Figure 3B:
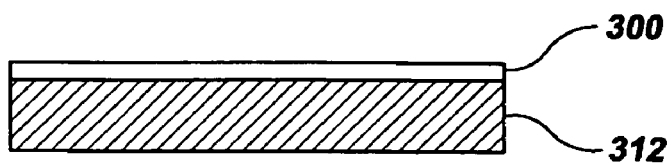
Figure 3C:
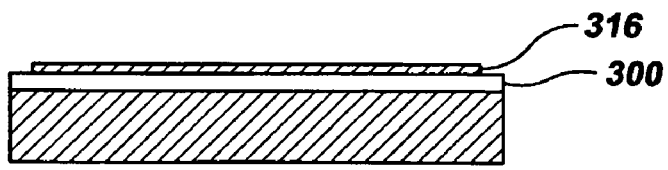
Figure 3D:
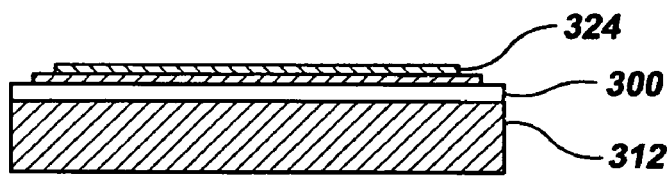
Figure 3E:
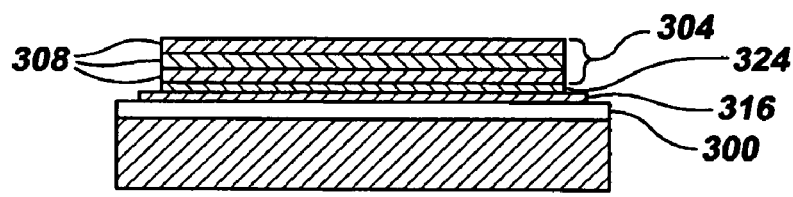
Figure 3F:
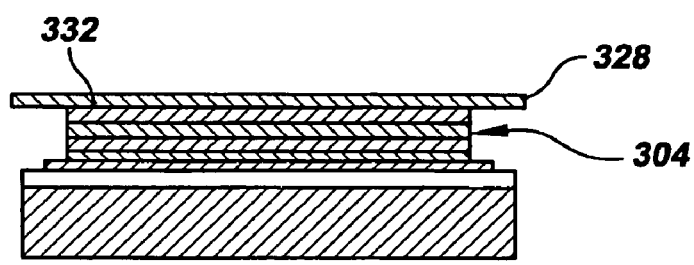
Figure 3G:
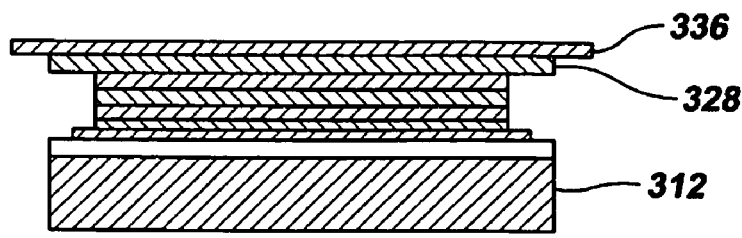
Figure 3G:
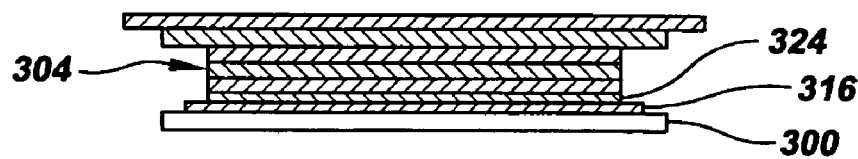
Figure 3G:
Figure 3G:
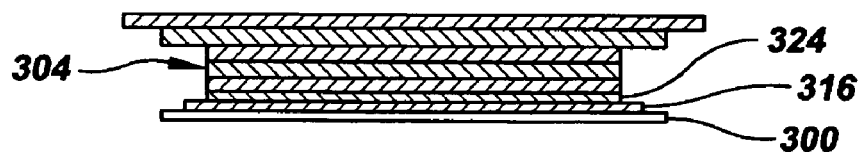
Figure 3G:
Figure 3L:
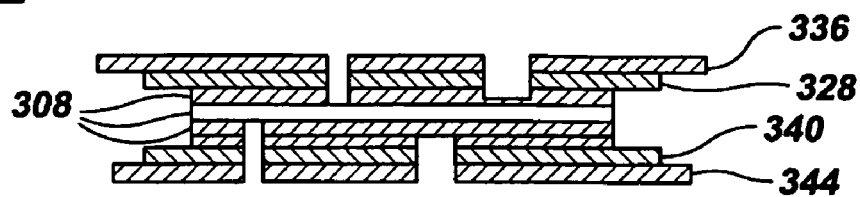
Figure 3M:
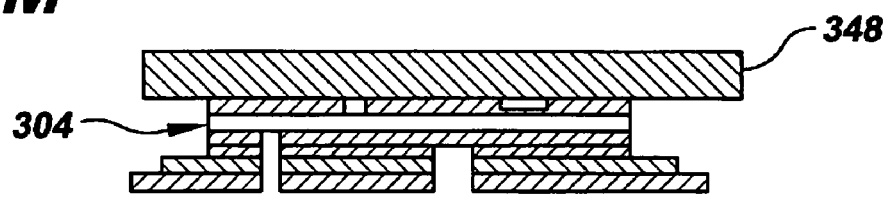
Figure 3N:
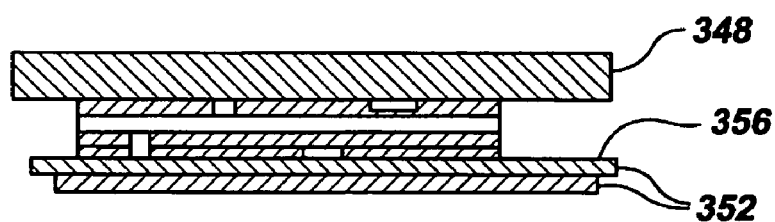
Figure 3O:
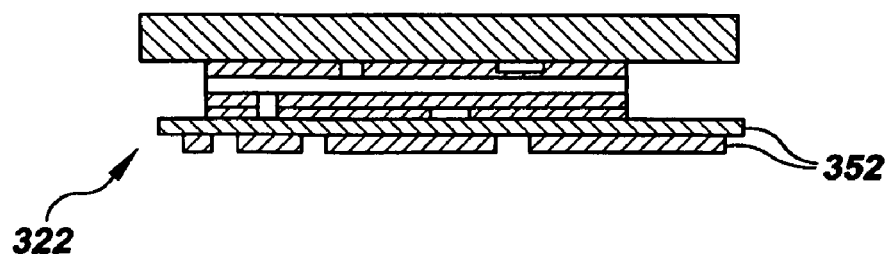

Referring again to FIGS. 2A-B, and also FIGS. 3A-3O (in this section, the alphabetic step identifier, e.g., "B" in "step B," corresponds to the relevant figure of FIGS. 3A-3O), EDM method 200 may begin at step A in which an appropriate temporary substrate 300 may be selected for a desired application. In general, temporary substrate 300 provides a platform for forming a stack 304 (FIG. 3E) of electronic device layers 308 (FIG. 3E), i.e., the layers that make up some or all of the electronic devices made using EDM method 200. Temporary substrate 200 should be selected based on the properties necessary to permit the proper formation of device layer stack 304. It is noted that temporary substrate 300 may be either rigid or flexible so as to accommodate roll-to-roll processing. A rigid embodiment of temporary substrate would still allow for sheet-to-sheet production. At a certain point within EDM method 200, temporary substrate 300 will be removed to allow certain steps to be performed. Temporary substrate is described in more detail below in the section titled "Temporary Substrate".

It is also note that the term "temporary" as used herein and in the appended claims does not necessarily mean that temporary substrate 300 will eventually be removed or will not serve a useful purpose after device layer stack 304 has been formed. On the contrary, in some applications temporary substrate 300 will indeed remain part of the finished structure and in other applications the temporary substrate will not only remain part of the finished structure, but will also serve a particular function of the finished structure. Consequently, the term "temporary" as used in this disclosure indicates that substrate 300 is used early in EDM method 200 for forming device layer stack 304, but later in the method another substrate is affixed to the device layer stack.

If temporary substrate 300 is flexible and such flexibility is not desired in at least some of the subsequent steps of EDM method 200, at a conditional step B a backing substrate, or "stiffener" 312 may be added to the temporary substrate to provide mechanical support for the substrate during some of the subsequent processing steps. Stiffener 312 is described in more detail below in the section titled "Stiffener".

Depending on the nature of temporary substrate 300 chosen in step A, a conditional step C may be necessary or desirable to apply a planarizing layer 316 to the temporary substrate. For example, if surface 320 of temporary substrate is too rough or otherwise is not of a quality needed for subsequent steps of EDM method, it may be desirable to provide planarizing layer 312. Planarizing layer is described in more detail below in the section titled "Planarizing Layer".

Since temporary substrate 300 and stiffener 312, if present, will in most cases be removed from stack 304 (FIG. 3E), at conditional step D it may be necessary or desirable to provide one or more suitable release layers 324 that will aid in detaching the temporary substrate from the stack. Various materials suitable for use in forming release layer 324 and other disclosure pertaining to the release layer are described below in the section titled "Release Layer(s)".

At step E, the various electrical device layers 308 may be deposited so as to form device layer stack 304. If planarizing layer 316 was implemented at step C, the first electrical device layer 308 may be deposited onto the planarizing layer. If one or more release layers 324 was provided at step D, the first electrical device layer may be deposited on the free surface of such layers. Otherwise, the first electrical device layer 308 will be formed on surface 320 of temporary substrate 300, unless one or more other layers, e.g., a passivation layer (not shown) had been previously deposited onto the temporary substrate. Again, as mentioned above, electrical device layers 308 are layers that make up all or part of each electronic device that is part of the finished circuitry sheet 322 (FIG. 3O). It is stressed that not all layers that make up an electronic device in a given recipe may always be deposited in step E. However, certain benefits of the present invention result from depositing as many as practicable of the electronic device layers that have the most stringent or critical deposit photolithography patterning and alignment requirement. If for a given recipe fewer than all of the ultimate device layers can be deposited as device layers 308 of device layer stack 304, the remaining layers may be deposited later in the process. It is noted that device layer stack 304 may be formed in a single coating that has been appropriately doped so as to form multiple active layers within the coating. In this case, the active layers correspond respectively to the electronic device layers 308 shown in FIG. 3E. Electronic device layers 308 are discussed in more detail below in the section titled "Device Layer Stack".

After all electronic device layers 308 have been deposited, at step F a resist layer 328 may be deposited onto the outer face 332 of as-yet-unpatterned device layer stack 304. For some applications a single resist coating that functions as a single imaging level is sufficient. However, for some applications it may be desirable to have two or more imaging levels within resist layer 328 that are distinct from each other. As described in more detail below, multiples imaging levels may be provide using a single resist coating or several resist coatings. In yet other cases, it may be desirable to provide multiple resist coatings that function so as to provide a single imaging level. Resist layer 328 and single and multiple resist coatings are addressed in more detail below in the sections titled "Resist Layers" and "Lithography Techniques".

In some cases it may be desirable to protect resist layer 328 formed in step F from damage that could occur during subsequent processing steps. If so, in conditional step G a protective layer 336 may be applied to resist layer 328. Depending upon the nature of subsequent processing steps and the robustness of resist layer 328, protective layer 336 need not be provided. The below section titled "Protective Layer" describes suitable materials for and methods of providing protective layer 336.

Following step F or G, depending on whether or not protective layer 336 is provided, at conditional steps H1-H5 some or all of temporary substrate 300, temporary stiffener 312 and/or release layer 324 may be removed from device layer stack 304 in order to process the second side of the device layer stack. In general, the layers removed and the extent of their removal will depend, obviously, on their presence and on the effect of their remaining in place during subsequent processing. In many, but not all, cases at least some material will be removed from the structure resulting after step F or G. For example, if temporary substrate 300 is thin, e.g., <1000 microns, and stiffener 312 is not used, then the temporary substrate may be left intact if it does not interfere with subsequent processing. If temporary substrate 300 is thin and stiffener 312 is present, at step H1 only the stiffener may be removed leaving the temporary substrate intact, if the temporary substrate does not interfere with subsequent processing.

However, if temporary substrate 300 must be at least partially removed to facilitate further processing, at step H2, temporary substrate 300, and stiffener 312 if it is present, may be completely removed. Alternatively, at step H3, temporary substrate 300 (and all of stiffener 312) may be partially removed. As another alternative, at step H4 all of release layer(s) 324, if present, may be removed in addition to the removal of temporary substrate 300 and/or stiffener 312. As yet another alternative, at step H5 only part of release layer(s) 324, if present, may be removed in addition to the removal of temporary substrate 300 and/or stiffener 312. The removal of release layer(s) 324, temporary substrate 300 and/or stiffener 312 is discussed in more detail below in the section titled, "Techniques For Detaching Device Layer Stack From Temporary Substrate".

Next, at step I a resist layer 340 may be formed on the surface that remains on the side opposite resist layer 328 after the performance or nonperformance of any one of steps H1-H5. Resist layers 340 may be similar to resist layer 328 discussed above.

After resist layer 340 has been formed in step I, at conditional step J a protective layer 344 may be provided to protect the resist layer if such protection is desired. If provided, protective layer 344 may be similar to protective layer 336 discussed above.

After resist layer 340 has been formed, or if protective layer 344 has been provided to resist layer 340, after protective layer 344 has been formed, at step K resist layers 328, 340 may be exposed in any appropriate manner, e.g., using electromagnetic energy (such as light 346), thermal energy or sonic energy, among others, that exposes, or activates, the intended images layers contained within the resist layers with the corresponding respective prescribed patterns (not shown). The exposure of resist layers 328, 340 may be performed simultaneously with one another or at different times. The exposures may be carried out using either conventional masking technology or maskless techniques. Techniques for exposing resist layers 328, 340 are discussed in detail below in the sections title "Exposure Mechanism For Chosen Resist Material" and "Lithography Techniques".

At step L, after resist layers 328, 340 have been exposed in step K, protective layers 336, 344, if present, and predetermined portions of ones of electronic device layer 308 may be removed, e.g., etched or ablated, as required by the particular recipe for the specific electronic device sheet being made. A variety of removal techniques suitable for use in step L are described in detail in the section titled "Etching Device Layer Stack".

After removing all of the material desired from device layer stack 304 and other layers, the remaining structure may be attached to a desired permanent substrate 348 in step M. As discussed below in the section titled "Permanent Substrate", permanent substrate 348 may be made of any material suitable for the particular application. In some applications, it may be desired that permanent substrate 348 be opaque. In other applications, it may be desired that permanent substrate 348 be transparent or translucent. EDM method 200 can accommodate any of these substrates. The below section titled "Laminating Permanent Substrate To Patterned Device Layer Stack" described techniques that may be used to attached permanent substrate 348 to the structure containing device layer stack 304.

At conditional step N, any remaining permanent layers 352 may be deposited onto the side of circuitry sheet 322 opposite permanent substrate 348 and patterned as needed, if at all. Such additional layer(s) 352 may include device layers not part of device layer stack 304, one or more passivation layers 356 and conductor layers, among others. Like other layers, permanent layer(s) may be transparent, translucent or opaque to suit a particular application. For additional information regarding various types of permanent layers 352 reference may be made to the below section titled "Electronic Device Layer Stack" relative to device layers and the below section titled "Passivation Material" relative to passivation layers.

At step O, permanent layers 352 may be patterned as necessary and the manufacturing steps may concluded. Finished circuitry sheet 322 may be inspected, further processed, incorporated into a product, package or component of a product, etc. as needed.

DETAILED DESCRIPTION OF ASPECTS OF EXEMPLARY METHODOLOGY

In order to give the reader a better sense of the broad scope of the present invention, certain steps and other aspects of the exemplary methodology of the present invention described above are discussed below in greater detail.

Temporary Substrate

As mentioned above, temporary substrate 300 serves as a platform for the formation of device layer stack. Temporary substrate 300 may, but need not, be removed in subsequent processing steps. There is a vast variety of materials of which temporary substrate 300 may be made in connection with the present invention. As also mentioned, temporary substrate 300 can be either flexible or rigid. Flexible substrates suitable for use as temporary substrate 300 include, but are not limited to, polymers, metals, paper, fabric, glass and combinations thereof. Rigid substrates for use as temporary substrate 300 include, but are not limited to, ceramics, metals, glass, semiconductors, and combinations thereof. Temporary substrate may be transparent, opaque or translucent.

Depending on the application under consideration, the material chosen for temporary substrate 300 may be a conductor, an insulator or a semiconductor and further may be inorganic or organic or a combination thereof. Suitable conductor materials may include metals such as aluminum, copper, steel, carbon steel, magnesium, stainless steel, titanium, super alloys, lead, nickel, brass, gold, silver, platinum, rhodium, incoloy, inconel, iron, molybdenum, monel, nichrome, chromium, tantalum, tin, tungsten, zinc, solder (Sb/Tn), invar, kovar, etc. Their respective alloys may also be used. Furthermore, the metals may be non-tempered or tempered. Suitable conductor materials may also include graphite sheets, and conductive carbon nanotube sheets, films and foils.

Suitable insulator materials may be natural or synthetic and may have chemical compositions containing oxides, sulphides, selenides, tellurides, fluorides, chlorides, bromides, iodides, borides, nitrides, carbides, phosphides, arsenides, silicides or any combination thereof. Suitable insulator materials may also include glass, glass with polymer sheets, ceramic mats, ceramic paper, or ceramic fibers. The insulator material may be selected from metal oxides, metal nitrides, metal carbides, metal oxynitrides, metal oxyborides, or combinations thereof. The metallic component of these materials may be selected from aluminum, titanium, indium, tin, tantalum, zirconium, niobium, hafnium, yttrium, nickel, tungsten, chromium, zinc, alloys thereof or combinations thereof. The metal oxide or sub-oxide selected may be from silicon oxide, aluminum oxide, titanium oxide, indium oxide, tin oxide, indium tin oxide, tantalum oxide, zirconium oxide, niobium oxide, hafnium oxide, yttrium oxide, nickel oxide, tungsten oxide, chromium oxide, zinc oxide, or combinations thereof. The metal nitride selected may be from aluminum nitride, silicon nitride, boron nitride, germanium nitride, chromium nitride, nickel nitride, gallium nitride, or combinations thereof. The metal carbide selected may be from boron carbide, tungsten carbide, silicon carbide, or combinations thereof. The metal oxynitride selected may be from aluminum oxynitride, silicon oxynitride, boron oxynitride, or combinations thereof. The metal oxyboride selected from zirconium oxyboride, titanium oxyboride, or combinations thereof.

Semiconductors materials may be silicon, germanium, AlGaAs, GaAs, GaP, InP, ZnO, ZnS, ZnSe, GaN, etc. Suitable opaque cermets may be selected from zirconium nitride, titanium nitride, hafnium nitride, tantalum nitride, niobium nitride, tungsten disilicide, titanium diboride, zirconium diboride, or combinations thereof.

Organic materials may include organic polymers, inorganic polymers, organometallic polymers, hybrid organic/inorganic polymer systems. The organic polymer may be selected from urethanes, polyamides, polyimides, polybutylenes, isobutylene isoprene, polyolefins, epoxies, parylene, benzocyclobutadiene, polynorbornenes, polyarylethers, polycarbonate, alkyds, polyaniline, ethylene vinyl acetate, and ethylene acrylic acid, (meth)acrylates, etc. Examples of organic polymers, include, for example, polyethlyene terephthalate (PET), polyethylene naphthalate (PEN), or high temperature polymers such as polyether sulfone (PES), polyimides, or Transphan™ polymer (a high Tg cyclic olefin polymer available from Lofo High Tech Film, GMBH of Weil am Rhein, Germany). Other examples include E-CTFE, E-TFE, PTFE, FEP, and HDPE, and polyimides such as KAPTON®, KAPTON® HN, KAPTON® FN, KAPTON® VN, KAPTON® CR, KAPTON® CB, KAPTON® E polyimides (KAPTON is a registered trademark of E.I. DuPont de Nemours and Company, Wilmington, Del.), APICAL® polyimide (APICAL is a registered trademark of Kanegafuchi Kagaku Kogyo Kabushiki Kaisha Corp., Osaka, Japan), and UPILEX® polyimide (UPILEX is a registered trademark of Ube Industries, Ltd., Yamagichiken, Japan).

Suitable synthetic organic resins include both thermoplastic resins and thermosetting resins, such as polyolefins, e.g. polyethylene, polypropylene, ethylene-propylene copolymers, and ethylene-vinyl acetate copolymers (EVAs); cyclic polyolefins; modified polyolefins; polyvinyl chloride; polyvinylidene chloride; polystyrene; polyamides; polyamideimides; polycarbonates; poly-(4-methylpentene-1); ionomers; acrylic resins; polymethyl methacrylate (PMMA); acrylonitrile-butadiene-styrene copolymers (ABS resins); acrylonitrile-styrene copolymers (AS resins); butadiene-styrene copolymers; polyoxymethylene; polyvinyl alcohol (PVA); ethylene-vinyl alcohol copolymers (EVOHs); polyesters, e.g. polyethylene terephthalate (PET), polybutylene terephthalate (PBT), and polycyclohexane terephthalate (PCT); polyethers; polyether-ketones (PEKs); polyetherether-ketone (PEEKs); polyether-imides; polyacetals (POMs); polyphenylene oxides; modified polyphenylene oxides; polysulfones; polyphenylene sulfide (PPS); polyether sulfones (PESs); polyarylates; aromatic polyesters (liquid crystal polymers); polytetrafluoroethylene; polyvinylidene fluoride; other fluorine resins; thermoplastic elastomers, e.g. styrene-, polyolefin-, polyvinyl chloride-, polyurethane-, polyester-, polyamide-, polybutadiene-, trans-polyisoprene-, fluorine rubber-, and chlorinated polyethylene-type; epoxy resins; phenol resins; urea resins; melamine resins; unsaturated polyesters; silicone resins; and polyurethanes; and copolymers, blends, and polymer alloys essentially consisting of these synthetic resins. One or more of these synthetic resins may be used, for example, as a composite consisting of at least two layers.

The inorganic polymer may be selected from silicones, polyphosphazenes, polysilazane, polycarbosilane, polycarborane, carborane siloxanes, polysilanes, phosphonitirles, sulfur nitride polymers and siloxanes. The organometallic polymer may be selected from organometallic polymers of main group metals, transition metals, and lanthanide/actinide metals, e.g., polymetallocenylenes such as polyferrocene and polyruthenocene. Hybrid organic/inorganic polymer system may be selected from organically modified silicates, preceramic polymers, polyimide-silica hybrids, (meth)acrylate-silica hybrids, polydimethylsiloxane-silica hybrids and ceramers.

New and emerging organic technologies allows for self assembled crystalline organic layers. These may also be used as a temporary substrate platform.

It may be advantageous, though not necessary, to have the thinnest temporary substrate 300 for a given material choice. The thickness of temporary substrate 300 may range from a few microns to several hundred microns depending on the choice of material and flexibility desired during manufacturing. In some cases, like ceramic mats and foils, the thickness could extend into millimeters. There are fundamentally no limits on thickness. While certain representative embodiments have been shown for purposes of illustrating the wide variety of materials suitable for temporary substrate 300, it will be apparent to those skilled in the art that materials not disclosed herein may be incorporated without departing from the scope of the invention.

Stiffener

As mentioned above, stiffener 312 might be used, if desired, for additional mechanical support of temporary substrate 300. Stiffener 312 may be made of any of the materials outlined above for temporary substrates 300 and may be made of a material different from or identical to the material of the temporary substrate. As will be apparent to those skilled in the art, there are many ways to attached stiffener 312 to temporary substrate 300 using conventional substrate-to-substrate attaching techniques. Such techniques include chemical bonding using epoxies, adhesive, room-temperature vulcanization, silicones, urethanes, and ceramics, among others. The bonding agent may be cured/activated using, e.g., plasma, visible light, ultraviolet light, temperature, pressure, anaerobic environment, etc. Bonding may also be initiated by surface treatments using chemicals, activated plasma treatments, vacuum processes, etc. Bonding processes may also include microwave bonding, anodic bonding, fusion bonding, adhesive, eutectic, resist, solder, thermo-compression and/or low temperature glasses. Attaching may also be done using rivets, welds, studs, sprokets, clips, etc.

While certain representative embodiments have been shown and described for purposes of illustrating a point, it will be apparent to those skilled in the art that bonding methods not disclosed herein may be used without departing from the scope of the invention.

Planarizing Layer

As discussed above, temporary substrate 300 chosen for a particular application might or might not have satisfactory surface quality. If the surface quality is unsatisfactory, planarizing layer 316 may be deposited onto the surface of such a substrate to smooth over (or planarize) any unevenness due to surface roughness. Additionally, planarizing layer may also serve, among other things, as a thermal barrier, chemical barrier, stress relief layer and/or passivation layer and may possibly be also used enhance bond strength of subsequent layers to temporary substrate 300.

Planarizing layer 316 may be made of any suitable material, such as spin on glass (SOG), reflow glass compositions such as low temperature oxide (LTO), phosphosilicate glass (PSG), boronphosphosilicate glass (BPSG), polyimides, Quasi-inorganic SOGs Siloxanes (methyl-, ethyl-, phenyl-, butyl-, doped, undoped), purely-inorganic SOGs, silicates (doped or undoped), and dopant-organic compounds, acrylics, epoxies, vinyl-based chemistries, silicon or metal containing organometallics, butylcyclobuten, various polyimides, radiation-cured monomers and polymers, UV cured polymers and UV cured monomers, among others.

It is also noted that low-temperature fluxes, solders, eutectic compositions, metals, metal alloys may be induced to flow under the influence of heat or pressure, or both, and therefore be suitable in some applications for planarizing layer 316. For example, in a technique called "contact planarization," in a first step a malleable coating would be applied onto "temporary substrate." In a second step, the coated substrate would be pressed against an optically flat surface or, alternatively, rolled under very high precision polished rollers in order to planarize the coating layer into planarizing layer 316. Planarizing layer 316 may then simultaneously (or posthumously) be cured by heat, pressure, time, UV or visible radiation among other things.

Planarizing layer 316 may be deposited by evaporation techniques such as physical vapor deposition (PVD), chemical vapor deposition (CVD), atmospheric-pressure CVD (APCVD), PECVD, sputtering, low-pressure CVD (LPCVD), ion plating, flame hydrolysis, etc. Alternatively, planarizing layer 316 may be applied by other methods such as spin coating; spraying; rolling; plating, such as electro-plating, dip-plating, and electroless-plating; coating, such as a Langmuir-Blodgett process; printing, such as ink jet or powder jet; screening; gravure; blade spreading, etc.

It is noted that there are fundamentally no limits on thickness of planarizing layer. It may be as thin as a few nanometers to several tens of microns thick. Alternatively, it is noted that more traditional techniques for reducing surface roughness of substrates may be used to planarize temporary substrate 300. These techniques include, but are not limited to, electro-polishing, electroless polishing, chemical-mechanical polishing, mechanical grinding and polishing, ion etching and ion polishing, among others.

While certain representative embodiments have been shown for purposes of illustrating the wide variety of materials that can be used, it will be apparent to those skilled in the art that materials not disclosed herein may be used without departing from the scope of the invention.

Release Layer

As discussed above, in some applications it might be desirable to provide sacrificial release layer 324 formed on planarizing layer 316 (or planarized surface 320 of temporary substrate 300) prior to depositing device layer stack 304. Release layer 324 could then serve as a releasing, or exfoliating, layer for separating temporary substrate 300 from device layer stack 304 during subsequent processing. Depending on the particular application, release layer 324 can serve any one or more of a number of functions. For example, if temporary substrate 300 selected were expensive, it may be desirable to reutilize it many times. In this case, release layer 324 would allow this functionality, which could provide significant cost savings. Without release layer 324, the only choice for detaching temporary substrate 300 might be physically or chemically removing it, respectively, by grinding or etching.

In addition, it is widely known that photolithographic resolution is dependent on depth of focus. If temporary substrate 300 were very thick (e.g., because it cannot be made any thinner, for handling issues, or other reason) then high-resolution lithography might not be possible. However, providing release layer 324 would alleviate this issue. Once device layer stack 304 is released from temporary substrate 300, a thin layer photoresist and high resolution photolithography can be utilized.

Examples of materials suitable for release layer 324 include, but are not limited to, solvent etched metals such as inconel, gold, copper, NiFe, nickel, platinum, chrome, silver, etc., and their alloys; hygroscopic inorganic salts such as sodium chloride, barium fluoride, calcium oxide, magnesium fluoride, copper sulphate, sodium carbonate, zinc sulphide, lanthanum bromide, etc.; other inorganics like silicon, polysilicon, amorphous silicon layer with entrapped hydrogen gas, nano structured films, nano colloids, nanofilaments, nanowires, nanoclusters, channel-like voids which are micro-scale voids, nano-scale voids, high surface to volume column-void network and films, etc.; organics like photoresist, polyimide, CVD plastic materials, self assembled monolayers (SAM), etc.

Release layer 324 may be formed using a number of different methods, including evaporation techniques such as PVD, CVD, APCVD, PECVD, sputter, LPCVD, ion plating, flame hydrolysis, etc.; spin coating; spraying; rolling; plating, such as electro-plating, dip-plating, and electroless-plating; coating, such as a Langmuir-Blodgett process; printing, such as ink jet or powder jet; screening; gravure; blade spreading, etc. It is noted that release layer 324 may consist of one or more release coatings.

There are fundamentally no limits on the thickness of release layer 324. For example, each may be as thin as a few nanometers to several tens of microns thick.

While certain representative embodiments have been shown for purposes of illustrating the wide variety of materials that can be used, it will be apparent to those skilled in the art that materials not disclosed herein may be used without departing from the scope of the invention.

Electronic Device Layer Stack

A typical microelectronic device comprises a number of layers of coatings composed of metals, dielectrics and/or semiconductor materials. Some or all of these coating layers may be contained in electronic device layer stack 304 as electronic device layers 308. Depending on the nature of the electronic devices formed using an EDM method of the present invention, such as EDM method of FIG. 2, device layers 308 may be organic or inorganic in composition.

If a particular device layer 308 is a metal layer, the coating used to form that layer may be a metallic substance such as, but not limited to, Al, Cu, Mo, Cr, Ta, W, Ni, Ti, Si, Ti—Si, Al—Si, Al—Cu, Ti—Al, and suicides, among others. Additionally, alloys of metals may also be used. If another device layer 308 is a dielectric layer, the coating for this layer may include dielectric materials from a group comprising oxides, nitrides, carbides, and organics, but not limited to the following. For example, the material may be selected from metal oxides, metal nitrides, metal carbides, metal oxynitrides, metal oxyborides, or combinations thereof. The metallic component of these materials may be selected from aluminum, titanium, tantalum, zirconium, niobium, silicon, hafnium, yttrium, nickel, tungsten, alloys thereof, or combinations thereof.

If a metal oxide or sub-oxide is selected, it may be selected from among a group comprising silicon oxide, silicon dioxide, aluminum oxide, titanium dioxide, tantalum pentoxide, zirconium oxide, niobium oxide, hafnium oxide, yttrium oxide, nickel oxide, tungsten oxide or combinations thereof, among others. If a metal nitride is selected, it may be selected from among a group comprising aluminum nitride, silicon nitride, boron nitride, germanium nitride, chromium nitride, nickel nitride, gallium nitride, or combinations thereof, among others. If a metal carbide is selected, it may be selected from among a group comprising boron carbide, tungsten carbide, silicon carbide, or combinations thereof, among others. A metal oxynitride may be selected from among a group comprising aluminum oxynitride, silicon oxynitride, boron oxynitride, or combinations thereof, among others. A metal oxyboride may be selected from among a group comprising zirconium oxyboride, titanium oxyboride, or combinations thereof, among others. In addition, low K dielectrics, and organic dielectric materials, polyimides may be substituted as needed for a particular device layer 308. The dielectric material may also have other functions such as passivation, providing a field oxide, stress relieving, providing a thermal barrier, providing a chemical barrier and/or enhancing bond strength to a polymer substrate, among others.

If a particular device layer 308 is a semiconductor layer, the coatings may use semiconductor materials from the group consisting of the following, but not limited to: silicon, Ge, SiGe, GaAs, InGaAs, InP, AlGaAs, GaP, InGaP, CdSe, CdS, CdTe, ZnS, ZnSe, ZnO, amorphous silicon, hydrogenated amorphous silicon, polycrystalline silicon, microcrystalline silicon, nano crystalline silicon, silicon nanowires, monocrystalline silicon, quantum dots, nanodots, SWNT (carbon nanotubes), nanoshells, nanocrystals, quantum islands and quantum wires, among others. Since a method of the present invention has wide application, the semiconductor materials may also be organic in nature. In addition, the semiconductor materials may be doped or undoped. Typical dopant gases such as $PF_5$, $BF_3$, $B_2H_6$, and $AsF_5$, among others, may be utilized.

Furthermore, if the as-deposited semiconductor layer is amorphous or small grained, it may be further re-crystallized to yield higher carrier mobility and associated performance benefits using known and emerging re-crystallization processes such as: rapid thermal annealing (RTA), rapid thermal processing (RTP), furnace annealing, lamp annealing, argon ion laser annealing, excimer laser annealing (ELA), phase modulated ELA, sequential lateral solidification (SLS), and single area-excimer laser crystallization (SA-ELC), metal induced crystallization (MIC), metal induced lateral crystallization (MILC), and zone melt recrystallization (ZMR), among others.

Each device layer 308 may be deposited by any known conventional deposition means suitable for the material at issue, such as: PVD; filament evaporation; RF heating; electron beam; ion assisted electron beam; sputtering; diode sputtering; magnetron sputtering; DC sputtering; bias sputtering; RF sputtering; CVD; thermal CVD; LPCVD; PECVD; APCVD; high-density plasma CVD (HDPCVD); electron cyclotron resonance PECVD (ECR-PECVD); low temperature PECVD (LTPECVD); metalorganic CVD (MOCVD); PVD; hot-wire CVD; sol gel; evaporation; molecular beam (MB) evaporation; ion-plating; electroplating; dip-plating (dipping); and electroless-plating; other coating processes, such as a Langmuir-Blodgett process, spin-coating, spray-coating, and roll-on coating; printing; transfer; ink-jetting; and powder-jetting, among others.

There are fundamentally no limits on the thickness of these device coating layers. For example, each may be as thin as a few angstroms to several tens of microns thick.

While certain representative embodiments have been shown for purposes of illustrating the wide variety of coating materials that may be used, it will be apparent to those skilled in the art that other coating materials not disclosed herein may be used without departing from the scope of the invention.

Resist Layer

The material selected for each resist layer 328, 340 utilized in an EDM method of the present invention may be chosen from a wide variety of perturbation activated compounds whose general properties can be tailored or influenced under suitable stimuli. In general, any compound or system, be it organic or inorganic, can be designed such that its energy barrier can be reduced by application of radiation, microwave, light, heat, electric field, magnetic field, chemical catalyst, stress-tension-pressure, etc. Furthermore, this reduction in energy barrier on exposure to an appropriate stimuli may produce a change in: resistance, conductance, capacitance, dielectric constant, charge retention, refractive index, n surface reflection, light absorption, transmission and scattering, differential wetting and sorption, magnetic susceptibility, chemical solubility, polymerization, photo cross linking, photobleaching, photostratification, amount of corrosion, crystallization and height, among others. Systems and chemical compounds that utilize these characteristics can therefore be used as a means to create patterned surfaces and relief structures.

Such systems and compounds include, but not limited too, the following: light- or radiation-based resist compositions and systems such as: photoresist, both positive and negative, wet film and dry film, chemically amplified resist, positive and/or negative electrodepositable photoresist, electrophoretic photoresist, crystallization photoresist (PR), spin-coated liquid photoresist (LPR), acrylate monomers, isobornylmethacrylate, stilbenedimethacrylate, holographic photopolymers, single and multicolor photopolymers compositions, color films, photosensitive emulsions, halide emulsions, silver halides, photoetchable glass, germanosilicate glass, $TiO_2$ (photocatalysis in titanium oxides and sub oxides), photoactivation in polymethylsilane (PPMS), organotellurium, and selenium, among others; single or multi-player polymeric layer systems that undergo 2-level 3 dimensional crosslinking process, with oleophilic polymers and a photothermal converter which converts radiation to heat and crosslinked hydrophilic polymers; chacogenide glasses and compositions that exhibit phase change and photorefractive effects, such as, amorphous As—S, As—Se and As—S—Se films, GexSbyTez, GeSbTe or InAgSbTe; thermalinorganic resist compositions and systems, such as, heat and humidity induced corrosion in iron, calcium and aluminum films, among others; selective oxidation of amorphous hydrogenated silicon surface by removal of hydrogen passivation under heat or light; structuring of aluminum films by laser-induced corrosion in water; fractional change in aluminum oxide, iron oxide, or silver composition upon selective heating of the respective material on a thick amorphous carbon film; bismuth/indium and other bi- and tri-metallic alloying thermal resist; and in-situ oxidation of nanometer sized transition metal clusters or colloids of metals of groups 4, 5, 6, 7 8, 9, 10, 11, or 12 of the periodic table, their metal oxides or metal sulfide analogues, among others.

The chosen resist type, be it photoresist, thermal resist or photoactivable compound, may be deposited using any of the conventional processes typically used in the semiconductor and printed circuit board microelectronics industries. Such processes include: spin coating, spray coating, meniscus coating, roller, curtain or extrusion coating, plasma deposition, flash evaporation of monomers or polymers, electro-deposition or electrophoretic deposition, ink jet printing, screen printing, dispensing and blading, gravure, flexo-printing, and drop-on-demand ink jet printing, among others. Inorganic resist systems may be deposited using techniques such as: PVD; filament evaporation; RF heating; electron beam; ion assisted electron beam; sputtering; diode sputtering; magnetron sputtering; DC sputtering; bias sputtering; RF sputtering; CVD; thermal CVD; LPCVD; PECVD; APCVD; HDPCVD; ECR-PECVD; LTPECVD; MOCVD; PVD; hot-wire CVD; sol gel; evaporation; molecular beam (MB) evaporation; ion-plating; electroplating; dip-plating (dipping); and electroless-plating; other coating processes, such as a Langmuir-Blodgett process, spin-coating, spray-coating, and roll-on coating; printing; transfer; ink-jetting; and powder-jetting, among others.

In lieu of a single resist layer coating, two or more resist layer coatings may be deposited on top of each other to form a stacked resist layer. As mentioned above, each coating of a stacked resist may provide an imaging level, i.e., a planar level within the resist layer that is parallel with the surface of the resist layer and that contains or will contain a image that is independent and distinct from each other image within the resist layer. The multiple resist layer coatings within a resist layer may be, e.g., similar or different in composition, or in the manner in which they are activated, or the wavelengths at which they are activated. Alternatively, as discussed below in more detail in the section titled "Lithography Techniques", a single resist coating may contain two or more imaging levels when special lithography techniques are utilized.

There are fundamentally no limits on the thickness of each resist layer 328, 340. For example, each may be as thin as a few angstroms to several tens of microns thick depending on choice and composition of the resist, resolution desired and activation schemes.

While certain representative embodiments have been shown for purposes of illustrating the wide variety of resist materials and systems that may be used, it will be apparent to those skilled in the art that other resist materials not disclosed herein may be used without departing from the scope of the invention.

Protective Layers

As mentioned above, protective layers 336, 344 might be used, if desired, to protect the outer surfaces of corresponding respective resist layers 328, 340 during subsequent processing, as well as to serve as a second (temporary) substrate during such processing. Each protective layer 336, 344 may be made up on any of the materials outlined above for temporary substrate 300, but, of course, may be different or identical in composition to the composition of the temporary substrate chosen.

Bonding of Protective Substrate to Resist Layer

If one or both of protective layers 336, 344 are used, each may be attached to the corresponding respective resist layer 328, 340 in any suitable one of a variety of ways including, but not limited to: chemical bonding using epoxies, adhesive, RTV, silicones, urethanes, etc. These materials may be water- or solvent-soluble epoxies, adhesive, etc., and may be cured/activated using plasma, light, UV, temperature, pressure, or anaerobic environment, among other things. Bonding may also be initiated by surface treatments using chemicals, activated plasma treatments and vacuum processes, among others. Bonding processes may also be of a variety of types include, but not limited to microwave, anodic, fusion, adhesive, eutectic, resist, solder, thermo-compression and/or low temperature glass, among others.

While certain representative embodiments have been shown for purposes of illustrating a point, it will be apparent to those skilled in the art that bonding methods not disclosed herein may be used without departing from the scope of the invention.

Techniques for Detaching Electronic Device Layer Stack from Temporary Substrate

As discussed above, at a certain point in EDM method 200 (FIGS. 2A-B) it may becomes desirable or necessary to remove temporary substrate 300 from electronic device layer stack 304. If so, removal of temporary substrate 300 may be performed in any one of a number of ways, e.g., providing a suitable impulse or number of impulses so as to initiate and maintain a detaching front using one or more appropriate energy sources. Examples of such energy sources include, but are not limited to, a mechanical source, a chemical source, a radiation source, an electrical source and a thermal sink or source, among others. In addition, temporary substrate 300 may be subjected to stress, strain, shear, tension and/or other forms of mechanical, chemical, electrical, radiation treatments during or prior to initiating detaching of the substrate from device layer stack 304 to help facilitate/expedite the separation action. This form of "treatment" also helps in isolating and demarking the selected separation plane. These separating impulses may be imparted in a flood, time-varying, spatially varying or continuous manner.

Generally, a mechanical source for initiating and continuing separation of temporary substrate 300 from device layer stack 304 may utilize rotational, translational, compressional, expansional, and/or ultrasonic energy, to impart mechanical separating action. Examples of suitable mechanical separating actions include, but are not limited to, grinding, tearing, scouring, abrading, and slicing, that may be imparted using mechanical knives, saws, wire and muck saws, pressurized liquids and gases that act as directional chisels, hammers, among other things. The mechanical action can be introduced in a flood, time-varying, spatially varying or continuous manner.

In a more particular example, a pressurized fluid jet, which acts with compressional energy, can be used to perform the detaching process. The fluid jet (or liquid jet or gas jet) impinges on a selected interface region of temporary substrate 300/release layer 324 and device layer stack 304 so as to initiate the separation process and to separate the two into two distinct entities using a force, e.g., mechanical, chemical and/or thermal force. One entity is temporary substrate 300, which is essentially unaffected by the removal and can be reused, and the other entity is device layer stack 304 along with resist layer 328. Depending on the application, the fluid jet can be adjusted in direction, location and magnitude so as to achieve the desired separation effect. The fluid jet can be a liquid jet or a gas jet or a combination of liquid and gas.

A chemical source for initiating and continuing separation of temporary substrate 300 from device layer stack 304 can be selected from particles, fluids, gases, or liquids. These sources have chemistries that increase stress in the interface region. Examples of processes the utilize chemical action include, but are not limited to: wet chemical etching; dry etching processes such as reactive ion etching (RIE); plasma/planar etching; plasma-enhanced (PE) etching; inductively coupled plasma (ICP) etching; deep reactive ion etching (DRIE); sputtering; ion enhanced etching; ion beam milling; chemically assisted ion beam milling; electron cyclotron resonance (ECR) plasma etching; high-density plasma (HDP) etching; microwave and RF plasma assisted etching; and laser induced/assisted chemical etching, among others. The chemical source may be introduced in a flood, time-varying, spatially varying or continuous manner.

An electrical source for initiating and continuing separation of temporary substrate 300 from device layer stack 304 can be selected from an applied voltage or an applied electromagnetic field, each of which may be introduced in a flood, time-varying, spatially varying, or continuous manner. An example of implementing an electrical source is electro-etching.

A thermal source or sink for initiating and continuing separation of temporary substrate 300 from device layer stack 304 may operate using radiation, convection or conduction. The thermal source may be selected from a group comprising, among other things, a photon beam, microwave radiation, a fluid jet, a liquid jet, a gas jet, an electro/magnetic field, an electron beam, a thermoelectric heating and a furnace. The thermal sink may be selected from a group comprising, among other things, a fluid jet, a liquid jet, a gas jet, a cryogenic fluid, a super-cooled liquid, a thermo-electric cooling means and an electro/magnetic field. This thermal source can be applied in a flood, time-varying, spatially varying or continuous manner. Examples of thermal source based separating processes include laser slicing based on melting of material, microwave melting and slicing of material, gasifying, sublimating and decomposing the sacrificial layer, among others.

Still further, any of the above embodiments can be combined or even separated, depending on the application. As will be appreciated by those having ordinary skill in the art, the type(s) of source(s) used will also depend upon the application. In addition, it is noted that the selected impulse energy may be placed near or at an edge or corner region of the selected depth of the separation interface or release layer 324 or, alternatively, it may be placed at the center or any other location along the selected depth of the interface.

It is noted that in some applications it may be desirable to leave temporary substrate 300 "as is," i.e., not separated from device layer stack 304. For example, if temporary substrate 300 is a metal or metal alloy, it could serve as an electrode, antenna, barrier coating for protection against humidity or add to the mechanical strength of the layered structure. If temporary substrate 300 is reasonably thin (say, <1 mm in thickness) it could be etched through during subsequent processing when the circuitry is defined. Alternatively, in some applications it may be desirable to etch temporary substrate 300 completely off, e.g., if its composition allows or if very high resolution lithography is required. Alternatively, in some applications it may be desirable to etch temporary substrate 300 only partially so as to utilize the temporary substrate properties as above, but also include the option of high resolution lithography. Similarly, release layer 324 may be etched off completely or only partially, depending on application and whether they can add any additional functionality to the finished device.

While certain representative embodiments and details have been shown for purposes of illustrating the invention, it will be apparent to those skilled in the art that various other separation methods exists and may be used without departing from the scope of the invention, which is defined in the appended claims.

Exposure Mechanism for Chosen Resist Material

As discussed above relative to resist layers 328, 340, the chosen resist system may be designed to have its energy barrier varied by the application of radiation, microwave, light, heat, electric field, magnetic field, chemical catalyst, stress-tension-pressure, etc. If a light source (i.e., radiation source) is chosen as the activation means for this reduction of energy barrier, the source may be a coherent source (e.g., lasers) or an incoherent (e.g., lamps). Laser-based systems may use lasers that are continuous, pulsed, modulated, switched or ultra-fast with micro-nano-femto second pulses. The laser/resist combination might also be operated under 2-photon, 3-photon and other non-linear regimes. In addition, the selected laser may be single line or multi-line and may be a solid state, diode pumped solid state, gas, excimer, ion, or semiconductor laser, among others. The output of such laser may, e.g., be in the ultraviolet (UV), visible (VIS), near infrared (NIR), infrared (IR) or far infrared (FIR) part of the spectrum. Examples of incoherent light sources include UV, halogen, xenon and mercury arc lamps, among other broadband radiation sources that may also be utilized. Note that lasers can also be sources of incoherent radiation and are meant to be included as suitable incoherent sources.

It is noted that a multilayer resist technique, such as thin layer imaging (TLI), may be used as an alternative to single-layer resist technology. In TLI the uppermost layer of the resist is imaged, and this image is used to create an etch mask. The image is then developed using an anisotropic RIE process. Alternatively, laser direct patterning (photo ablation) or laser micromachining techniques may be used to expose and ablate each resist layer 328, 340, or perhaps even to pattern device layer stack 304, if desired.

If a thermal source (physical heat source) is chosen as the activation means for this reduction of energy barrier, it may be take the form of heated rollers, thermal pads, etc.

Resist layers 328, 340 may be exposed simultaneously or non-simultaneously with the prescribed patterns needed for the type(s) of electronic devices to be made. The exposure may utilize either conventional masking technology or maskless techniques. Non-simultaneous exposures may be carried out sequentially at time T=1 on one surface, and time T=2 on the other surface, without moving the substrate or mask in relation to each other during this time T1 and T2. The exposure may be carried out with resist layers 328, 340 oriented in a horizontal position, a vertical position or at an intermediary angle. Furthermore, the exposure systems may incorporate a rotating drum or flat bed machine.

It is understood that the intention of exposing resist layer 328, 340 is to create patterns in these layers that can then be transferred onto device layer stack 304. It is noted that there are physical means for achieving this transfer that are not dependant on resist exposure. Such alternatives to resist exposure include, but are not limited to screen printing, nano imprinting, nano stamping and micro imprinting. That latter four all use the same basic technique in which a template is made with relief structures in the shape and size of the patterns desired to be transferred (either a positive template or a negative template). That template is then pressed, or "embossed," into one of resist layers 328, 340, thereby replicating the relief pattern in that resist layer. The pattern is subsequently transferred into device layer stack 304 using isotropic or anisotropic etching mechanisms.

While certain representative embodiments and details have been shown for purposes of illustrating the invention, it will be apparent to those skilled in the art that various other exposure methods exists and may be used without departing from the scope of the invention, which is defined in the appended claims.

Lithography Techniques

Conventional lithography techniques, such as projection, proximity, mirror projection and contact lithography, among others, may be used to image a patterned mask onto resist layers 328, 340. In addition, new techniques such as maskless lithography, variable magnification projection, automatic depth of focus correction and zone plate array lithography, among others, may also be used. Furthermore, scanning mode lithography, such as grating light valve (GLV) and digital light processing (DLP) lithography may also be used. Scanning techniques may include continuous scanning or step and scan and repeat techniques. Other techniques such as laser direct imaging (LDI) may also be used.

Figure 4A:
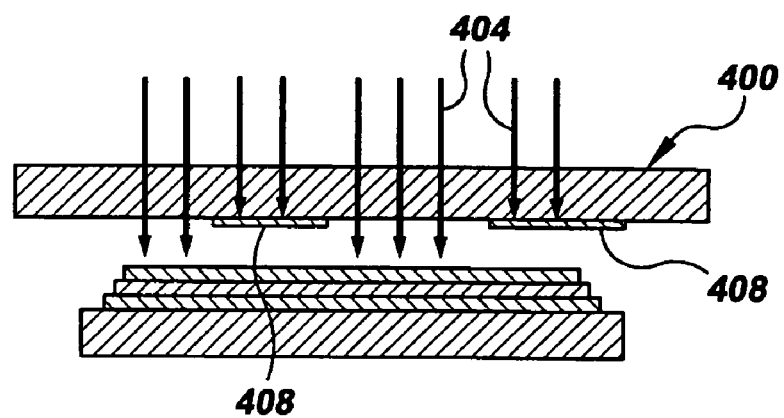
FIGS. 4A-4C are cross-sectional views, respectively, a binary mask, a grayscale mask and a color mask suitable for use with EDM method of FIGS. 2A-B.
Figure 4B:
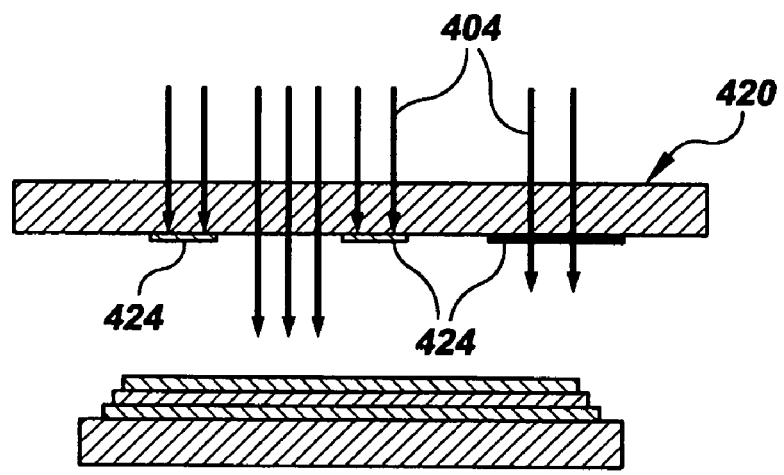
Figure 4C:
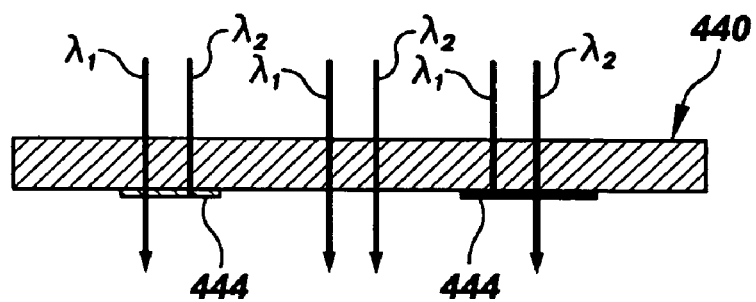

Depending on the needs of a particular application of an EDM method of the present invention, the mask used may be a monochrome binary mask, such as a conventional chrome or iron oxide mask which either allow light to pass, or no light to pass through a given area. An exemplary monochrome binary mask 400 is depicted in FIG. 4A. As shown in FIG. 4A, monochrome binary mask 400 either allows essentially all exposing light 404 to pass or blocks essentially all of the exposing light, depending upon whether or not a patterning material 408 is present. As shown in FIG. 4B, the mask 420 may alternatively be a gray scale mask, i.e., a mask that allows any of essentially all exposing light 404 to pass, essentially no light to pass or some light to pass. This is accomplished by depositing one or more patterning materials 424 in a pattern that leaves, as desired, regions of mask 320 uncoated, regions coated so as to be largely non-transmission and regions coated so as to be partially transmissive to exposing light 404. As another alternative, as shown in FIG. 4C, the mask 440 used may be a color mask, which generally is a mask having multicolor coatings 444 that each allow one color (e.g., a first wavelength $\lambda 1$) to pass, whereas a second color (e.g., a second wavelength $\lambda 2$ different from $\lambda 1$) may or may not pass through a given area. Typically such a mask 440 would also have the option of not passing any colors or all colors through a given area.

If a broadband light source or a multi line laser is used with a color mask, optical filters may be used between the light source and the mask to sequentially or simultaneously access the colors for the mask and reject others that will not be imaged. Alternatively, many single line sources (e.g., lasers) may be used inline simultaneously, or modulated sequentially to allow one color or the other. Note that different lithography methods may be mixed and match to create the desired effect.

One may realize the same result of patterning resist layers 328, 340 on both facial sides of device layer stack 304 using a single- (or multi-) color maskless techniques. In addition, modulating/varying the intensity of the light source (laser) can provide an analog to the gray scale mask. Also, modulating/varying the wavelength of the light source (laser) can provide an analog to a color mask. Further, modulating/varying the light source (laser) intensity and wavelength can provide an analog to a gray scale/color mask combination. Still, utilizing more than one light source (laser) having different wavelength can provide an analog to a color mask.

Figure 5:
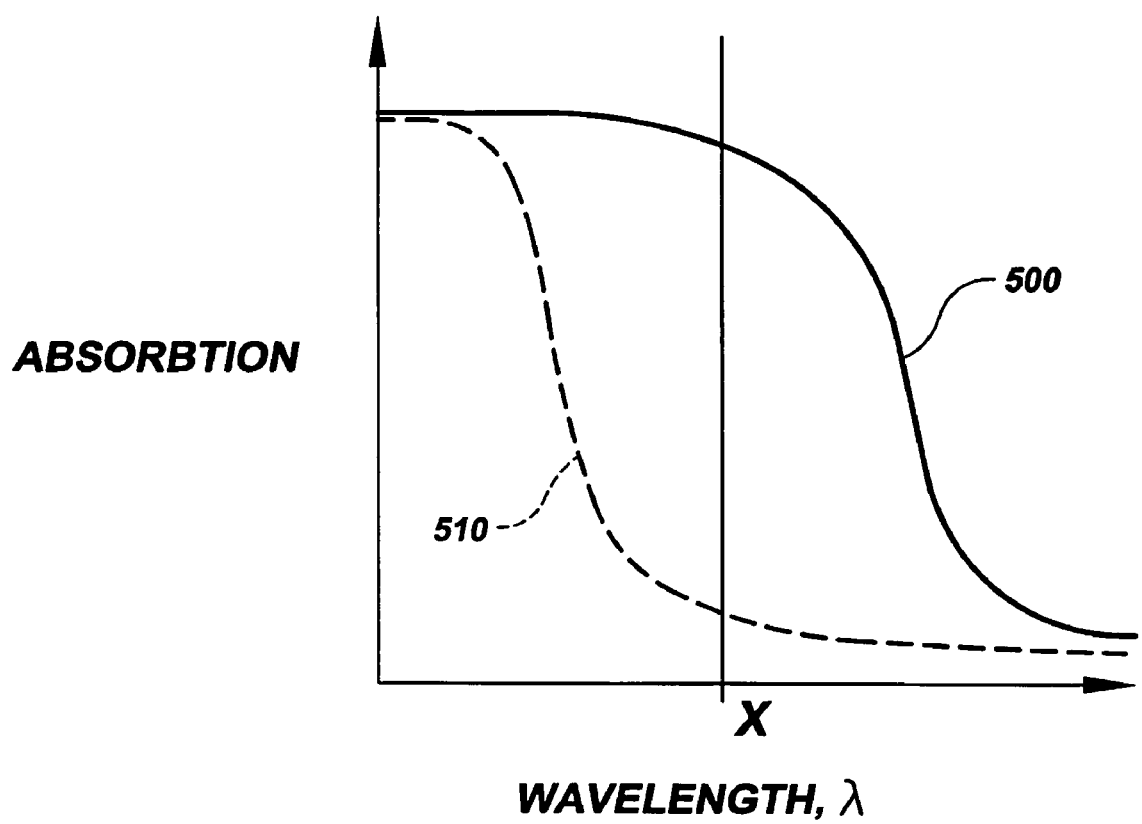
FIG. 5 is graph illustrating the absorption of a resist material before and after exposure in the context of a wavelength X.

As mentioned above in the section titled "Resist Layer(s)", a resist layer may contain more than one imaging level. The various imaging levels may be present in a single resist coating or among a plurality of resist coatings that form a stacked resist layer. In the latter case, each resist coating may correspond respectively to one of the multiple imaging layers, as discussed in some of the examples presented below. In general, however, corresponding respective images may be formed on these imaging layers using electromagnetic energy of different frequencies. FIG. 5 depicts typical absorption spectra 500, 510 of a resist material, respectively, prior to exposure at a wavelength and post exposure at that wavelength. As is clearly evident, at a wavelength X, prior to the exposure of the resist material at that wavelength is highly absorbing. At that same wavelength X, post exposure the absorption coefficient of the material has reduced significantly. In other words, post exposure the resist material is more transparent to wavelength X and the absorption graph has blue shifted.

Figure 6A:
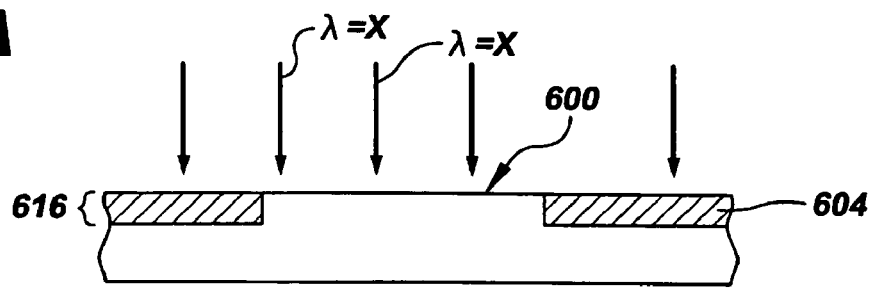
FIGS. 6A-6D are partial cross-sectional views of a resist layer illustrating the formation of three images on three distinct image layers within the resist layer.
Figure 6B:
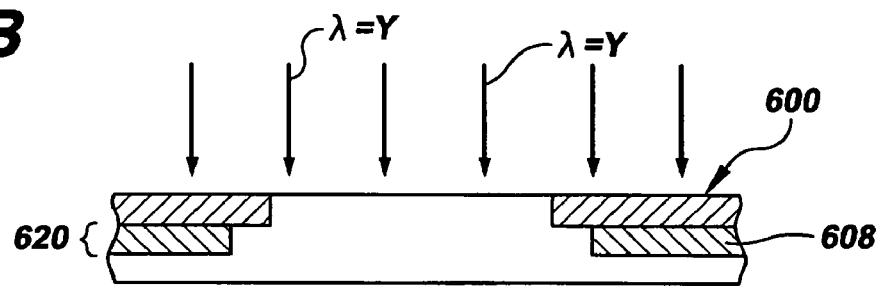
Figure 6C:
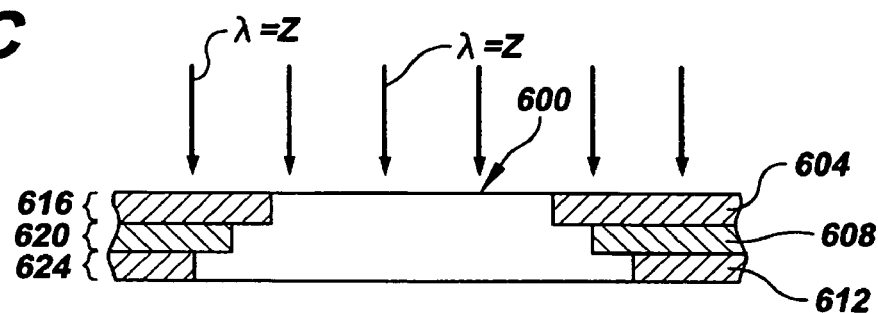
Figure 6D:
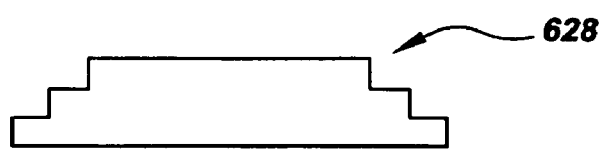

As depicted in FIG. 6C, a resist layer 600 made of such a resist material may be imparted with different images 604, 608, 612 at different depths within the layer, i.e., on different image levels 616, 620, 624 by sequentially or simultaneously exposing the layer to different patterns using different wavelengths of electromagnetic energy. Referring now to FIGS. 6A-D, in FIG. 6A resist layer 600 may exposed with electromagnetic energy having a wavelength $\lambda=X$ so as to form a first image 604 on first image level 616. Once image level 616 has been exposed, it is reasonably transparent to wavelength $\lambda=X$. Then, as shown in FIG. 6B, resist layer 600 may be exposed to electromagnetic energy having a wavelength $\lambda=Y$, wherein $\lambda<X$ (i.e., wavelength Y is shorter than wavelength X), so as to form a second image 608 on second image level 620. Then, if desired, as shown in FIG. 6C a third image 612 may be formed on third image level 624 by exposing resist layer 600 to electromagnetic energy having a wavelength $\lambda=Z$, wherein $Z<Y$ (i.e., wavelength Z is shorter than wavelength Y). After resist layer 600 has been developed, it may have the profile 628 shown in FIG. 6D.

It will be appreciated by those skilled in the art that the described methodology is a convenient way to perform gray scale lithography using the multiplexing nature of light. In this context, "multiplexing" implying the ability for an infinite number of wavelengths of light to coexist at the same location at the same time and still maintain their unique wavelength signatures.

Figure 7:
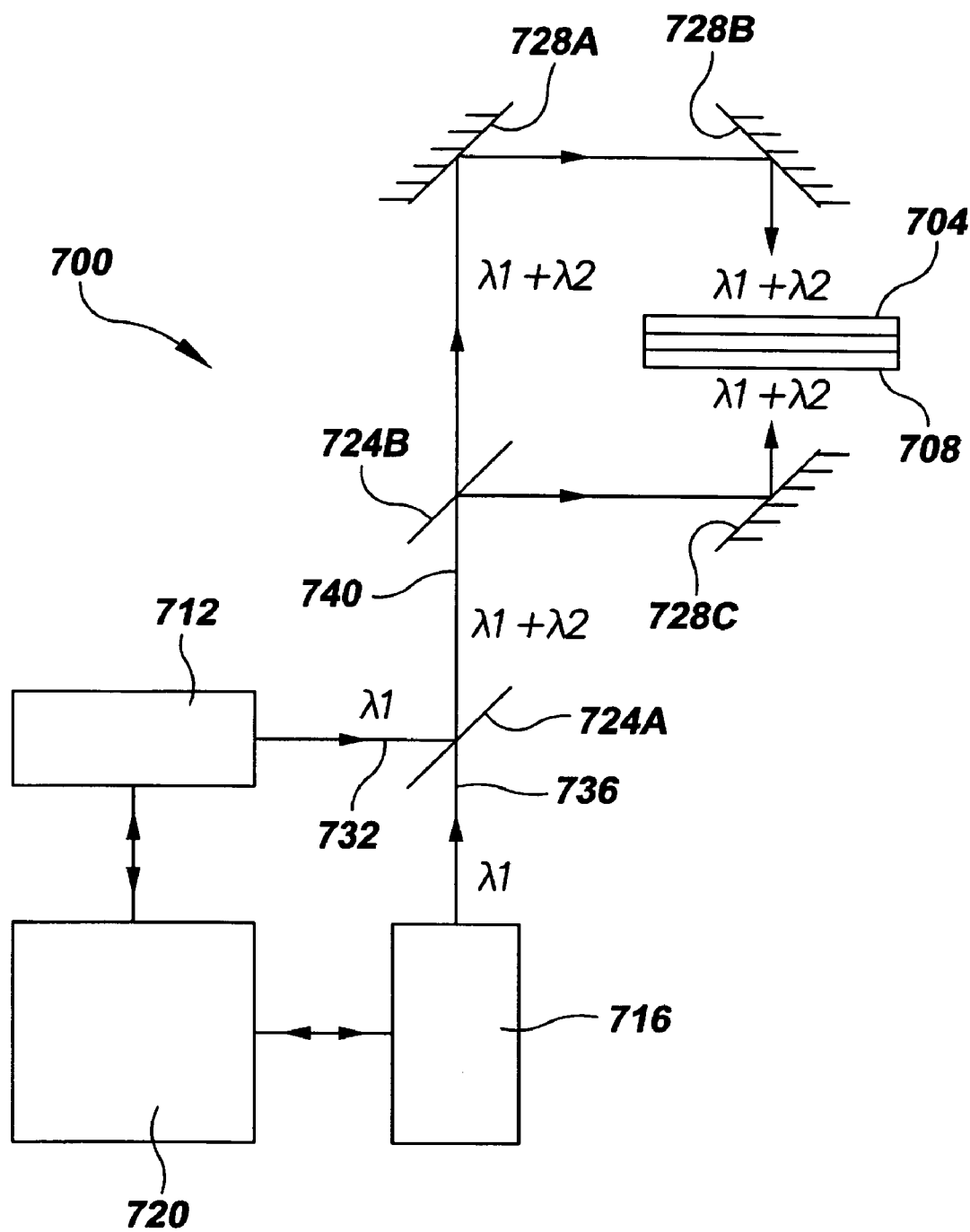
FIG. 7 is a high-level schematic of a dual wavelength maskless direct laser writing lithography system of the present invention that may be used with EDM method of FIGS. 2A-B.

FIG. 7 illustrates a dual-wavelength maskless direct layer writing lithography system 700 that may be used to simultaneously expose resist layers 704, 708 having up to two imaging levels (not shown) as discussed above. Lithography system 700 may be used for the exposure step(s) of an EDM method of the present invention, such as EDM system 200 of FIGS. 2A-B. Indeed, several of the example recipes presented below indicate the use of lithography system 700.

In this present example, lithography system 700 is configured for simultaneous two sided exposure of the two resist layers 704, 708. Of course, lithography system 700 could readily be modified for only single sided exposure, if desired. In addition, it is noted that although lithography system 700 is set up for exposing two imaging layers using two wavelengths, the system may be readily modified for exposing three or more imaging layers using a corresponding number of wavelengths. Those skilled in the art will readily understand how to make such modifications.

Lithography system 700 may include first and second lasers 712, 716 each controlled by a pattern generator, such as common pattern generator 720 shown. Pattern generator 720 may be based on conventional pattern generators, but with the modification that it produces patterns suitable for the dual wavelength images imparted onto two imaging layers. Correspondingly, laser 712 may emit energy at a first wavelength $\lambda 1$ and laser 716 may emit energy at a second wavelength $\lambda 2$ that is different from first wavelength $\lambda 1$, for the reasons discussed above. A pair of beamsplitters 724A-B and a set of mirrors 728A-C may be used to combine the beams 732, 736 emitted from lasers 712, 716 and direct the combined beam 740 to each of the two resist layer 704, 708 as shown.

While certain representative embodiments and details have been shown for purposes of illustrating the invention, it will be apparent to those skilled in the art that various other exposure and lithography methods exists and may be used without departing from the scope of the invention, which is defined in the appended claims.

Etching Device Layer Stack

As discussed above, device layer stack 304, resist layers 328, 340 and/or protective layers 336, 344 may be removed, i.e., portions of these layers selectively removed by various removal techniques so as to form part or all of each electronic device made during a particular application of an EDM method of the present invention. Suitable ablating techniques include, but are not limited to wet and dry etching/milling techniques and electromagnetic direct ablation, among others. Examples of suitable dry etching techniques include RIE, plasma/planar etching, PE etching, ICP etching, DRIE, sputtering, ion enhanced etching, ion beam milling, chemically assisted ion beam milling, ECR plasma, HDP, microwave and RF plasma assisted etching and laser induced/assisted chemical etching, among others. The chemical source may introduced in a flood, time-varying, spatially varying or continuous manner. An example of electromagnetic ablation is laser direct imaging, or photoablation.

While certain representative embodiments and details have been shown for purposes of illustrating the invention, it will be apparent to those skilled in the art that other etching methods exists and may be used without departing from the scope of the invention, which is defined in the appended claims.

Laminating Permanent Substrate to Patterned Device Layer Stack

As discussed above, at a certain point during an EDM method of the present invention it may be desirable to laminate, or attach, a permanent substrate, such as permanent substrate 348, to patterned device layer stack 304. As also discussed above relative to temporary substrate 300 and protective layers 336, 244, there are many ways to bond two structure together. Depending, of course, on the type of material selected for permanent substrate 348, any one of the attaching techniques described above relative to temporary substrate 300 and protective layers 336, 344 may be used to secure the permanent substrate to device layer stack 304.

Passivation Materials

As discussed above, depending on the materials used for various layers, such as electronic device layers 308 and permanent substrate 348, it may be desirable or necessary to provide device layer stack 304 with passivation layer(s) 356 for isolating or otherwise protecting the device layers from unwanted environmental influences. The material(s) selected for passivation layer(s) 356 may be insulators or metals depending on the nature of passivation desired. For example, for isolating electronic structures such as TFTs, capacitors, etc., the passivation materials are typically insulators. Any of the insulator/metallic materials listed above relative to permanent substrate 300 can be deposited in thin or thick film form to function as a passivation layer.

Permanent Substrate

Generally, as discussed above, permanent substrate 348 is a permanent backing substrate or platform for the finished circuitry sheet. Permanent substrate 348 may be transparent, opaque or translucent as needed to suit a particular application. Materials suitable for use in permanent substrate 348 include the materials listed above relative to temporary substrate 300. In addition to permanent substrate 348 itself, other functionality/functional layers may be built in or on the permanent substrate prior to or after lamination to device layer stack 304. For example: permanent substrate 348 may intrinsically acts as a planarizing/barrier layer; scratch resistant layers may be deposited on or under the substrate; UV protection layers may be deposited on the substrate or incorporated within the composition of the substrate; color filters and black mask coatings may be deposited on the substrate; and metallic edge seams/pixel seams for facilitating or allowing for hermetic bonding between the substrate and device layer stack 304 may be deposited. The sealing may be induced by microwave bonding or other conventional sealing method.

In addition, other coatings, such as chemical resiliency coatings, encapsulation coatings, anti-reflective coatings, anti-fingerprint coatings, anti-static coatings, electrically conductive layers/coatings, anticorrosion layers, flame retardant coatings, adhesive layers, polarizing films, retardation films, or combinations thereof, among others may be deposited on permanent substrate 348, prior to or post lamination to device layer stack 304. These functional coating include, but are not limited to, organic or inorganic coatings.

While certain representative embodiments have been shown for purposes of illustrating the wide variety of permanent substrates, it will be apparent to those skilled in the art that substrates not disclosed herein may be made without departing from the scope of the invention.

EXAMPLES

Following are a number of exemplary recipes for making active pixel matrix circuitry sheets suitable for use in any of a variety of display products. Each of these recipes utilizes various aspects of EDM method 200 of FIGS. 2A-B. The steps in each of these recipes are self explanatory, with additional comments made for clarification or to point out certain features of that recipe. It is noted that in each of these examples that include a corresponding set of figures, the step designator corresponds alphabetically to the figure designator of the relevant figure in that set. For example, relative to Example 1 just below, Example 1 includes FIGS. 8A-8V, with FIG. 8A corresponding to Step A, FIG. 8B corresponding to Step B, FIG. 8C corresponding to Step C, and so on.

Example 1

Figure 8A:
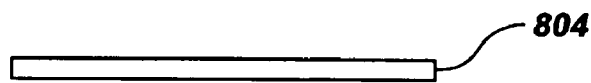
FIGS. 8A-8V contain partial cross-sectional views of layered structures formed during various steps of the particular recipe of Example 1 for the EDM method of FIGS. 2A-B.
Figure 8B:
Figure 8C:
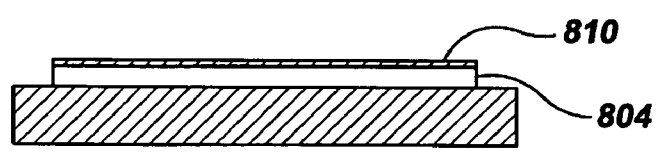
Figure 8D:
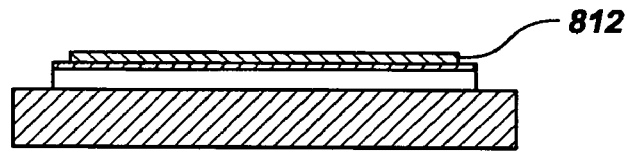
Figure 8E:
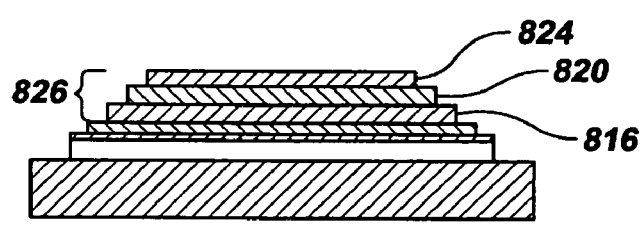
Figure 8F:
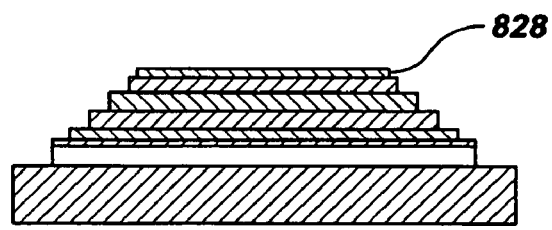
Figure 8G:
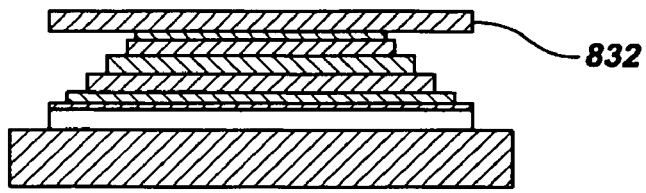
Figure 8H:
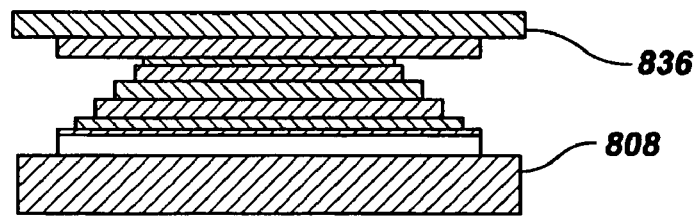
Figure 8I:
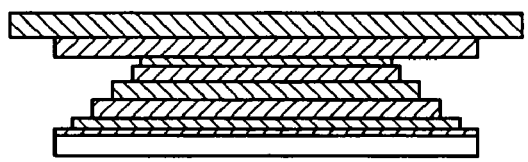
Figure 8J:
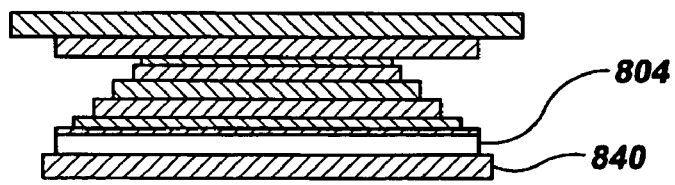
Figure 8K:
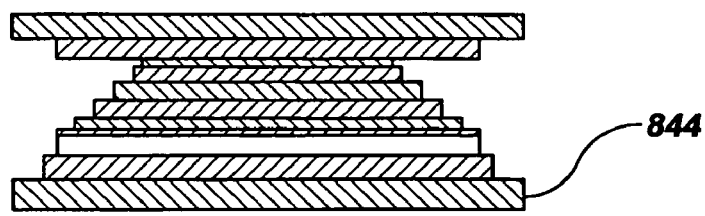
Figure 8L:
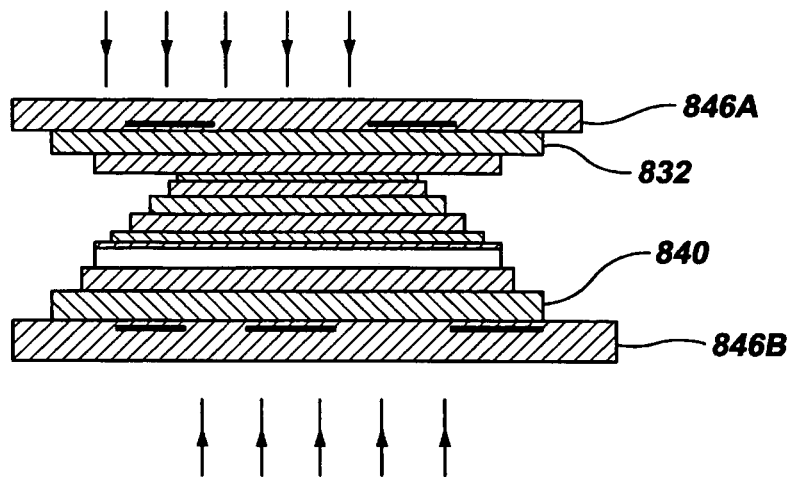
Figure 8M:
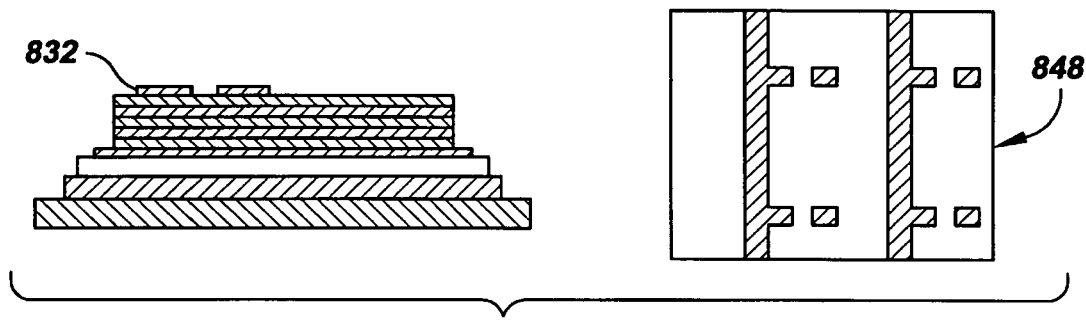
Figure 8N:
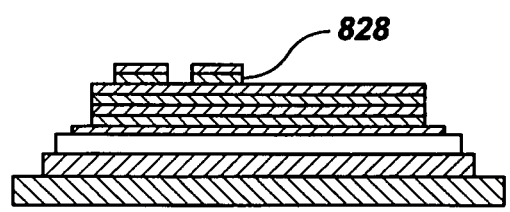
Figure 8N:
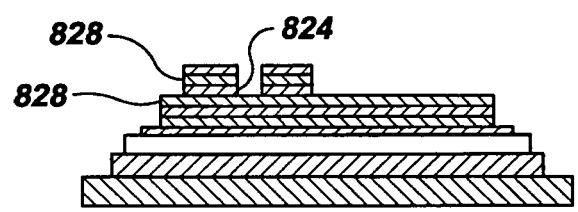
Figure 8S:
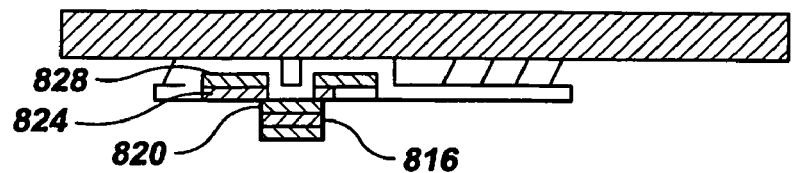
Figure 8T:
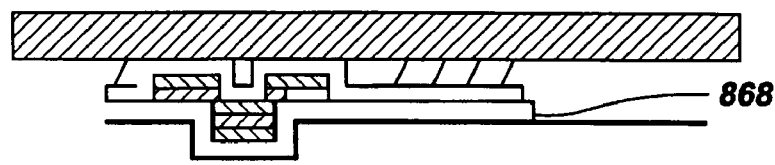
Figure 8U:
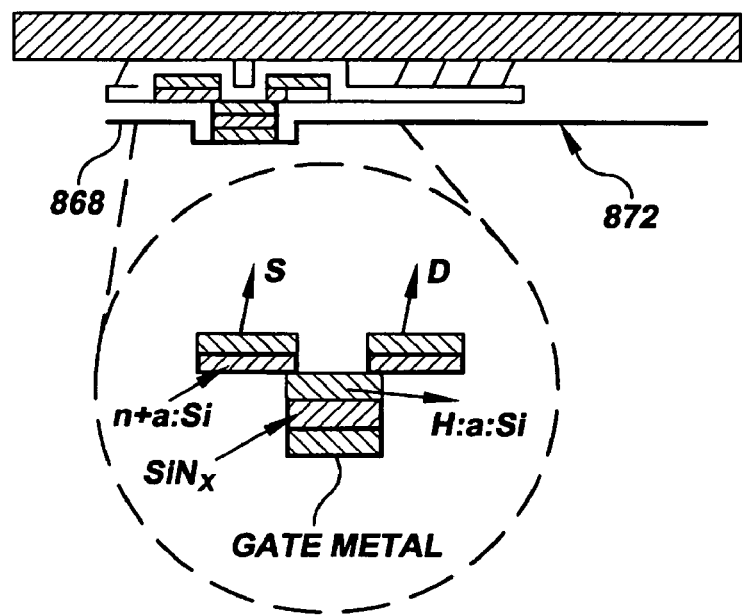
Figure 8V:
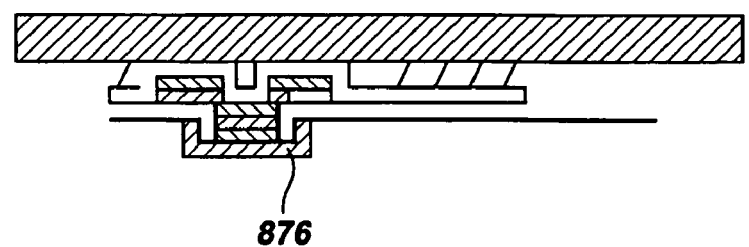

Referring now to FIGS. 8A-8V, following is an exemplary recipe for making a particular active matrix pixel circuitry sheet 800 (FIG. 8V) of the present invention that may be used as an active matrix backplane of a display device.

| | |
|---|---|
| Step A: | Choose an aluminum metallic foil having a thickness of less than about 20 microns as a temporary substrate 804. |
| Step B: | Attach a stiffener 808 to the backside of temporary substrate 804. For example, stiffener 808 may be a nickel, stainless steel or other metal foil having a thickness of about 100-200 microns. |
| Step C: | Electro-polish the exposed surface of aluminum foil temporary substrate 804 so as to achieve a high degree of planarization of surface 810. |
| Step D: | Deposit a gate metal layer 812. Alternatively, aluminum foil temporary substrate 804 may be alloyed and intrinsically used as a gate metal layer. |
| Step E: | Deposit a silicon nitride (SiNx) layer (coating) 816, an amorphous hydrogenated silicon layer 820 and an n+ doped amorphous silicon layer 824 using PECVD, sequentially without breaking vacuum so as to form a device layer stack 826. The thickness of these materials can be varied according to the particular application. |
| Step F: | Deposit a source/drain (S/D) and metal interconnect layer 828, preferably without breaking vacuum. |
| Step G: | Deposit a resist layer 832 on top of metal layer 828. |
| Step H: | Laminate a protective, peelable (or water soluble, UV detachable, etc.) protective polymer sheet (layer) 836 on the free surface of resist layer 832. |
| Step I: | Detach stiffener 808 (FIG. 8H). |
| Step J: | Deposit resist layer 840 on free surface of aluminum foil temporary substrate 804. |
| Step K: | Laminate a protective, peelable (or water soluble, UV detachable, etc.) protective polymer sheet 844 on free surface of resist layer 840. |
| Step L: | Expose resist layers 832, 840 simultaneously using conventional contact lithography and binary masks 846A-B. |
| Step M: | Develop resist layer 832 so as to impart pattern 848 shown. |
| Step N: | Etch source/drain, metal interconnect layer 828 as shown using suitable wet or dry etching techniques. |
| Step O1: | Etch n+ doped amorphous silicon layer 824 (ohmic contact) using dry etching. Typically during this step, hydrogenated amorphous silicon layer 820 is also partially etched. Metal layer 828 acts as a stop to inhibit any etching of materials underneath it. |
| Step O2: | Remove any remaining portions of resist layer 832 (FIG. O1). |
| Step P: | Optionally, deposit passivation layer 852. |
| Step Q1: | Secure a permanent substrate 856 to the surface of device layer stack 826. Note that the securing agent 858 (epoxy, adhesive, etc.) will flow into the etched n+ doped groove and act as an intrinsic passivation layer. The choice of securing agent can be dictated by considering this secondary function. |
| Step Q2: | Develop resist layer 840 so as to impart pattern 860 shown. FIG. Q3 is an overlay 884 illustrating (lower) pattern 860 in proper registration with (upper) pattern 848. Overlay 884 shows four TFT regions 888 each including a corresponding respective gate region 890 and source/drain regions 892. |
| Step R: | Etch the gate metal definition from metal layer 812. |
| Step S: | Etch underlying SiNx insulator layer 816, hydrogenated amorphous silicon layer 820, and n+ doped amorphous silicon layer 824 until the underside of metal layer 828 is reached. Generally, this step completes the formation of the structure of the TFTs 864 (only one of which is shown for convenience) within device layer stack 826. |
| Step T: | Deposit indium-tin-oxide (ITO) layer 868 as shown. |
| Step U: | Pattern and etch ITO layer 868 as required so as to define pixel electrodes 872. |
| Step V: | Deposit a passivation layer 876 over gate metal layer 812, if desired. However, surface oxidation of aluminum/aluminum alloy (or whatever metal is chosen for gate metal) may provide adequate protection. |

Regarding Example 1, the following points are noted:
1. Aluminum has a melting point of >650° C. and will easily withstand the PECVD deposition temperature typically used in conventional display manufacturing (<450° C.).
2. In lieu of aluminum foil being used for temporary substrate 804, as already described in an earlier section of this disclosure, very thin stainless or other steel, nickel, metal or polyimide sheets may be used.
3. All patterning of the most critical layers of TFT 864 was effectively performed at one time. Note that device layers 816, 820, 824, 828 may be deposited in reverse order (upside down stack) and still yield the same results. That is, deposit S/D metal layer 828 first, n+ doped silicon layer 824 second, hydrogenated amorphous silicon layer 820 third and silicon nitride layer 816 third, and then gate metal layer 812. Of course, the mask positions will need to be reversed, as well.
4. It should be apparent to those skilled in the art that projection/proximity lithography may readily be substituted for the contact lithography shown. In addition, maskless amplitude scanning lithography techniques may also be substituted for the binary masks illustrated.
5. This recipe utilizes a single coating resist layer 832, 840 on each side of device layer stack 826. Each ITO pixel electrode 872 can be readily patterned and etched using only coarse photolithography registration.
6. Silicon dioxide and silicon nitride are commonly used as passivation materials in the display/electronics industry.
7. Note that the electro-optical material for the front plane (e.g., liquid crystal, OLED/PLED material, electrophoretic material, electrochromic material, etc.) will be on ITO layer 868.
8. As those skilled in the art will appreciate, this configuration can use a storage-capacitor-on-gate design, or, alternatively, an independent storage capacitor can be made with metal or ITO deposition. This capacitor (not shown) may be deposited after the passivation Step P, and before securing permanent substrate.
9. 
10. Resist layer 840 could have been developed first, subsequently etched and laminated to the permanent substrate 856 prior to developing resist layer 832 and etching device layer stack 826 using resist layer 832. In this case, ITO layer 868 and the electro optical material would end up on the top surface in a manner similar to conventional designs.
11. The recipe of Example 1 allows for the TFT backplane to be transmissive or opaque. This is dictated by the spectral characteristics of the permanent substrate chosen.

Example 2

Figure 9A:
Figure 9B:
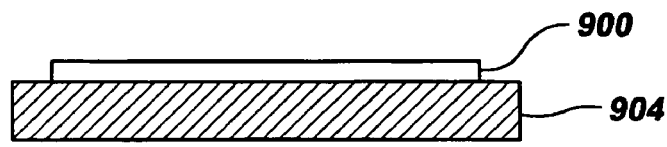
Figure 9C:
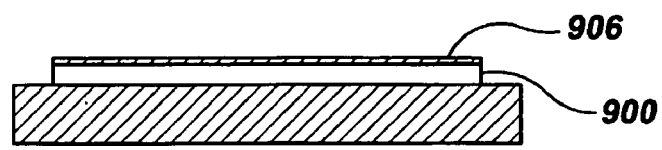
Figure 9D:
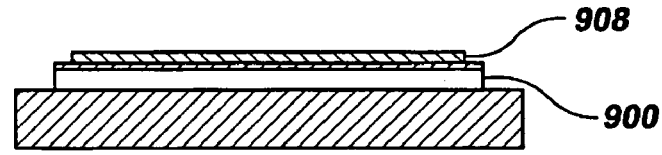
Figure 9E:
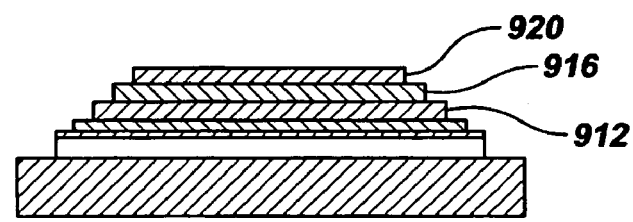
Figure 9F:
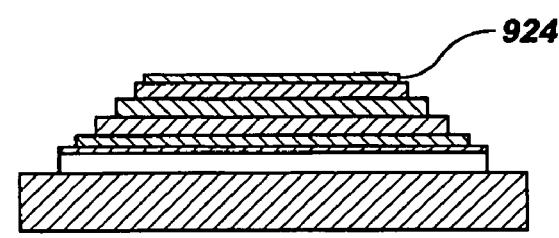
Figure 9G:
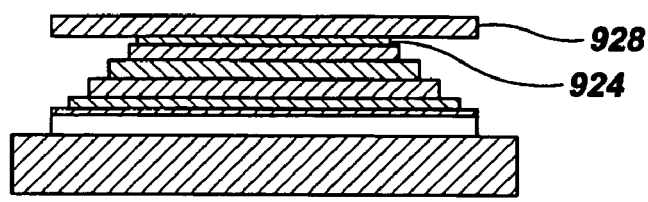

The recipe detailed in Example 1 may be modified for display devices that do not require a transparent TFT backplane. For example, self-emissive devices such as top emitting OLEDs/PLEDs, or reflective devices like electrophoretics, electrochromics, reflective LCDs do not require a backlight for operation. An exemplary modified recipe is as follows. It is noted that steps A-L in the following recipe are identical to Steps A-L revealed in Example 1, above. The following steps are illustrated in corresponding respective FIGS. 9A-9V.

Figure 9H:
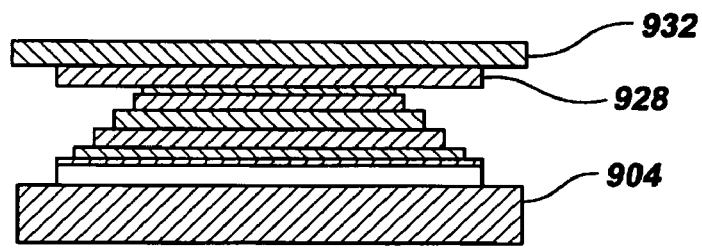
Figure 9I:
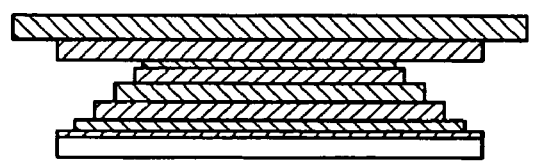
Figure 9J:
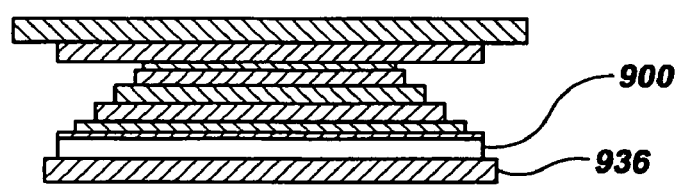
Figure 9K:
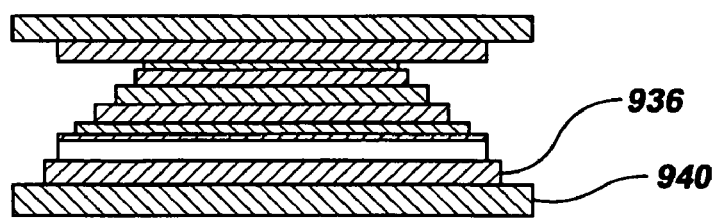
Figure 9L:
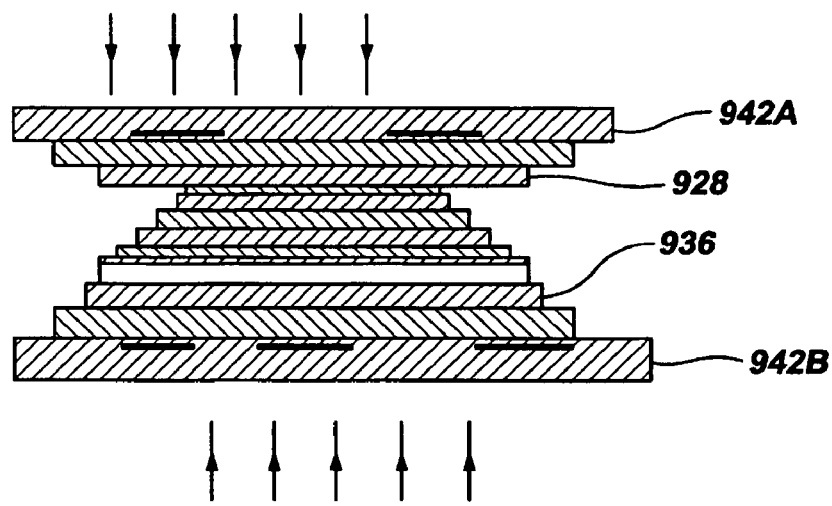
Figure 9M:
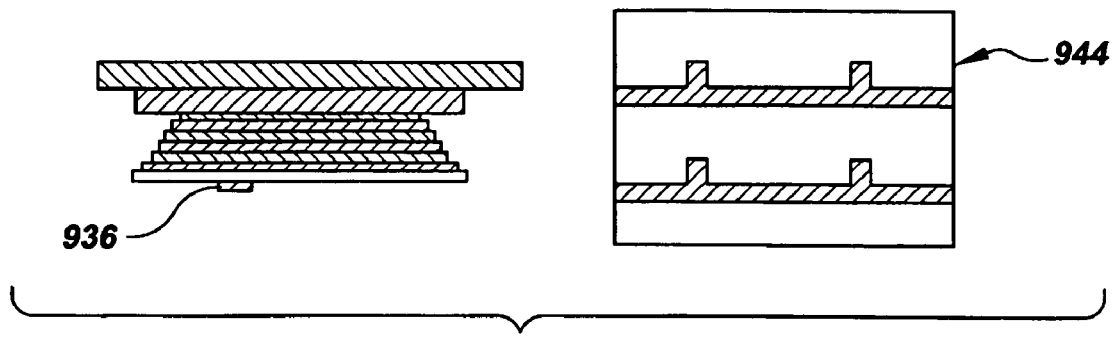
Figure 9N:
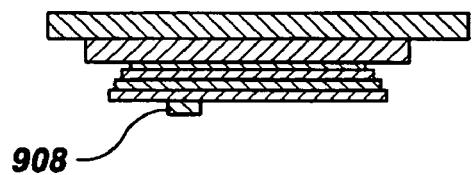
Figure 9O:
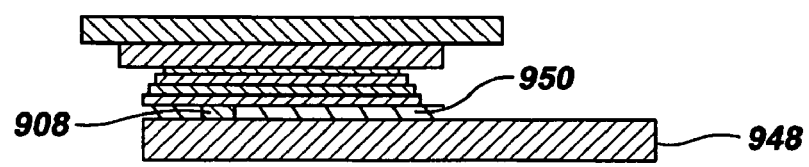

| | |
|---|---|
| Step A: | Choose an aluminum metallic foil having a thickness of less than about 20 microns as a temporary substrate 900. |
| Step B: | Attach a stiffener 904 to the backside of temporary substrate 900. For example, stiffener 904 may be a nickel, stainless steel or other metal foil having a thickness of about 100-200 microns. |
| Step C: | Electro-polish the exposed surface of aluminum foil temporary substrate 900 so as to achieve a high degree of planarization on surface 906. |
| Step D: | Deposit a gate metal layer 908. Alternatively, aluminum foil temporary substrate 900 may be alloyed and intrinsically used as a gate metal layer. |
| Step E: | Deposit a silicon nitride (SiNx) layer 912 (coating), an amorphous hydrogenated silicon layer 916 and an n doped amorphous silicon layer 920 using PECVD, sequentially without breaking vacuum. The thickness of these materials can be varied as required for each application. |
| Step F: | Deposit a source/drain (S/D) and metal interconnect layer 924, preferably without breaking vacuum. |
| Step G: | Deposit a resist layer 928 on top of metal layer 924. |
| Step H: | Laminate a protective, peelable (or water soluble, UV detachable, etc.) protective polymer sheet 932 on free surface of resist layer 928. |
| Step I: | Detach stiffener 904 (FIG. 9H). |
| Step J: | Deposit a resist layer 936 on the free surface of aluminum foil temporary substrate 900. |
| Step K: | Laminate a protective, peelable (or water soluble, UV detachable, etc.) protective polymer sheet 940 on free surface of resist layer 936. |
| Step L: | Expose resist layers 928, 936 simultaneously using conventional contact lithography and binary masks 942-A-B. |
| Step M: | Develop resist layer 936 so as to impart pattern 944 shown. |
| Step N: | Etch the gate metal definition into metal layer 908. |
| Step O: | Secure a permanent substrate 948 over metal layer 908 using an epoxy 950. Epoxy 950 may act as a passivation layer for the gate metal, if required. |
| Step P1: | Develop resist layer 928 so as to impart pattern 952 shown. FIG. P2 is an overlay 976 illustrating (lower) pattern 952 in proper registration with (upper) pattern 944. Overlay 976 shows four TFT regions 980 each including a corresponding respective gate region 984 and source/drain 988 regions, with one of each of the source/drain regions of each TFT region being integral with pixel electrode region 990. |
| Step Q: | Etch S/D and metal interconnect layer 924 as shown using wet etching or dry etching techniques. Etch n+ doped amorphous silicon layer 920 (ohmic contact) by dry etching. (Typically, during this step hydrogenated amorphous silicon layer 916 is also partially etched). Metal layer 924 acts as a stop to inhibit etching of materials underneath it. |
| Step R: | Remove any remaining portions of resist layer 928 (FIG. 9Q). |
| Step S: | Deposit a passivation layer 956, such as an SiNx or SiO2 layer. |
| Step T: | Deposit a conductor layer 960 on top of passivation layer 956 (e.g., ITO, metal, etc.) |
| Step U: | Pattern conductor layer 960 into pixel electrodes 964. |
| Step V: | Deposit/fill an electro-optical material 968 over the pixel electrodes 964. |

The recipe outlined immediately above allows for the fabrication of an opaque TFT backplane. A driven pixel electrode design that uses a parallel plate capacitor may be made using this recipe. Such a design may be used for TFT backplanes for reflective LCD, top emissive OLED/PLED, electrophoretics and electrochromic displays, among others. Since these types of displays do not use a backlight and, consequently, there is no light transmitted from the front side onto hydrogenated amorphous silicon layer 916 underneath the drain metal segments, there is no issue with photo-induced leakage current problems with the TFTs 972 (FIG. 9V) of this recipe.

Example 3

Figure 10A:
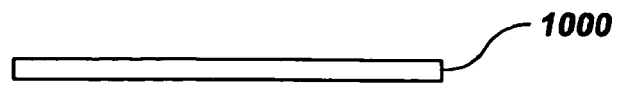
FIGS. 10A-10U contain partial cross-sectional views of layered structures formed during various steps of the particular recipe of Example 3 for the EDM method of FIGS. 2A-B.
Figure 10B:
Figure 10C:
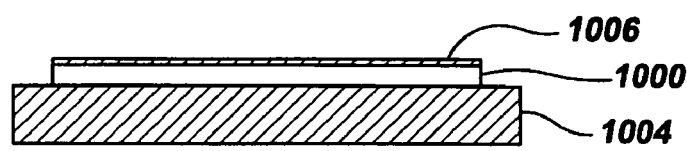
Figure 10D:
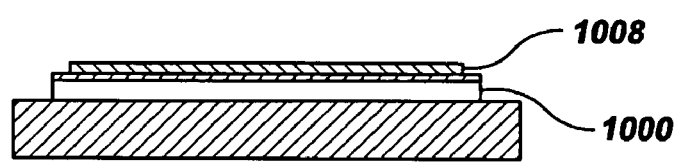
Figure 10E:
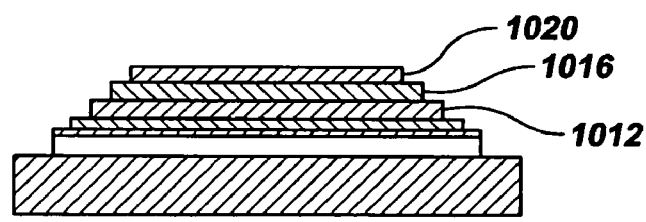
Figure 10F:
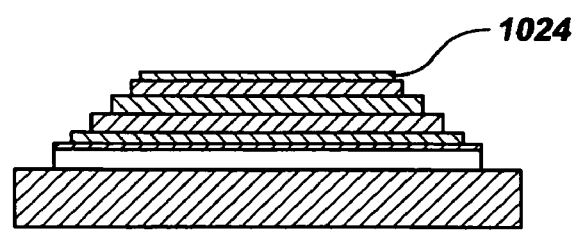
Figure 10G:
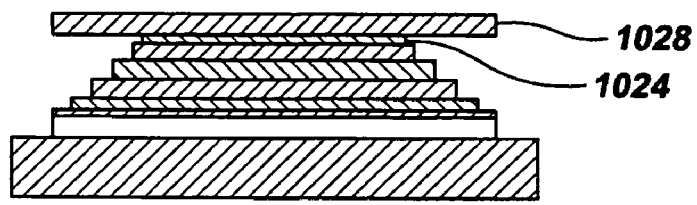
Figure 10H:
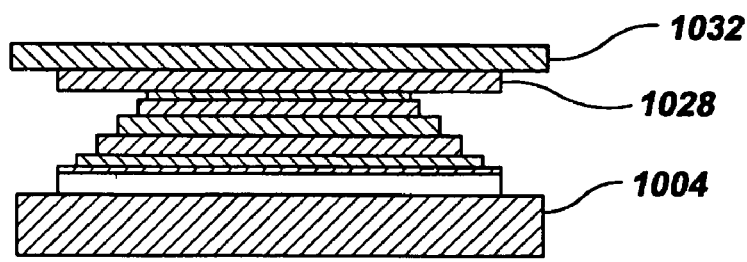
Figure 10I:
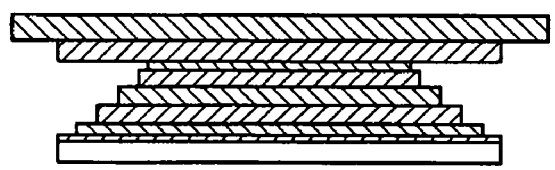
Figure 10J:
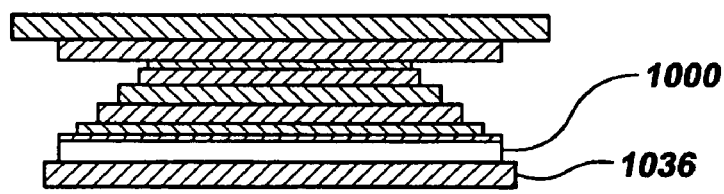
Figure 10K:
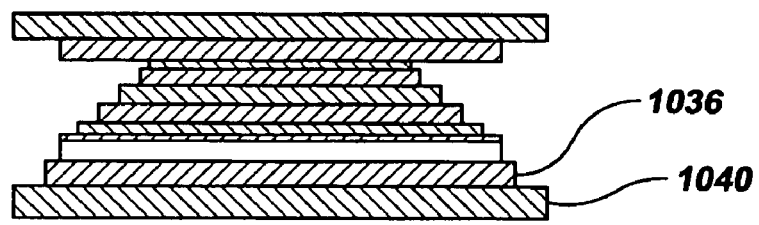
Figure 10L:
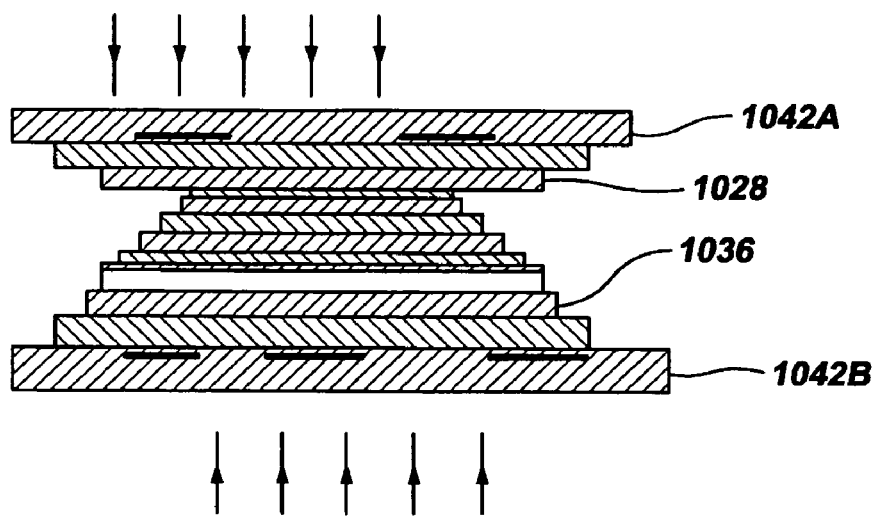
Figure 10M:
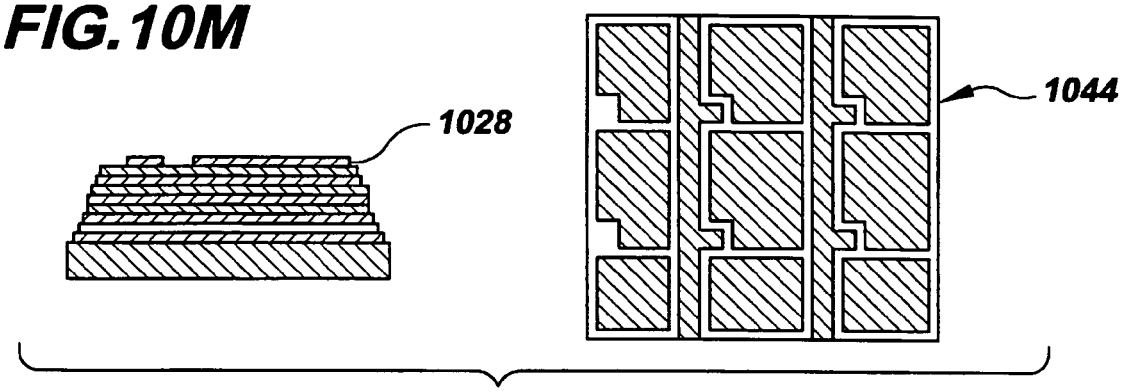
Figure 10M:
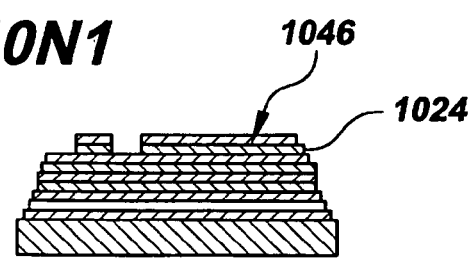
Figure 10M:
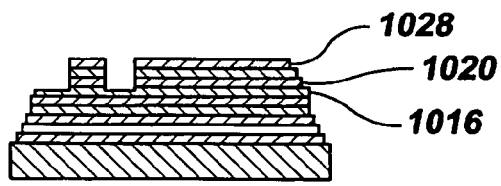
Figure 10O:
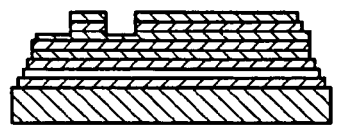
Figure 10P:
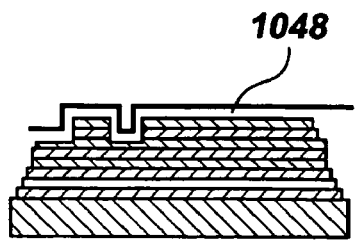
Figure 10Q:
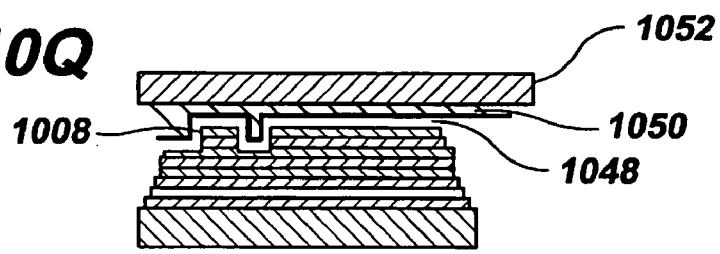
Figure 10Q:
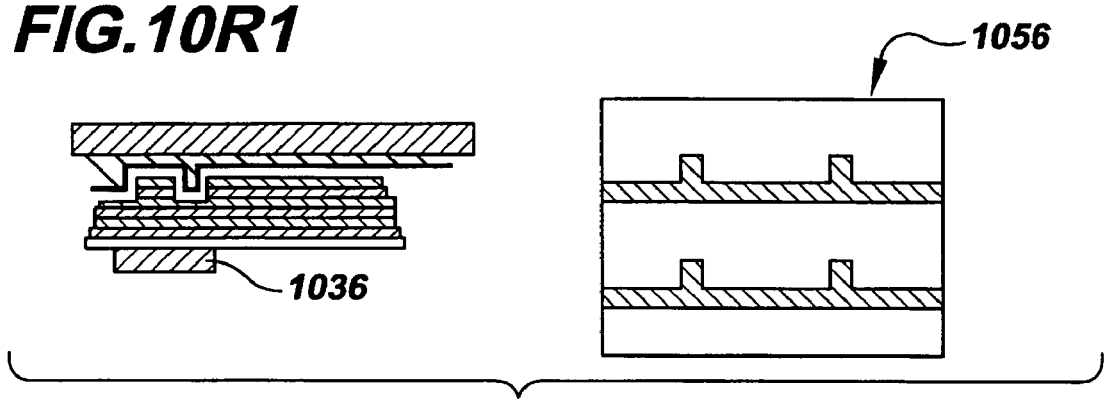
Figure 10S:
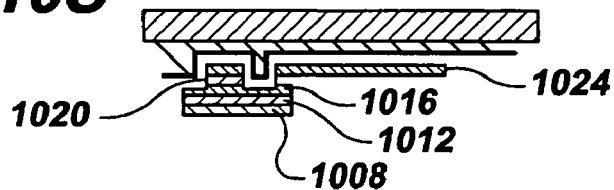
Figure 10T:
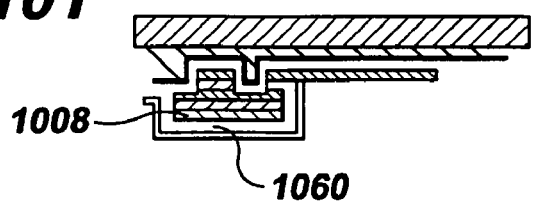
Figure 10U:
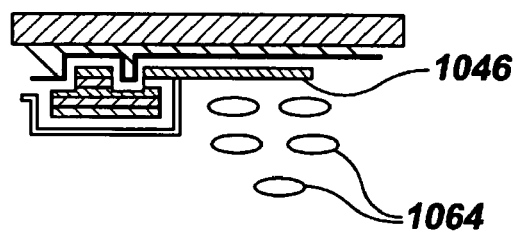
Figure 10U:
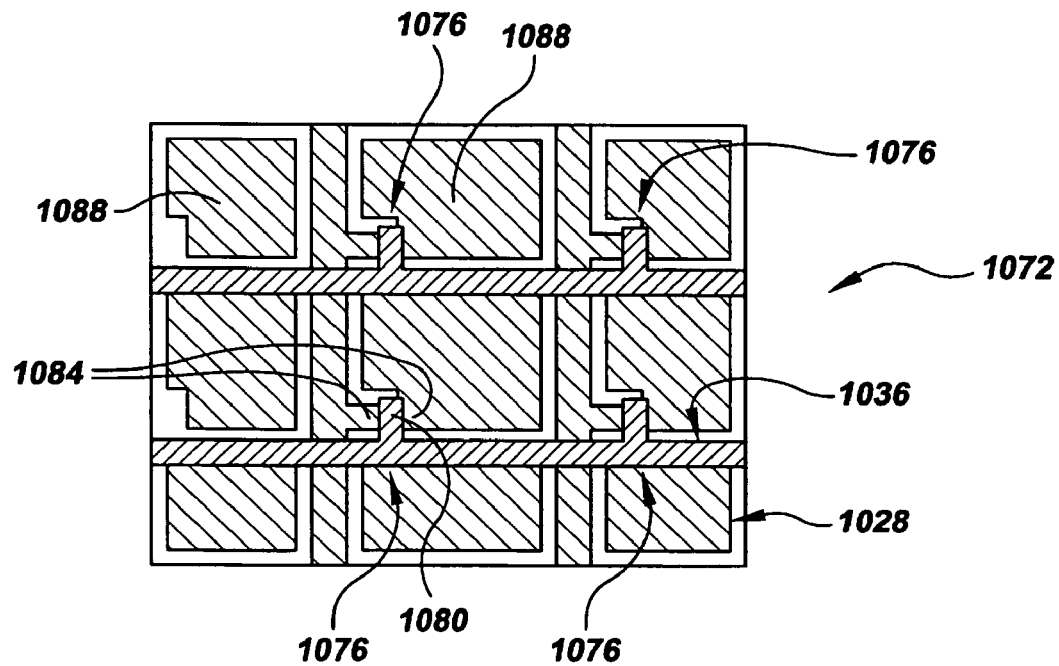

The recipe detailed in Example 2 may be further modified for displays that do not require a transparent TFT backplane. An exemplary modified recipe is as follow. It is noted that Step A-L in the following recipe are identical Steps A-L revealed in each of Examples 1 and 2, above. FIGS. 10A-10U illustrate the following corresponding respective steps.

| | |
|---|---|
| Step A: | Choose an aluminum metallic foil having a thickness of less than about 20 microns as a temporary substrate 1000. |
| Step B: | Attach a stiffener 1004 to the backside of temporary substrate. For example, stiffener may be a nickel, stainless steel or other metal foil having a thickness of about 100-200 microns. |
| Step C: | Electro-polish the exposed surface of aluminum foil temporary substrate 1000 so as to achieve a high degree of planarization on surface 1006. |
| Step D: | Deposit a gate metal layer 1008. Alternatively, aluminum foil temporary substrate 1000 may be alloyed and intrinsically used as a gate metal layer. |
| Step E: | Deposit a silicon nitride (SiNx) layer 1012 (coating), an amorphous hydrogenated silicon layer 1016, and an n+ doped amorphous silicon layer 1020 using PECVD, sequentially without breaking vacuum. The thickness of these materials can be varied to suit each application. |
| Step F: | Deposit a source/drain (S/D) and metal interconnect layer 1024, preferably without breaking vacuum. |
| Step G: | Deposit a resist layer 1028 on top of metal layer 1024. |
| Step H: | Laminate a protective, peelable (or water soluble, UV detachable, etc.) protective polymer sheet 1032 on free surface of resist layer 1028. |
| Step I: | Detach stiffener 1004 (FIG. 10H). |
| Step J: | Deposit resist layer 1036 on the free surface of aluminum foil temporary substrate 1000. |
| Step K: | Laminate a protective, peelable (or water soluble, UV detachable, etc.) protective polymer sheet 1040 on free surface of resist layer 1036. |
| Step L: | Expose resist layers 1028, 1036 simultaneously using conventional contact lithography and binary masks 1042A-B. |
| Step M: | Develop resist layer 1028 so as to impart pattern 1044 shown. Note that pattern 1044 is identical to pattern 944 of Example 2, above. |
| Step N1: | Etch S/D and metal interconnect layer 1024 as shown using wet etching or dry etching techniques. This step forms the pixel electrodes 1046. |
| Step N2: | Etch n+ doped amorphous silicon layer 1020 (ohmic contact) by dry etching. (Typically, during this step hydrogenated amorphous silicon layer 1016 is also partially etched). Metal layer 1024 acts as a stop to inhibit any etching of materials underneath it. |
| Step O: | Remove any remaining portions of resist layer 1028 (FIG. 10N2). |
| Step P: | Optionally, deposit a passivation layer 1048, e.g., an SiNx or SiO2 layer. |
| Step Q: | Secure a permanent substrate 1052 to passivation layer 1048, if provided, or to metal layer 1024, e.g., using an epoxy 1050. Epoxy 1050 can act as a passivation layer for metal layer 1024 if required. |
| Step R1: | Develop resist layer 1036 so as to impart pattern 1056 shown. Note that pattern 1056 is identical to patterns 860, 952 used in Examples 1 and 2, respectively. FIG. R2 is an overlay 1072 illustrating (lower) pattern 1036 in proper registration with (upper) pattern 1028. Overlay 1072 shows four TFT regions 1076 each including a corresponding respective gate region 1080 and source/drain regions 1084, with one of each of the source/drain regions of each TFT region being integral with a corresponding pixel electrode region 1088. |
| Step S: | Etch the gate metal definition into metal layer 1008. Etch the underlying SiNx insulation layer 1012, hydrogenated amorphous silicon layer 1016 and n+ doped amorphous silicon layer 1020 until the underside of the S/D and electrode pixel metal layer 1024 is reached. |
| Step T: | Deposit a passivation layer 1060 over gate metal layer 1008, if required. Pattern passivation layer 1060. |
| Step U: | Deposit/fill an electro-optical material 1064 on top of pixel electrodes 1046. |

Similar to Example 2, above, the recipe just outlined allows for opaque TFT backplane. A driven pixel electrode design that uses a parallel plate capacitor may be made using this recipe. Such a design may be used for TFT backplanes for reflective LCD, top emissive OLED/PLED, electrophoretics and electrochromic displays, among others. Since these types of displays do not use a backlight and, consequently, there is no light transmitted from the front side onto the hydrogenated amorphous silicon layer 1016 underneath the drain metal segments, there is no issue with photo-induced leakage current problems with the TFTs 1068.

The configuration of a circuitry sheet, such as circuitry sheet 1072 of FIG. 10X, made using this recipe can use a storage-capacitor-on-gate design, or, alternatively, an independent storage capacitor can be made with metal or ITO deposition. This capacitor (not shown) may be deposited after the passivation Step P, and before securing permanent substrate 1052.

Example 4

Figure 11A:
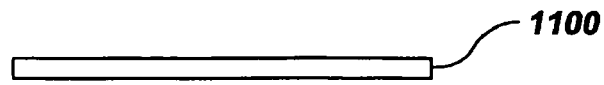
Figure 11B:
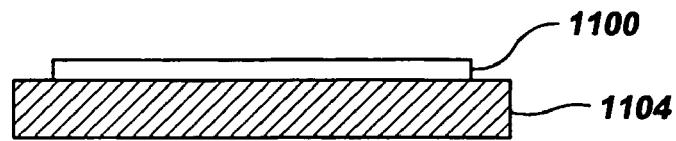
Figure 11C:
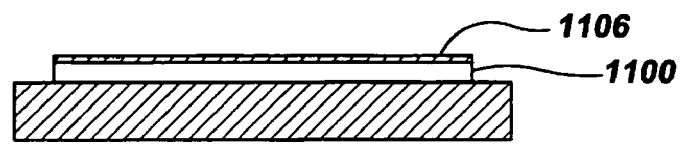
Figure 11D:
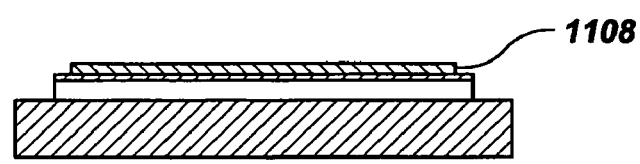
Figure 11E:
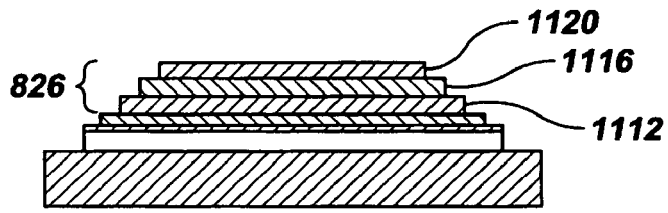
Figure 11F:
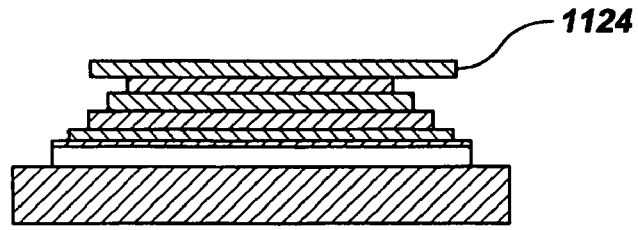
Figure 11G:
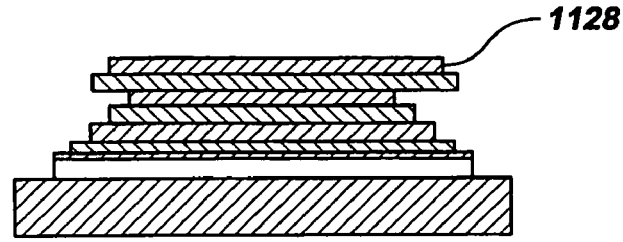
Figure 11H:
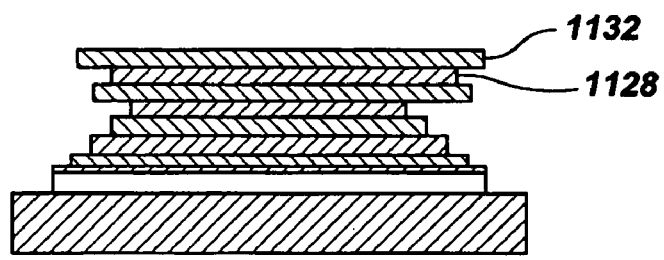

The recipe detailed in Example 2, above, may be further modified for displays that do not require a transparent TFT backplane. An exemplary modified recipe is as follows. It is noted that Step A-E of the following recipes are identical to Steps A-E revealed in each of Examples 1 and 2, above. FIGS. 11A-11V illustrate the following corresponding respective steps.

Figure 11I:
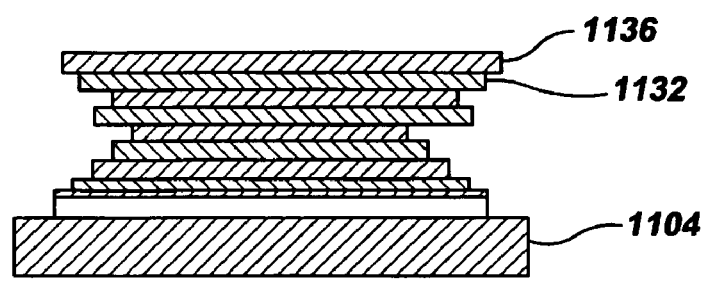
Figure 11J:
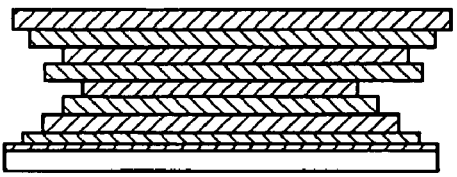
Figure 11K:
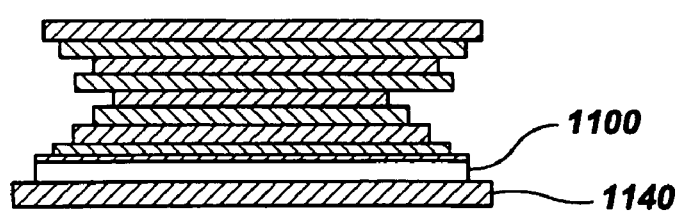
Figure 11L:
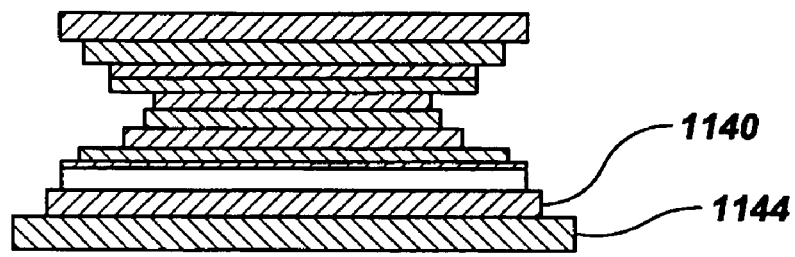
Figure 11M:
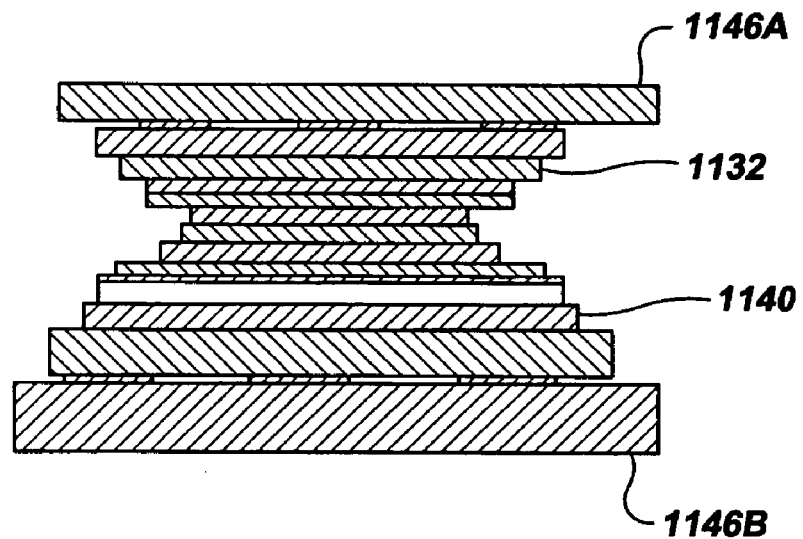
Figure 11N:
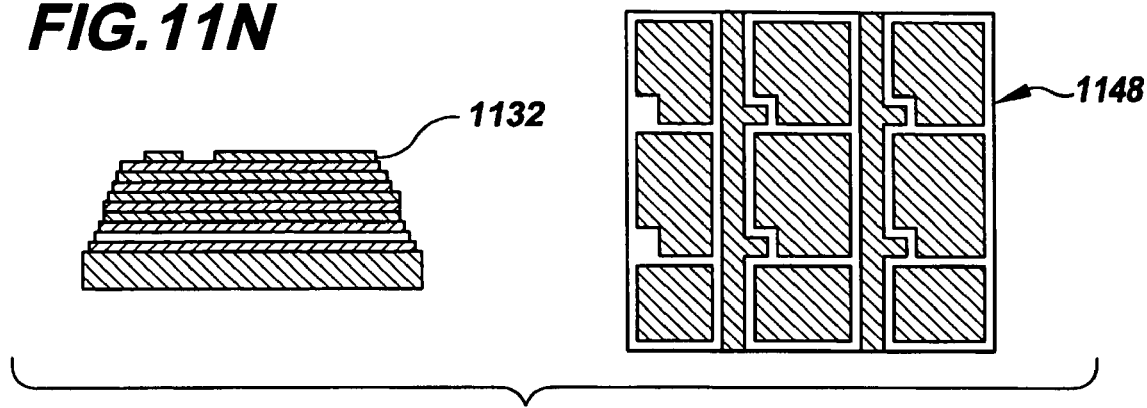
Figure 11N:
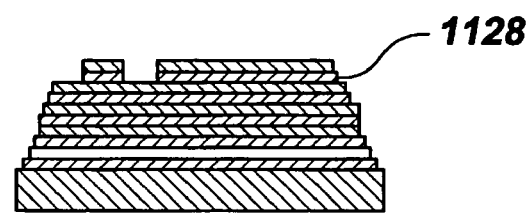
Figure 11N:
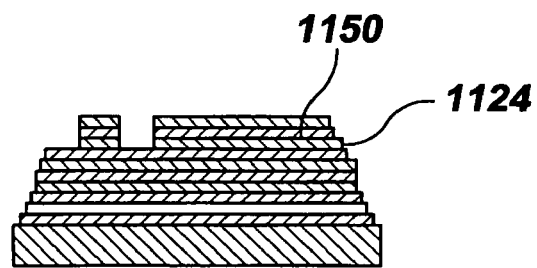

| | |
|---|---|
| Step A: | Choose an aluminum metallic foil having a thickness of less than about 20 microns as a temporary substrate 1100. |
| Step B: | Attach a stiffener 1104 to the backside of temporary substrate 1100. For example, stiffener 1104 may be a nickel, stainless steel or other metal foil having a thickness of about 100-200 microns. |
| Step C: | Electro-polish the exposed surface of aluminum foil temporary substrate 1100 so as to achieve a high degree of planarization on surface 1106. |
| Step D: | Deposit a gate metal layer 1108. Alternatively, aluminum foil temporary substrate 1100 may be alloyed and intrinsically used as a gate metal layer. |
| Step E: | Deposit a silicon nitride (SiNx) layer 1112 (coating), an amorphous hydrogenated silicon layer 1116 and an n+ doped amorphous silicon layer 1120 using PECVD, sequentially without breaking vacuum. The thickness of these materials can be varied, as is application specific. |
| Step F: | Deposit an ITO layer 1124, preferably without breaking vacuum utilized in Step E. |
| Step G: | Deposit source/drain (S/D) and metal interconnect layer 1128, preferably without breaking vacuum utilized in Steps F and G. |
| Step H: | Deposit resist layer 1132 on top of metal layer 1128. |
| Step I: | Laminate a protective, peelable (or water soluble, UV detachable, etc.) protective polymer sheet 1136 on free surface of resist layer 1132. |
| Step J: | Detach stiffener 1104 (FIG. 11I). |
| Step K: | Deposit a resist layer 1140 on the free surface of aluminum foil temporary substrate 1100. |
| Step L: | Laminate a protective, peelable (or water soluble, UV detachable, etc.) protective polymer sheet 1144 on free surface of resist layer 1140. |
| Step M: | Expose resist layers 1132, 1140 simultaneously using conventional contact lithography and binary masks 1146A-B. |
| Step N: | Develop resist layer 1132 so as to impart pattern 1148 shown. Note that pattern 1148 is identical to patterns 944, 1044 used in Examples 2 and 3, respectively. |
| Step O1: | Etch metal layer 1128 using wet etching or dry etching techniques. |
| Step O2: | Etch through ITO layer 1124 using dry or wet etching techniques so as to define the pixel electrodes 1150. |
| Step O3: | Etch n+ doped amorphous silicon layer 1120 (ohmic contact) by dry etching. (Typically, during this step the hydrogenated amorphous silicon layer 1116 is also partially etched). Metal layer 1128 acts as a mask to inhibit any etching of materials underneath it. |
| Step P: | Remove any remaining portions of resist layer 1132 (FIG. 11O3). |
| Step Q: | Optionally, deposit a passivation layer 1152, e.g., an SiNx or SiO₂. |
| Step R: | Secure a permanent substrate 1156 to passivation layer 1152, if provided, or to metal layer 1128, e.g., using an epoxy 1158. Epoxy 1158 can act as a passivation layer for metal layer 1128 if required. |
| Step S1: | Develop resist layer 1140 using the mask pattern 1160 shown. Note that mask pattern 1160 is identical to mask patterns 860, 952 used in Examples 1 and 2, respectively. FIG. S2 is an overlay 1172 illustrating (lower) pattern 1160 in proper registration with (upper) pattern 1148. Overlay 1172 shows four TFT regions 1176 each including a corresponding respective gate region 1180 and source/drain 1184 regions, with one of each of the source/drain regions of each TFT region being integral with pixel electrode region 1188. |
| Step T: | Etch the gate metal definition into metal layer 1108. Etch underlying SiNx insulating layer 1112, hydrogenated amorphous silicon layer 1116 and n+ doped amorphous silicon layer 1120 until the underside of ITO layer 1124 is reached. |
| Step U: | Deposit a passivation layer 1164 over gate metal layer 1108, if required. Pattern passivation layer 1164. |
| Step V: | Deposit/fill an electro-optical material 1168 over pixel electrodes 1150. |

Similar to Example 2, above, the recipe just outlined allows for the creation of opaque TFT backplanes. A driven pixel electrode design that uses a self-aligned and patterned ITO layer may be made using this recipe. Such a design may be used for TFT backplanes for reflective LCD, top emissive OLED/PLED, electrophoretics and electrochromic displays, among others. Since these types of displays do not use a backlight and, consequently, there is no light transmitted from the front side onto the hydrogenated amorphous silicon layer 1116 underneath the drain metal segments, there is no issue with photo-induced leakage current problems with the TFTs.

The configuration of a circuitry sheet made using this recipe, such as circuitry sheet 1172 of FIG. 11X, can use a storage-capacitor-on-gate design, or, alternatively, an independent storage capacitor can be made with metal or ITO deposition. This capacitor (not shown) may be deposited after the passivation Step Q, and before securing permanent substrate 1156. Alternatively, the capacitor may be deposited after the depositing and patterning passivation layer 1164.

Example 5

Figure 12:
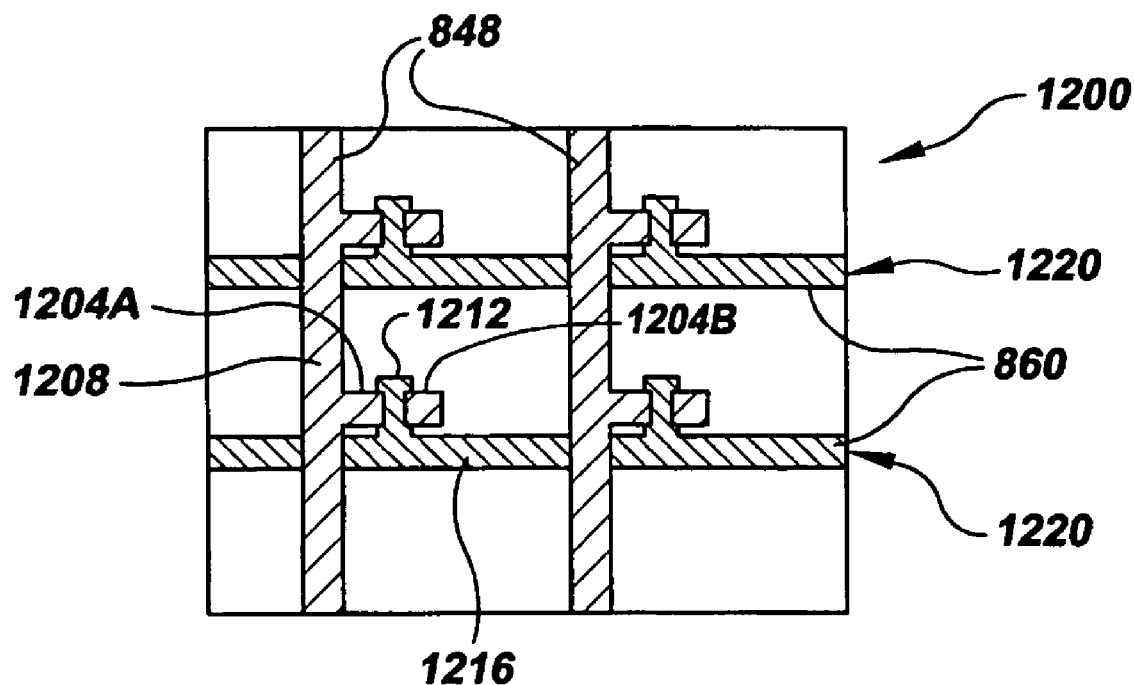
FIG. 12 is a plan view of an overlay of the mask patterns of FIGS. 8M and 8Q2.
Figure 13A:
FIGS. 13A-13AB contain partial cross-sectional views of layered structures formed during various steps of the particular recipe of Example 5 for the EDM method of FIGS. 2A-B.
Figure 13B:
Figure 13C:
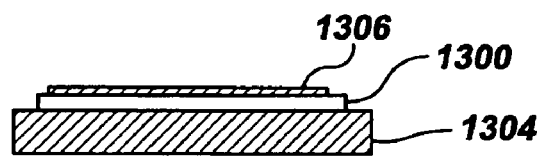
Figure 13D:
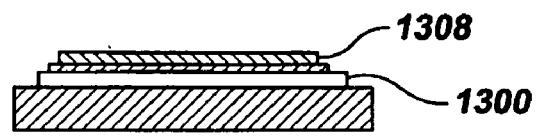
Figure 13E:
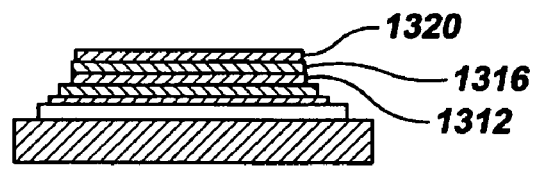
Figure 13F:
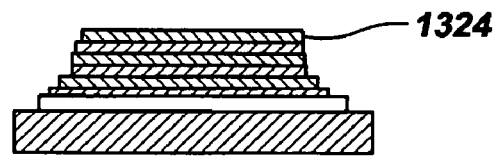
Figure 13G:
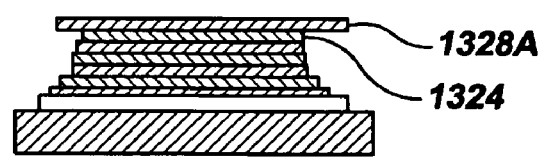
Figure 13H:
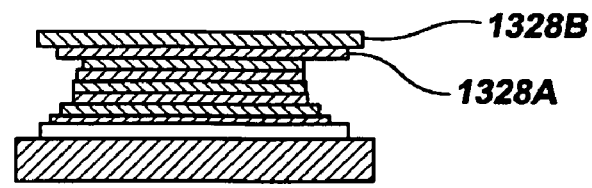

One potential shortcoming with a TFT backplane made using the recipe of Example 1 is the possible presence of an unetched layer of hydrogenated amorphous silicon under the gate metal lines. Since hydrogenated amorphous silicon is a photoconductive material, if such a TFT backplane is utilized in a transmission system having a backlight, as would be the case, e.g., in a backlight illuminated transmission LCD display, it could pose anomalous switching problems and leakage currents within the TFT switch. In this connection, FIG. 12 shows an overlay 1200 of the mask patterns 848, 860 of Example 1 (FIGS. 8M and 8Q2). In overlay 1200, mask pattern 848 defines source/drain regions 1204A-B and data bus lines 1208, and mask pattern 860 defines gate metal regions 1212 and gate bus lines 1216. Overlay 1200 highlights the regions 1220 under the gate bus lines 1216 that may not get entirely etched. The following recipe detailed in Example 5 depicts a methodology that can conveniently eliminate this problem. FIGS. 13A-13AB illustrate the following corresponding respective steps.

Figure 13I:
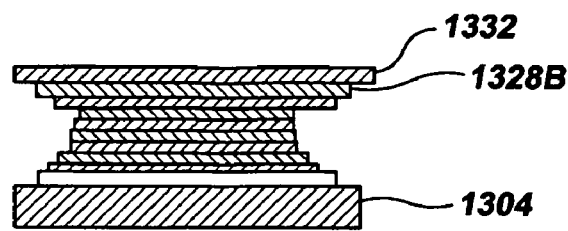
Figure 13J:
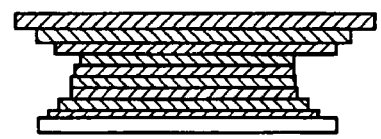
Figure 13K:
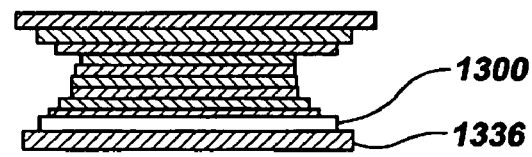
Figure 13L:
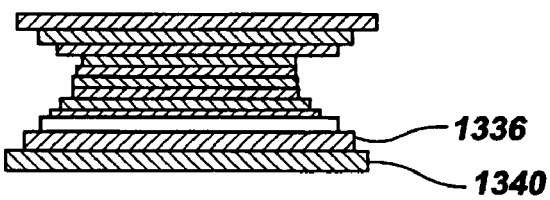
Figure 13M:
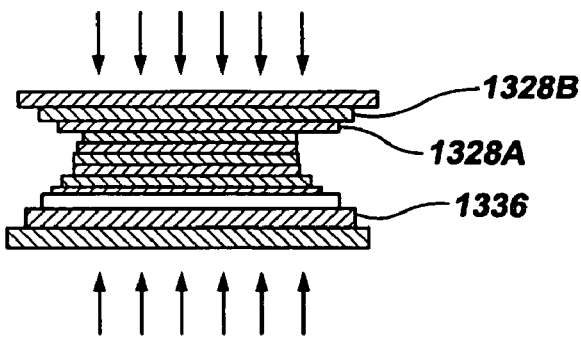
Figure 13N:
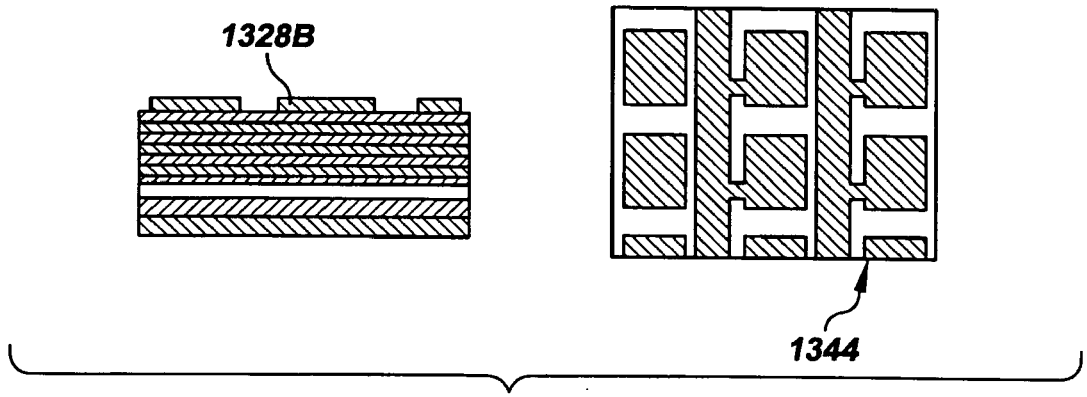
Figure 13N:
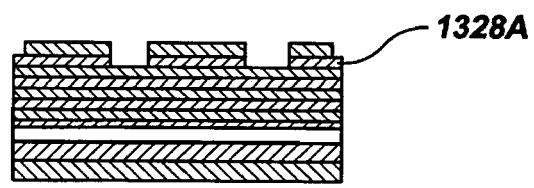
Figure 13N:
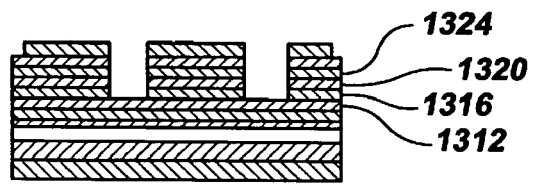
Figure 13P:
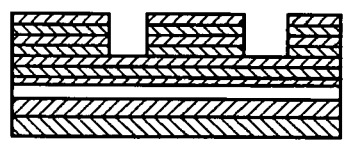
Figure 13Q:
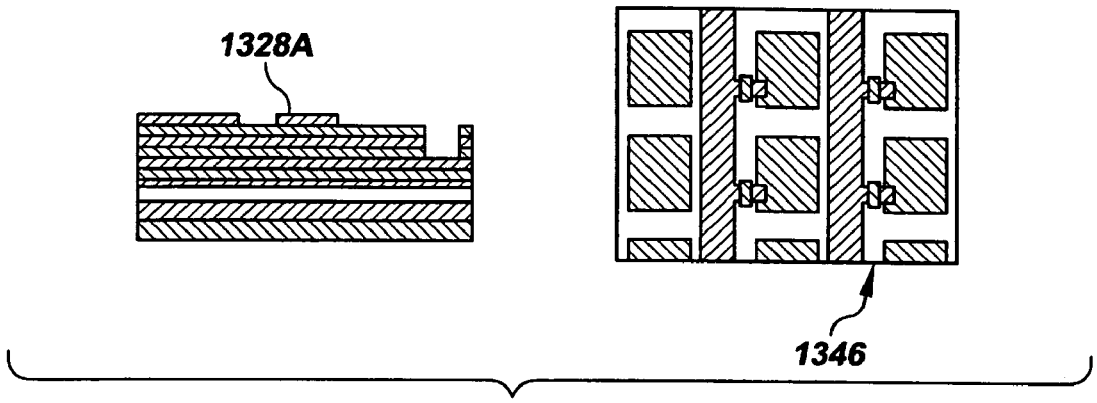
Figure 13R:
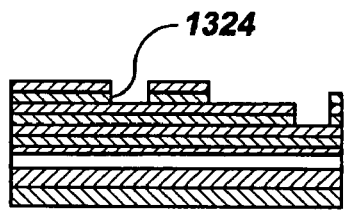
Figure 13S:
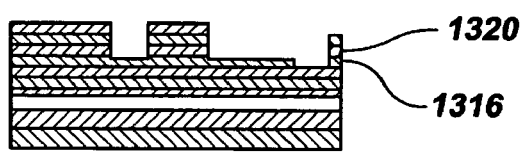
Figure 13T:
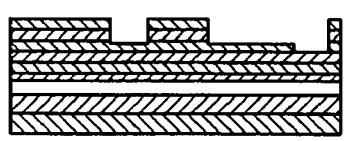
Figure 13U:
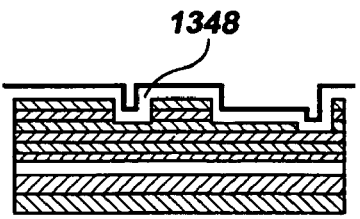
Figure 13V:
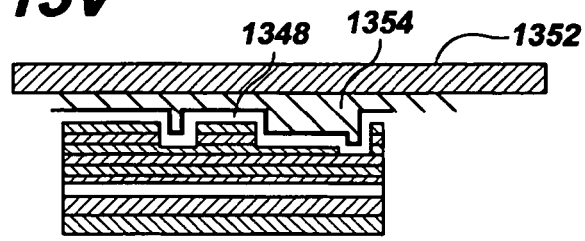
Figure 13V:
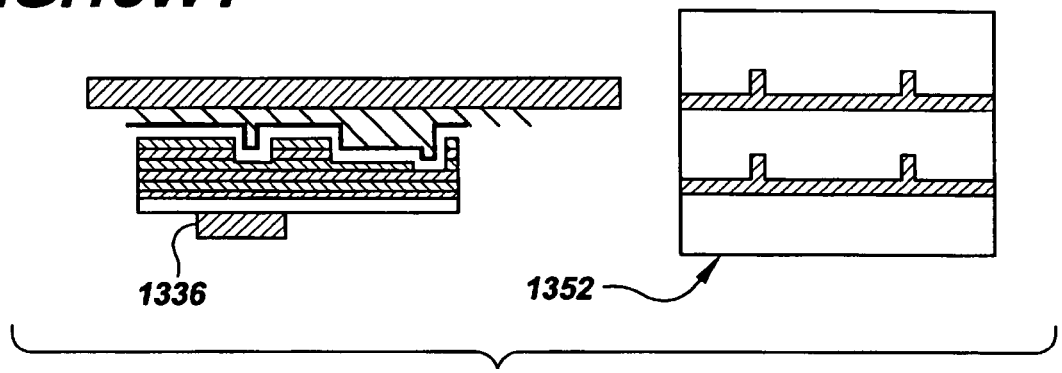
Figure 13V:
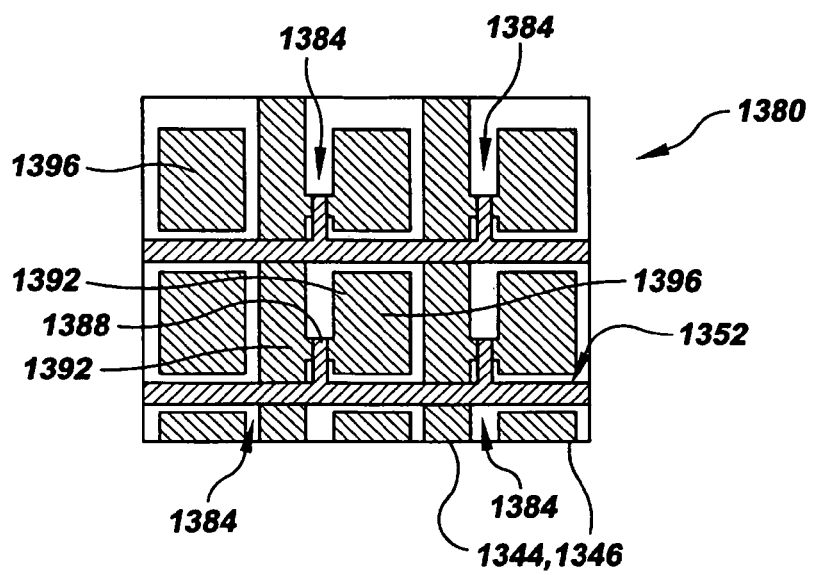
Figure 13X:
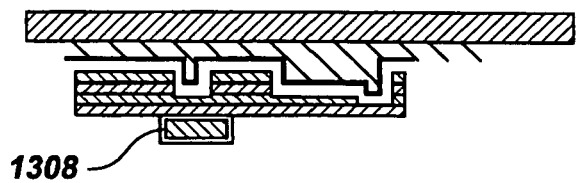
Figure 13Y:
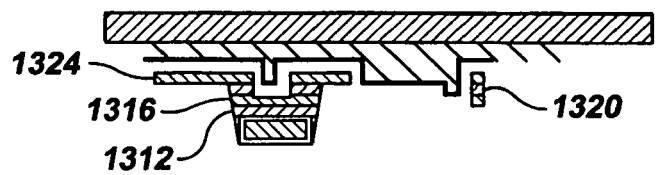
Figure 13Z:
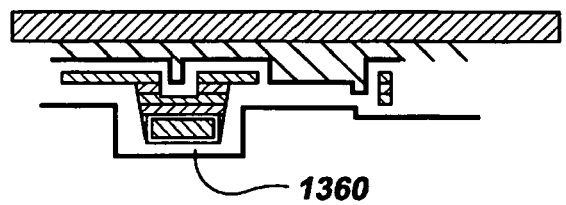
Figure 13A:
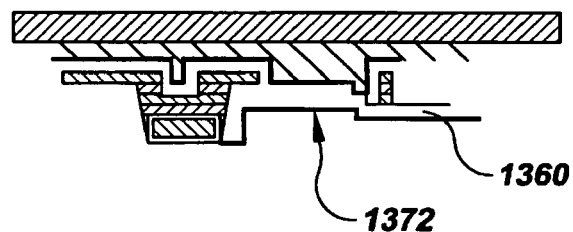
Figure 13A:
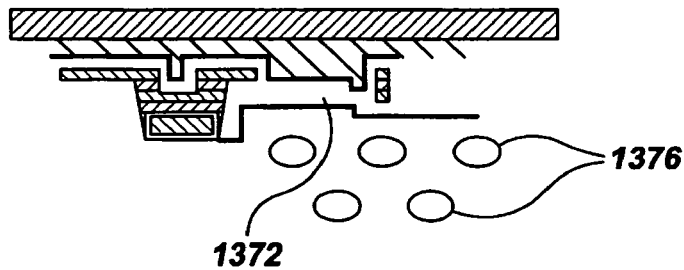

| Step A: | Choose an aluminum metallic foil having a thickness of less than about 20 microns as a temporary substrate 1300. |
|---|---|
| Step B: | Attach a stiffener 1304 to the backside of temporary substrate 1300. For example, stiffener 1304 may be a nickel, stainless steel or other metal foil having a thickness of about 100-200 microns. |
| Step C: | Electro-polish the exposed surface of aluminum foil temporary substrate 1300 so as to achieve a high degree of planarization on surface 1306. |
| Step D: | Deposit a gate metal layer 1308. Alternatively, aluminum foil temporary substrate 1300 may be alloyed and intrinsically used as a gate metal layer. |
| Step E: | Deposit a silicon nitride (SiNx) layer 1312 (coating), an amorphous hydrogenated silicon layer 1316 and an n+ doped amorphous silicon layer 1320 using PECVD, sequentially without breaking vacuum. The thickness of these materials can be varied according to the specific application. |
| Step F: | Deposit source/drain (S/D) and metal interconnect layer 1324, preferably without breaking vacuum utilized in Step E. |
| Step G: | Deposit resist layer coating 1328A over metal layer 1324. |
| Step H: | Deposit resist layer coating 1328B onto resist layer coating 1328A. |
| Step I: | Laminate a protective, peelable (or water soluble, UV detachable, etc.) protective polymer sheet 1332 on free surface of resist layer coating 1328B. |
| Step J: | Detach stiffener 1304 (FIG. 13I). |
| Step K: | Deposit a resist layer 1336 on the free surface of temporary substrate 1300. |
| Step L: | Laminate a protective, peelable (or water soluble, UV detachable, etc.) protective polymer sheet 1340 on free surface of resist layer 1336. |
| Step M: | Expose resist layer coatings 1328A-B and resist layer 1336 simultaneously using a dual-wavelength maskless lithography/direct laser writing lithography. Note that resist layer coating 1328A differs in composition or spectral response from resist layer coating 1328B. Also, resist layer coating 1328B is reasonably transparent to the wavelength (be it λ1 or λ2 in FIG. 7) that will be absorbed by resist layer coating 1328A. Resist layer 1336 may be identical in composition or spectral response to resist layer coating 1328A or resist layer coating 1328B. |
| Step N: | Develop resist layer coating 1328B. Note the imparted pattern 1344 of this coating. |
| Step O1: | Etch resist layer coating 1328A as shown using wet etching or dry etching techniques. |
| Step O2: | Etch metal layer 1324, n+ doped amorphous silicon layer 1320 and hydrogenated amorphous silicon layer 1316 all the way down to the top of silicon nitride layer 1312. (This step ends up removing photoconductive amorphous silicon layer 1316 under the gate bus lines.) |
| Step P: | Remove any remaining portions of resist layer coating 1328B (FIG. 13O2). |
| Step Q: | Develop resist layer coating 1328A. Note that black exposed regions of pattern 1346 will be left behind, and the hatched regions will be removed during this developing stage. |
| Step R: | Etch metal layer 1324 to define S/D and metal interconnect regions. |
| Step S: | Etch n+ doped amorphous silicon layer 1320 and partially into hydrogenated amorphous silicon layer 1316. |
| Step T: | Remove any remaining portions of resist layer coating 1328A (FIG. 13S). |
| Step U: | Optionally, deposit a passivation layer 1348, e.g., an SiNx or SiO$_2$ layer. |
| Step V: | Secure a permanent substrate 1352 to passivation layer 1348, if provided, or to metal layer 1324, e.g., using an epoxy 1354. Epoxy 1354 can act as a passivation layer for metal layer 1324 if required. |
| Step W1: | Develop resist layer 1336 using mask pattern 1352. Note that imparted pattern 1356 is identical to pattern 860 used in Example 1 (FIG. 8Q2). FIG. W2 is an overlay 1380 illustrating (lower) pattern 1352 in proper registration with (upper) patterns 1344, 1346. Overlay 1380 shows four TFT regions 1384 each including a corresponding respective gate region 1388 and source/drain 1392 regions, with one of each of the source/drain regions of each TFT region being integral with pixel electrode region 1396. |
| Step X: | Etch gate metal definition into metal layer 1308. |
| Step Y: | Etch underlying SiNx insulator layer 1312, hydrogenated amorphous silicon layer 1316 and n+ doped amorphous sili- |

-continued

| | con layer 1320 until the underside of the S/D and electrode pixel metal layer 1324 is reached. |
|---|---|
| Step Z: | Deposit an ITO layer 1360 over gate metal layer 1308. |
| Step AA: | Pattern ITO layer 1360 so as to define pixel electrodes 1372. |
| Step AB: | Deposit/fill an electro-optical material 1376 on top of the pixel electrodes 1372. |

Regarding Example 5, the following points are noted:

1. Aluminum has a melting point of >650° C. and will easily withstand the PECVD deposition temperature typically used in conventional display manufacturing (<450° C.).
2. In lieu of aluminum foil being used for temporary substrate 1300, as already described in an earlier section of this disclosure, very thin nickel or polyimide sheets may be used.
3. All patterning of the most critical layers of TFT was effectively performed at one time. Note that device layers 1312, 1316, 1320, 1324 may be deposited in reverse order (upside down stack) and still yield the same results. That is, deposit S/D metal layer 1324 first, n+ doped silicon layer 1320 second, hydrogenated amorphous silicon layer 1316 third and silicon nitride layer 1312 fourth, and then gate metal layer 1308. Of course, the mask positions will need to be reversed as well.
4. It is also apparent that projection/proximity/contact lithography using a color mask or gray scale mask could readily be substituted for the maskless technique shown.
5. This recipe utilizes a two-coating resist layer 1328 on one surface and one-coating resist layer 1336 on the other surface. The ITO pixel electrodes 1372 can be patterned and etched readily and only requires coarse photolithography registration.
6. Note that electro-optical material 1376 for the front plane (e.g., liquid crystal, OLED/PLED material, electrophoretic material, electrochromic material, etc.) will be on ITO layer 1360.
7. This configuration can use a storage-capacitor-on-gate design, or, alternatively, an independent storage capacitor can be made with metal or ITO deposition. This capacitor (not shown) may be deposited after the passivation Step P, and before securing permanent substrate 1352.
8. Resist layer 1336 could have been developed first, and subsequently etched and laminated to permanent substrate 1348. After this, resist layer coatings 1328B, 1328A could have been developed and the corresponding layers etched. In this case, ITO layer 1356 and electro-optical material 1364 would end up on the top surface in a manner similar to conventional designs.
9. The recipe of Example 5 allows for a TFT backplane that can be used in a transmissive LCD and bottom emitting OLED/PLED displays without any issues with photo induced leakage currents in the TFTs. Of course, however, this recipe can produce a universally applicable backplane and may also be used for reflective LCD, front emissive OLED/PLED, electrophoretics and electrochromic displays, among others.
10. Basically, a trench defining the pixel region is created using resist layer coating 1328B as a mask, and then the etch-back region between the source and drain is defined and created using resist layer coating 1328A as a mask. Passivation layer 1344 fills in this trench and the source/drain region and creates a defining wall within which the pixel region lies. An ITO or other transparent conductive electrode material may be deposited in the trench, potentially removing the need for patterning such layer entirely.
11. The presence of a trench may be especially helpful when using a conductive nanotube paste, which can be ink jet printed into the pixel regions without any further need for patterning.
12. It is apparent that using more than resist coating per surface provides additional degrees of freedom in manipulating the TFT pattern.
13. Additional examples include the use of two resist layer coatings one surface and an additional two resist layer coatings on the other surface such that a black matrix may be integrated surrounding the pixel electrode region.
14. Antenna elements can be constructed for RFID tags simultaneously with TFT elements.
15. PIN sensors for x-ray digital imaging sheets may be constructed using the recipe of Example 5. In fact, the PIN coatings (p-doped silicon and n-doped silicon) may be deposited after source/drain metal layer 1324 and then isolated with one resist layer, with the other resist layers on the other side used to create the TFTs.

Example 6

Figure 14A:
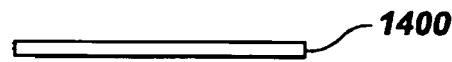
FIGS. 14A-14AD contain partial cross-sectional views of layered structures formed during various steps of the particular recipe of Example 6 for the EDM method of FIGS. 2A-B.
Figure 14B:
Figure 14C:
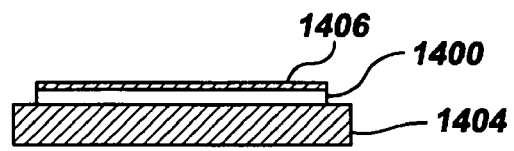
Figure 14D:
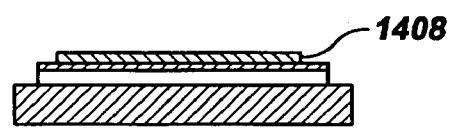
Figure 14E:
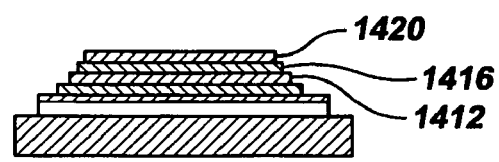
Figure 14F:
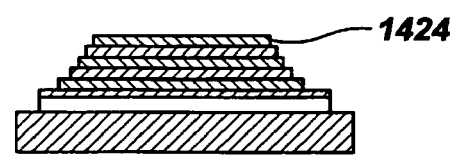
Figure 14G:
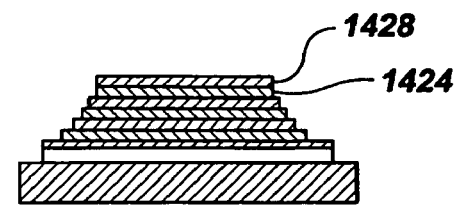
Figure 14H:
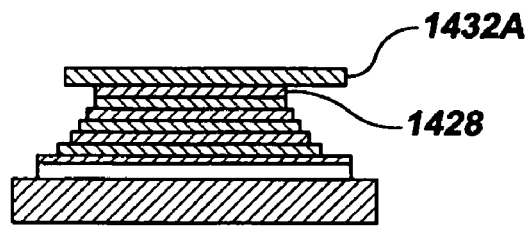
Figure 14I:
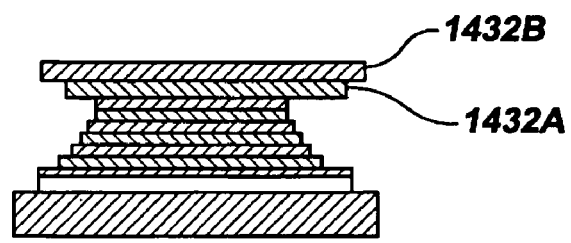

The recipe of this example is a variation on the recipe of Example 5. In this case, instead of a two-coating resist layer being used on one side and a single-coating resist layer being used on the other, two-coating resist layers are used on each side. This allows realization of patterned ITO pixel electrodes on one side while locating the permanent substrate on the other side. The recipe is as follows. FIGS. 14A-14AD illustrate the following corresponding respective steps.

Figure 14J:
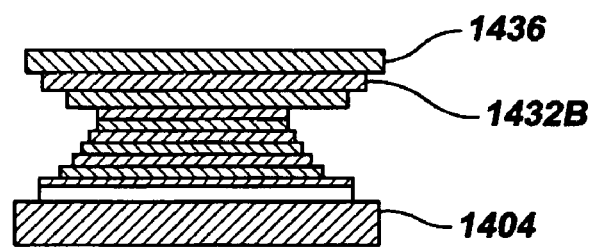
Figure 14K:
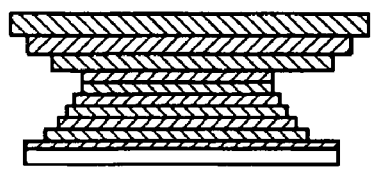
Figure 14L:
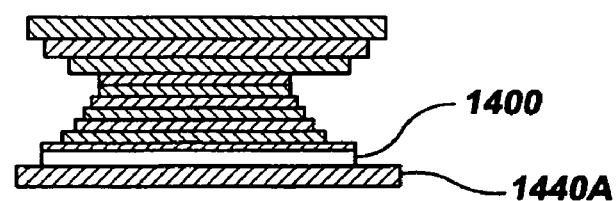
Figure 14M:
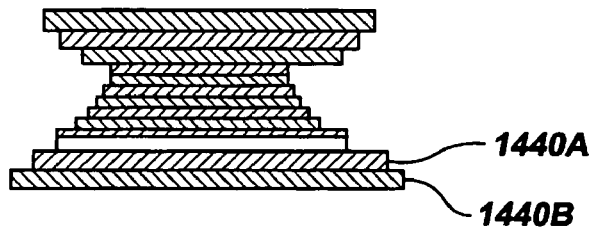
Figure 14N:
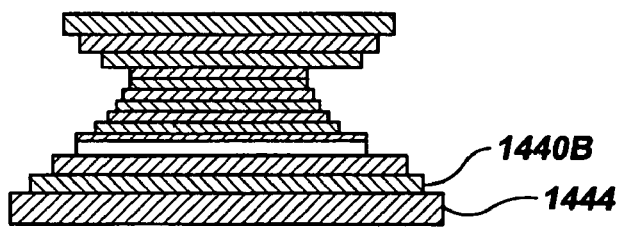
Figure 14O:
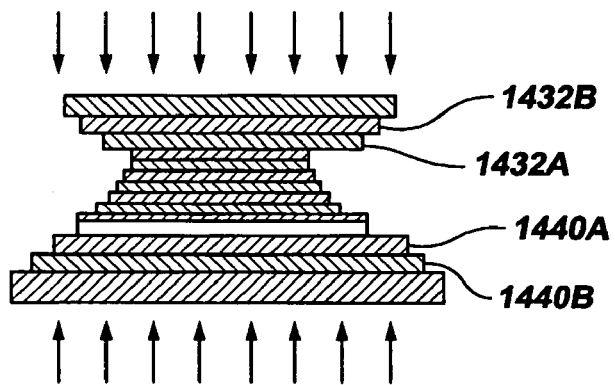
Figure 14P:
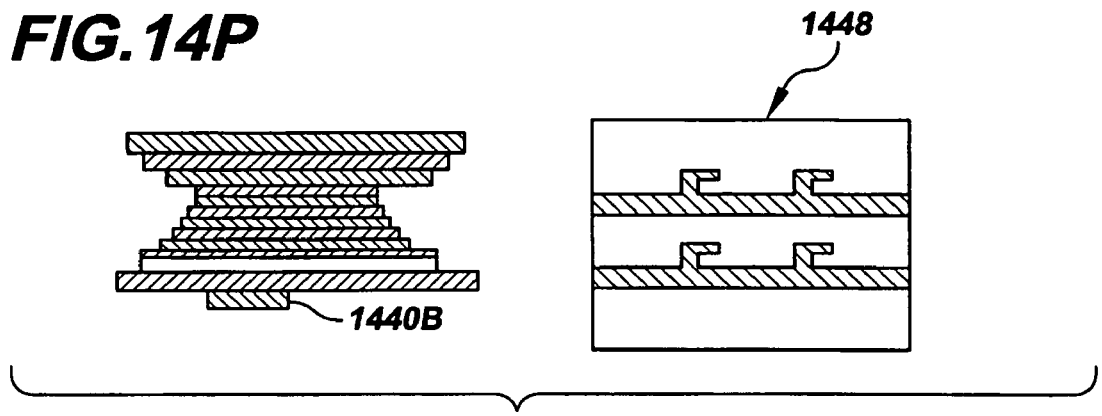
Figure 14Q:
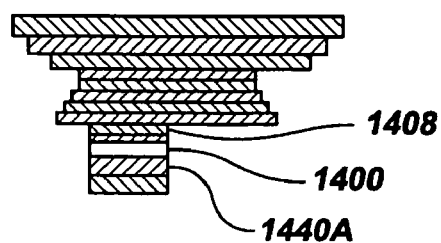

| | |
|---|---|
| Step A: | Choose an aluminum metallic foil having a thickness of less than about 20 microns as a temporary substrate 1400. |
| Step B: | Attach a stiffener 1404 to the backside of temporary substrate 1400. For example, stiffener 1404 may be a nickel, stainless steel or other metal foil having a thickness of about 100-200 microns. |
| Step C: | Electro-polish the exposed surface of aluminum foil temporary substrate 1400 so as to achieve a high degree of planarization of surface 1406. |
| Step D: | Deposit a gate metal layer 1408. Alternatively, aluminum foil temporary substrate 1400 may be alloyed and intrinsically used as a gate metal layer. |
| Step E: | Deposit a silicon nitride (SiNx) layer 1412 (coating), an amorphous hydrogenated silicon layer 1416 and an n+ doped amorphous silicon layer 1420 using PECVD, sequentially without breaking vacuum. The thickness of these materials can be varied, as is application specific. |
| Step F: | Deposit source/drain (S/D) and metal interconnect layer 1424, preferably without breaking vacuum utilized in Step E. |
| Step G: | Deposit an ITO layer 1428 onto metal layer 1424. |
| Step H: | Deposit a resist layer coating 1432A onto ITO layer 1428. |
| Step I: | Deposit a resist layer coating 1432B onto resist layer coating 1432A. |
| Step J: | Laminate a protective, peelable (or water soluble, UV detachable, etc.) protective polymer sheet 1436 on free surface of resist layer coating 1432B. |
| Step K: | Detach stiffener 1404 (FIG. 14J). |
| Step L: | Deposit resist layer coating 1440A on the free surface of aluminum foil temporary substrate 1400. |
| Step M: | Deposit resist layer coating 1440B onto resist layer coating 1440A. |
| Step N: | Laminate a protective, peelable (or water soluble, UV detachable, etc.) protective polymer sheet 1444 on the free surface of resist layer coating 1440B. |

-continued

Figure 14R:
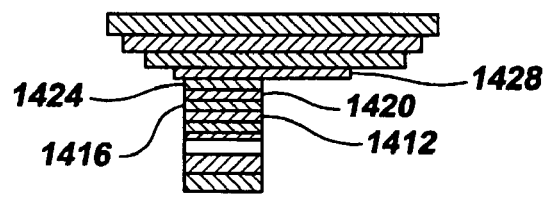
Figure 14S:
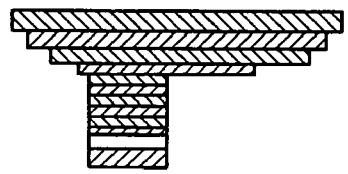
Figure 14T:
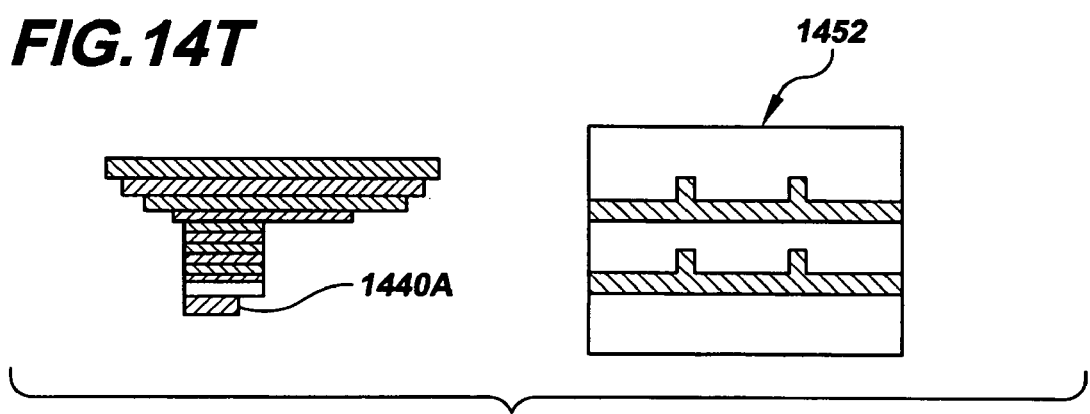
Figure 14U:
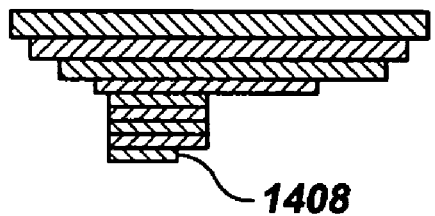
Figure 14V:
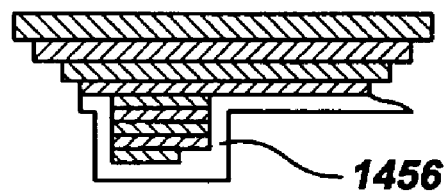
Figure 14W:
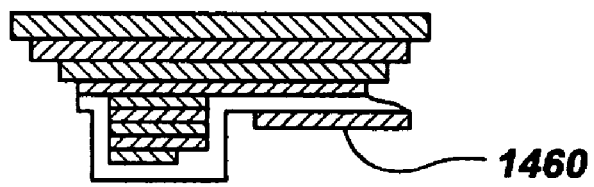
Figure 14X:
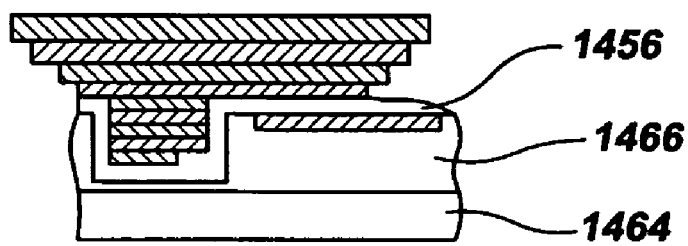
Figure 14Y:
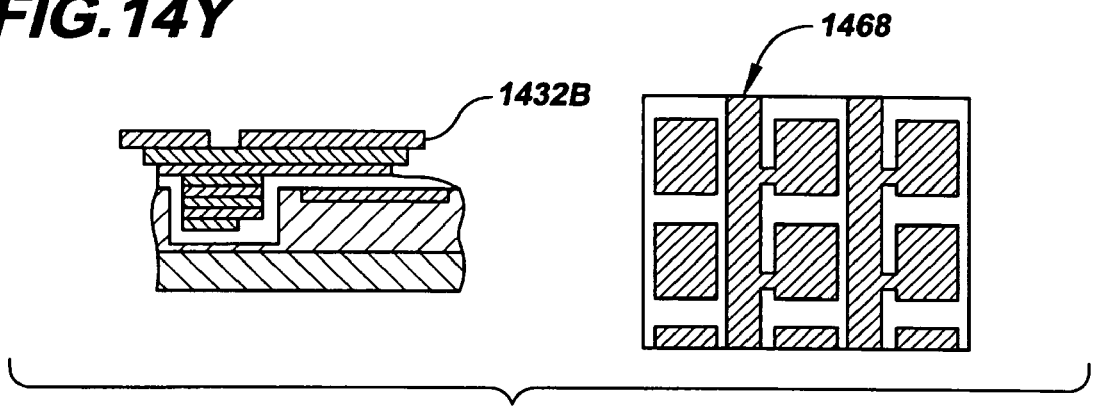
Figure 14Y:
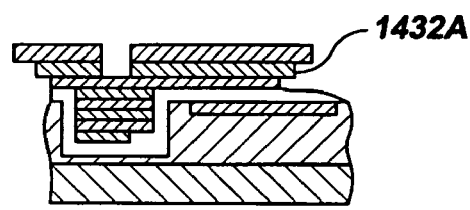
Figure 14Y:
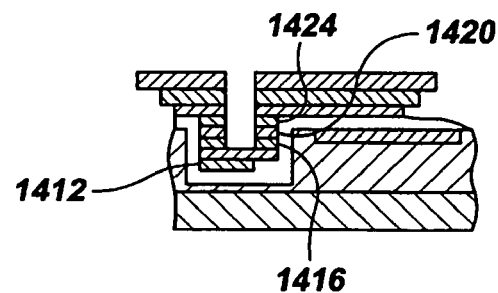
Figure 14A:
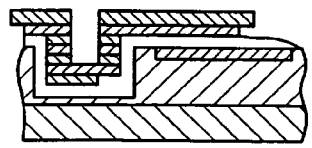
Figure 14A:
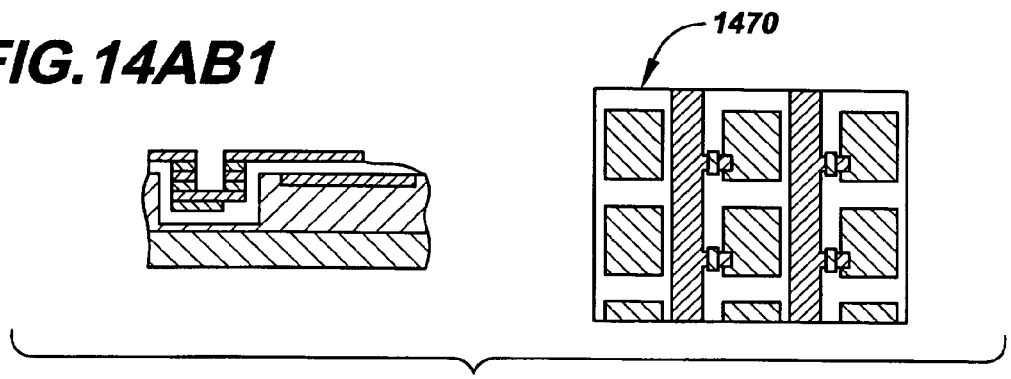
Figure 14A:
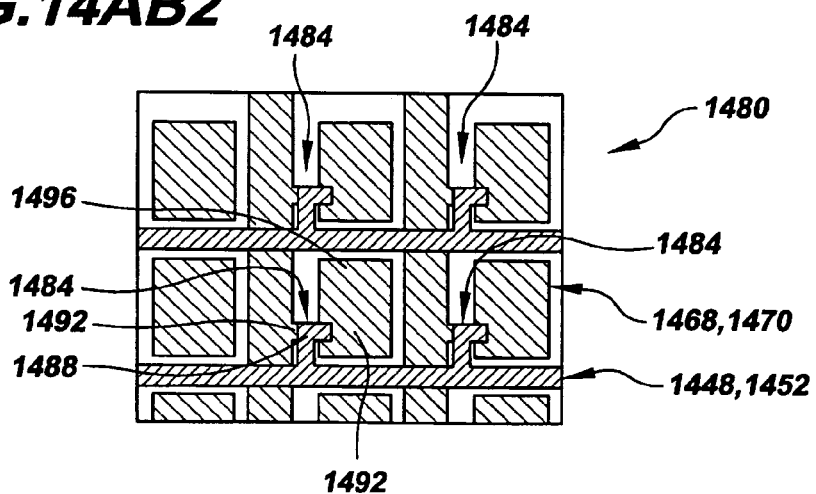
Figure 14A:
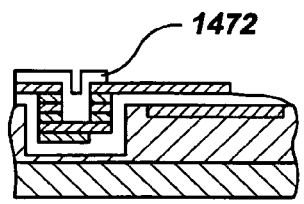
Figure 14A:
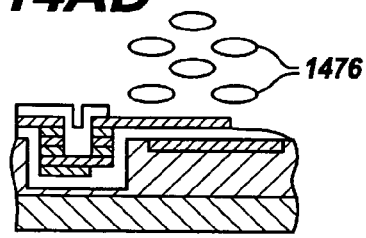

| | |
|---|---|
| Step O: | Expose all resist layer coatings 1432A-B, 1440A-B simultaneously using dual wavelength maskless lithography/direct laser writing lithography (see FIG. 7). Note that each of resist layer coatings 1432B, 1440B differs in composition or spectral response from corresponding respective underlying resist layer coatings 1432A, 1440A. Also, each of resist layer coatings 1432B, 1440B is reasonably transparent to the wavelength (be it $\lambda 1$ or $\lambda 2$ in FIG. 7) that will be absorbed by corresponding respective underlying resist layer coatings 1432A, 1440A. Resist coating layer 1432A may be identical to resist coating layer 1440A, and resist layer coating 1432B may be equal to resist layer coating 144GB. |
| Step P: | Develop resist layer coating 1440B. Note imparted pattern 1448. |
| Step Q: | Etch resist layer coating 1440A and gate metal layer 1408. |
| Step R: | Etch underlying SiNx insulator layer 1412, hydrogenated amorphous silicon layer 1416, n+ doped amorphous silicon layer 1420 and S/D metal layer 1424 until the underside of ITO layer 1428 is reached. |
| Step S: | Remove any remaining portions of resist layer coating 1440B (FIG. 14R). |
| Step T: | Develop resist layer coating 1440A. Note imparted pattern 1452. |
| Step U: | Etch the gate metal definition into metal layer 1408. |
| Step V: | Deposit a passivation layer 1456. |
| Step W: | Deposit a pixel capacitor 1460 (opaque or transparent) and pattern, if required. |
| Step X: | Secure a permanent substrate 1464 to passivation layer 1456, if provided, e.g., using an epoxy 1466. Epoxy 1466 can act as a passivation layer for gate metal layer 1408 if required. |
| Step Y: | Develop resist layer coating 1432B. Note imparted pattern 1468. |
| Step Z1: | Etch resist layer coating 1432A as shown using wet etching or dry etching techniques. |
| Step Z2: | Etch metal layer 1424, n+ doped amorphous silicon layer 1420 and hydrogenated amorphous silicon layer 1416 all the way down to silicon nitride layer 1412. (This step ends up removing photoconductive amorphous silicon layer 1416 under the gate bus lines.) |
| Step AA: | Remove any remaining portions of resist layer coating 1432B (FIG. Z2). |
| Step AB1: | Develop resist layer coating 1432A. Note the black exposed regions of imparted pattern 1470 will be left behind, and the hatched regions will be removed during this developing stage. FIG. 14AB2 is an overlay 1480 illustrating (lower) patterns 1468, 1470 in proper registration with (upper) patterns 1448, 1452. Overlay 1480 shows four TFT regions 1484 each including a corresponding respective gate region 1488 and source/drain 1492 regions, with one of each of the source/drain regions of each TFT region being integral with pixel electrode region 1496. Etch metal layer 1424 to define S/D and metal interconnect regions. Note that this etching does not occur at the section shown in the drawings. See overlay of FIG. AB2 for regions etched. Etch n+ doped amorphous silicon layer 1420 and partially into hydrogenated amorphous silicon layer 1416. Remove any remaining portions of resist layer coating 1432A (FIG. AB1). |
| Step AC: | Deposit and pattern a passivation layer 1472, e.g., an SiNx or $SiO_2$ layer. |
| Step AD: | Deposit/fill an electro-optical material 1476 over pixel electrode layer 1428. |

The recipe of Example 6 allows for a TFT backplane that can be used in a transmissive LCD and bottom emitting OLED/PLED displays without any issues with photo induced leakage currents in the TFTs. Of course, however, this recipe can produce a universally applicable backplane and may also be used for reflective LCD, front emissive OLED/PLED, electrophoretics and electrochromic displays, among others.

Examples 7-12

Examples 1-6 above have detailed recipes using hydrogenated amorphous silicon. It will be appreciated by those skilled in the art that high temperature polysilicon or re-crystallized silicon may be substituted for the amorphous silicon. It is known that as-deposited polysilicon suffers from high surface roughness, which has restricted its use for TFTs. High interfacial trap densities, leakage current issues and other surface anomalies on insulator layers deposited on such rough silicon layers have been identified as problematic issues. In a recent experiment using as deposited high temperature polysilicon, the present inventor observed that the top surface of the deposited polysilicon layer was indeed very rough and scattered visible radiation. However, when the underside of that same layer was examined, it revealed a highly polished surface. This surface was visually very polished, which optically indicates a very low surface roughness.

Consequently, Examples 7-12 are derived from corresponding respective Examples 1-6. In Examples 7-12, instead of depositing a hydrogenated amorphous silicon layer on the silicon nitride layer, a polysilicon layer is deposited on the silicon nitride layer. Clearly, the polysilicon can be deposited directly onto the silicon nitride layer, thereby completely circumventing the issues that have restricted use of as-deposited polysilicon for TFTs to date. In this case, the TFT-forming active layers, i.e., the metal gate later, the insulator layer, and the polysilicon layer, can be readily optimized for their properties. It will also be appreciated by those skilled in the art that other recrystallization techniques and other TFT structures, such as top gate structures, may be readily implemented using EDM method 200 (FIGS. 2A-B).

Example 13

Figure 15A:
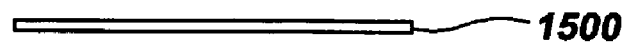
FIGS. 15A-15AH contain partial cross-sectional views of layered structures formed during various steps of the particular recipe of Example 13 for the EDM method of FIGS. 2A-B.
Figure 15B:
Figure 15C:
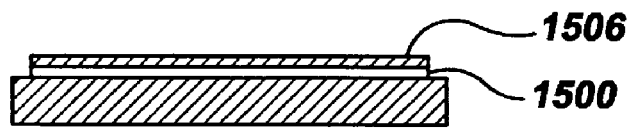
Figure 15D:
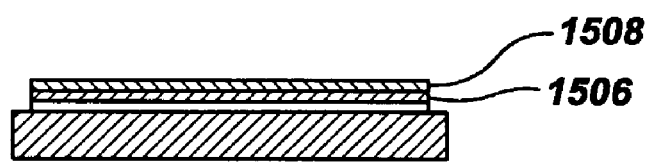
Figure 15E:
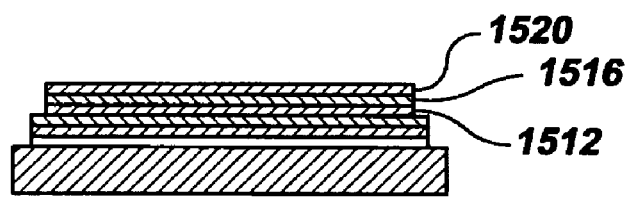
Figure 15F:
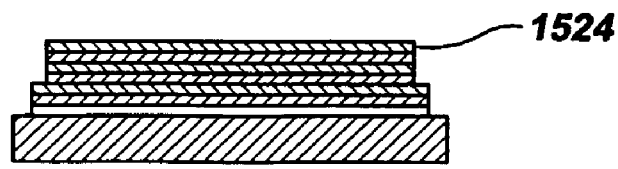
Figure 15G:
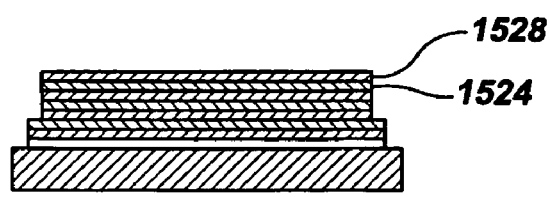

Like the recipe of Example 6 above, the recipe of Example 13 utilizes a two-coating resist layer on one side and a two-coating resist layer on the other side. In this case, the use of these four resist layer coatings allows for the realization of patterned ITO pixel electrodes on one surface with a permanent substrate being secured to the other surface. The recipe is as follows. FIGS. 15A-15AI illustrate the following corresponding respective steps.

| | |
|---|---|
| Step A: | Choose an aluminum metallic foil having a thickness of less than about 20 microns as a temporary substrate 1500. |
| Step B: | Attach a stiffener 1504 to the backside of temporary substrate 1500. For example, stiffener 1504 may be a nickel, stainless steel or other metal foil having a thickness of about 100-200 microns. |
| Step C: | Electro-polish the exposed surface of aluminum foil temporary substrate 1500 so as to achieve a high degree of planarization on surface 1506. |
| Step D: | Deposit a gate metal layer 1508. Alternatively, aluminum foil temporary substrate 1500 may be alloyed and intrinsically used as a gate metal layer. |
| Step E: | Deposit a silicon nitride (SiNx) layer 1512 (coating), an amorphous hydrogenated silicon layer 1516, and an n+ doped amorphous silicon layer 1520 using PECVD, sequentially without breaking vacuum. The thickness of these materials can be varied, as is application specific. |
| Step F: | Deposit source/drain (S/D) and metal interconnect layer 1524, preferably without breaking vacuum utilized in Step E. |
| Step G: | Deposit an ITO layer 1528 onto metal layer 1524. |
| Step H: | Deposit a passivation layer 1532 onto ITO layer 1528. (This layer maybe inorganic or organic. Alternatively, the resist applied in the next step might function as not only the imaging layer but also as a passivation layer.) |
| Step I: | Deposit a resist layer coating 1536A onto passivation layer 1532. |
| Step J: | Deposit a resist layer coating 1536B onto resist layer coating 1536A. |

Figure 15H:
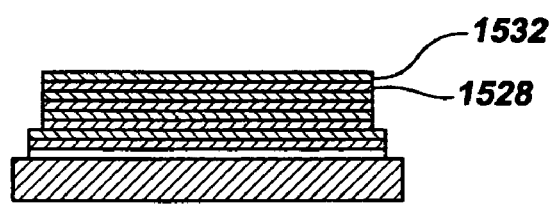
Figure 15I:
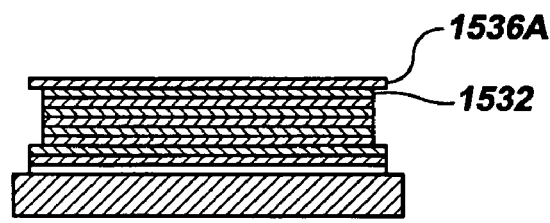
Figure 15J:
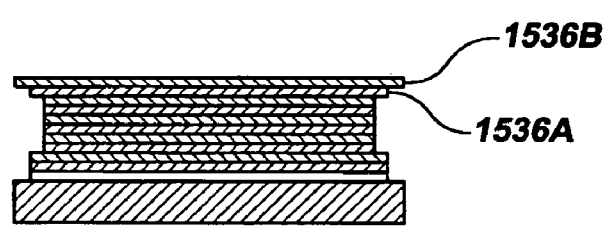
Figure 15K:
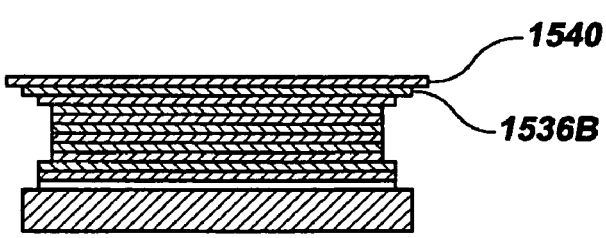
Figure 15L:
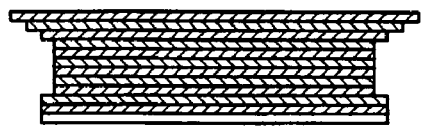
Figure 15M:
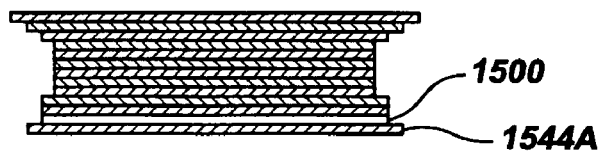
Figure 15N:
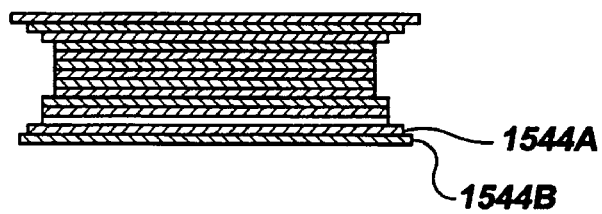
Figure 15O:
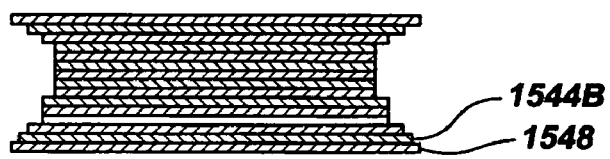
Figure 15P:
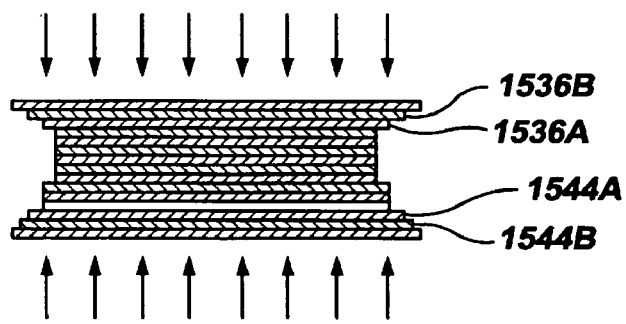
Figure 15Q:
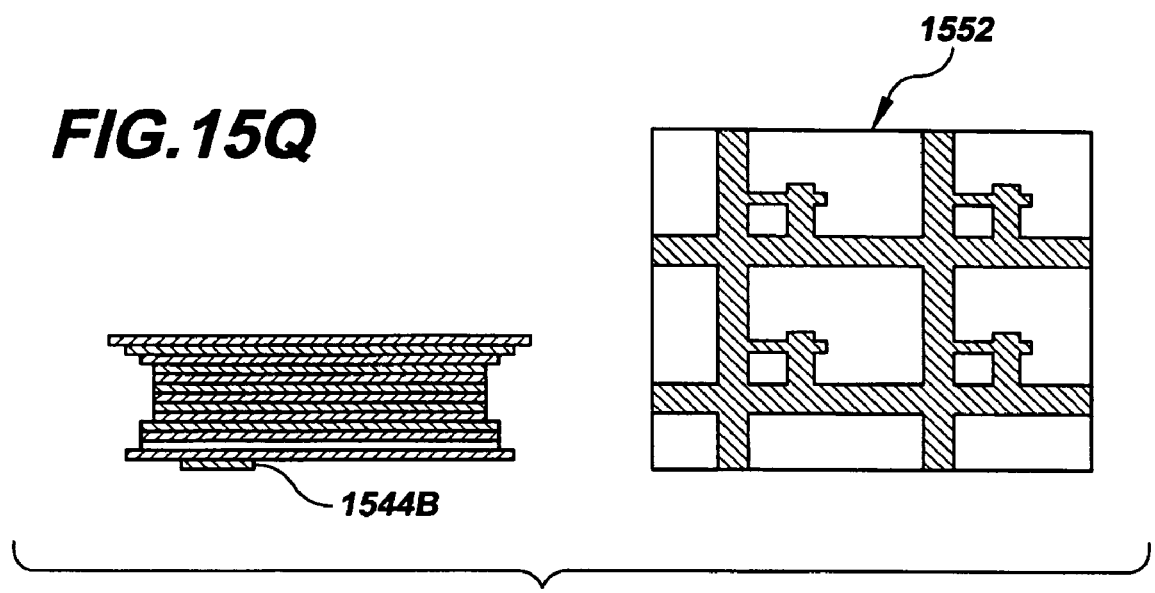
Figure 15R:
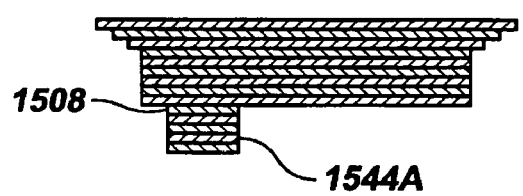
Figure 15S:
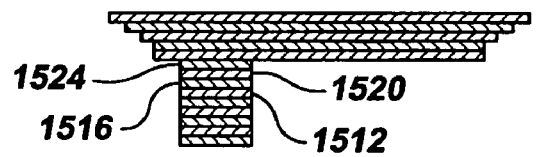
Figure 15T:
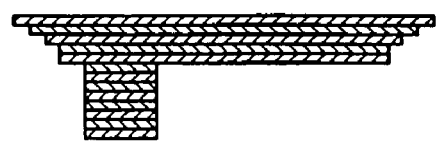
Figure 15U:
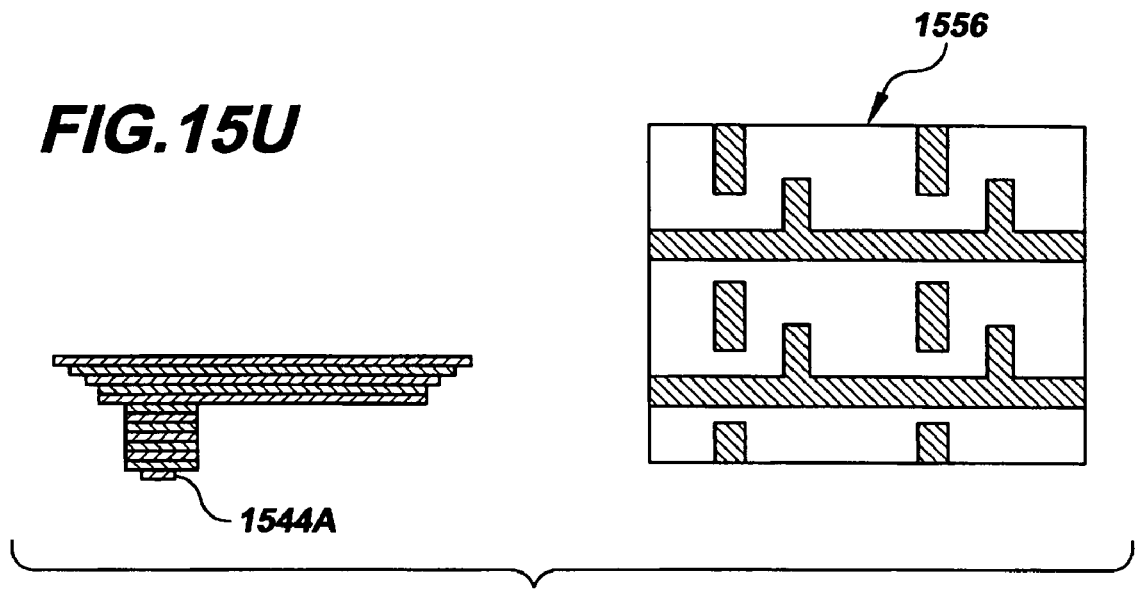
Figure 15V:
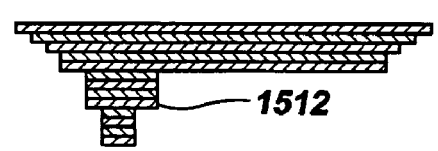
Figure 15W:
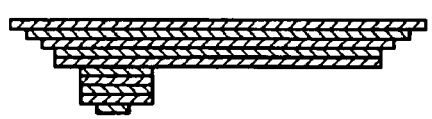
Figure 15X:
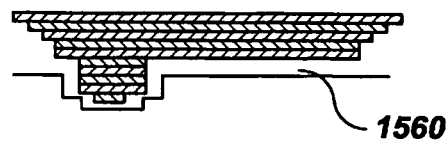
Figure 15Y:
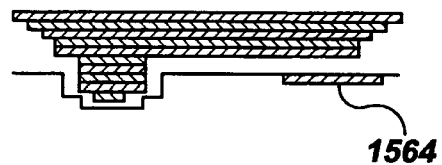

| | |
|---|---|
| Step K: | Laminate a protective, peelable (or water soluble, UV detachable, etc.) protective polymer sheet 1540 on free surface of resist layer coating 1536B. |
| Step L: | Detach stiffener 1504 (FIG. 15K). |
| Step M: | Deposit resist layer coating 1544A on the free surface of the aluminum foil temporary substrate 1500. |
| Step N: | Deposit resist layer coating 1544B onto resist layer coating 1544A. |
| Step O: | Laminate a protective, peelable (or water soluble, UV detachable, etc.) protective polymer sheet 1548 on free surface of resist layer coating 1544B. |
| Step P: | Expose all resist layer coatings 1536A-B, 1544A-B simultaneously using dual wavelength maskless lithography/direct laser writing lithography (see FIG. 7). Note that each of resist layer coatings 1536B, 1544B differs in composition or spectral response from corresponding respective underlying resist layer coatings 1536A, 1544A. Also, each of resist layer coatings 1536B, 1544B is reasonably transparent to the wavelength (be it λ1 or λ2 in FIG. 7) that will be absorbed by corresponding respective underlying resist layer coatings 1536A, 1544A. Resist coating layer 1536A may be identical to resist coating layer 1544A, and resist layer coating 1536B may be equal to resist layer coating 1544B. |
| Step Q: | Develop resist layer coating 1544B using mask pattern 1552. Depending upon whether a positive or negative resist is used, the black portions in top view of mask pattern 1552 illustrated in FIG. 15Q represent either the presence of mask material or the absence of such material. |
| Step R: | Etch resist layer coating 1544A and gate metal layer 1508. |
| Step S: | Etch underlying SiNx insulator layer 1512, hydrogenated amorphous silicon layer 1516, n+ doped amorphous silicon layer 1520 and S/D metal layer 1524 until the underside of ITO layer 1528 is reached. |
| Step T: | Remove any remaining portions resist layer coating 1544B (FIG. 15S). |
| Step U: | Develop resist layer coating 1544A, note mask pattern 1556. Depending upon whether a positive or negative resist is used, the black portions in top view of mask pattern 1556 illustrated in FIG. 15U represent either the presence of mask material or the absence of such material. |
| Step V: | Etch down to SiNx layer 1512 to reveal the gate metal definition, and also to isolate the gate bus lines from each other |
| Step W: | Remove any remaining portions of resist layer coating 1544A (FIG. 15V). |

The following steps are optional.

Figure 15Z:
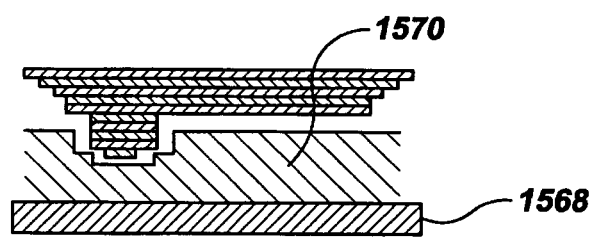
Figure 15A:
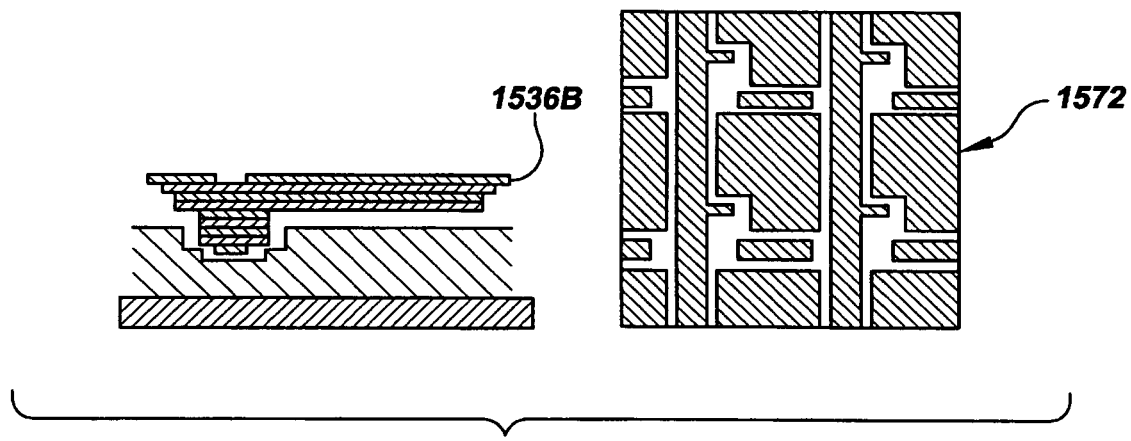
Figure 15A:
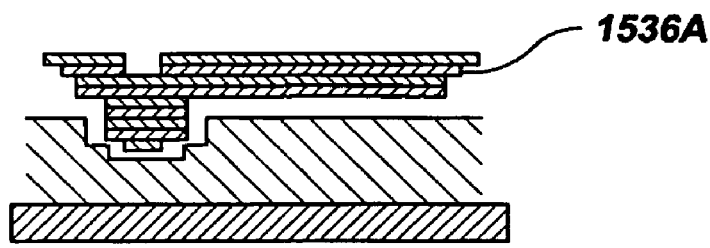
Figure 15A:
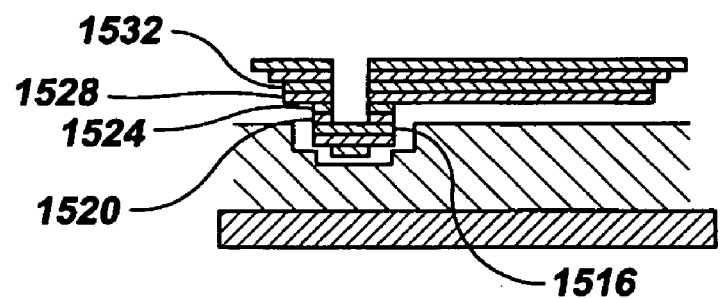
Figure 15A:
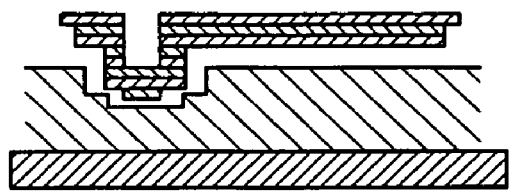
Figure 15A:
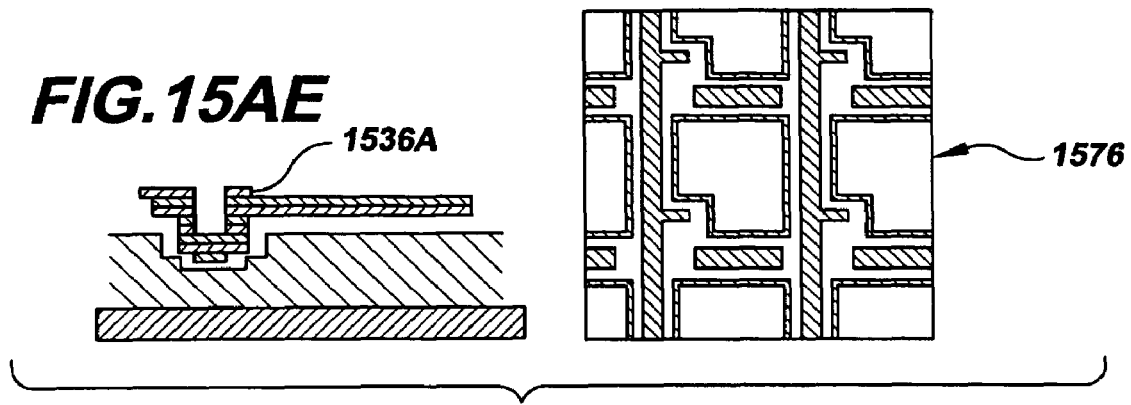
Figure 15A:
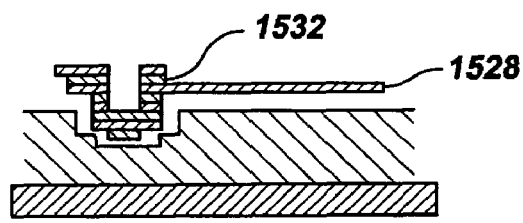
Figure 15A:
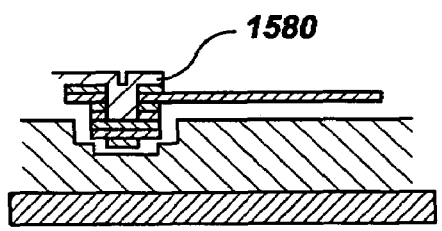
Figure 15A:
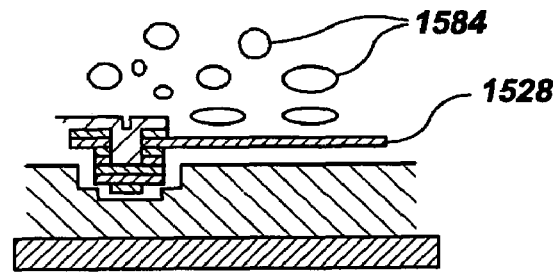

| | |
|---|---|
| Step X: | Deposit a passivation layer 1560. |
| Step Y: | Deposit pixel capacitors 1564 (opaque or transparent) and pattern, if required. |
| Step Z: | Secure a permanent substrate 1568 to passivation layer 1560, if provided, or to whatever other layer permanent substrate 1568 will be attached to, e.g., using an epoxy 1570. Epoxy 1570 can act as a passivation layer for gate metal layer 1508 if required. |
| Step AA: | Develop resist layer coating 1536B (FIG. 15Z). Note imparted pattern 1572 of this layer. |
| Step AB: | Etch resist layer coating 1536A as shown using wet etching or dry etching techniques. |
| Step AC: | Etch passivation layer 1532, ITO layer 1528, TFT channel definition/metal layer 1524 (and the isolation sections to isolate data lines from each other), n+ doped amorphous silicon layer 1520 and partially into hydrogenated amorphous silicon layer 1516. |
| Step AD: | Remove any remaining portions of resist layer coating 1536B (FIG. AC). |
| Step AE: | Develop resist layer coating 1536A (FIG. 15AD). Note imparted pattern 1576. |
| Step AF: | Etch passivation layer 1532 to reveal ITO layer 1528 underneath. |
| Step AG: | Remove any remaining portions of resist layer coating 1536A. Deposit and pattern another passivation layer 1580 on top of the TFT channel if desired. (This may be done locally only on top of TFT channel using ink jet, screen printing etc of a suitable organic or inorganic dielectric layer.) |

-continued

| Step AH: | Deposit/fill an electro-optical material 1584 over pixel electrode layer 1528. |

Regarding Example 13, the following points are noted:
1. The recipe of Example 13 allows for a TFT backplane that can be used in a transmissive LCD and bottom emitting OLED/PLED displays without any issues with photo induced leakage currents in the TFTs. Of course, however, this recipe can produce a universally applicable backplane and may also be used for reflective LCD, front emissive OLED/PLED, electrophoretics and electrochromic displays, among others.
2. Aluminum has a melting point of >650° C. and will easily withstand the PECVD deposition temperature typically used in conventional display manufacturing (<450° C.).
3. In lieu of aluminum foil being used for temporary substrate 1500, as already described in an earlier section of this disclosure, very thin nickel or polyimide sheets, among others, may be used.
4. All patterning of the most critical layers of TFT was effectively performed at one time. Note that device layers may be deposited in reverse order (upside down stack) and still yield the same results. That is, deposit S/D metal layer 1524 first, n+ doped silicon layer 1520 second, hydrogenated amorphous silicon layer 1516 third and silicon nitride layer 1512 third, and then gate metal layer 1508. Of course, the mask positions will need to be reversed, as well.
5. It should be apparent to those skilled in the art that projection/proximity lithography may readily be substituted for the contact lithography shown. In addition, maskless amplitude scanning lithography techniques may also be substituted for the binary masks illustrated.
6. This recipe utilizes a two-coating resist layer on each side. The ITO pixel electrodes can be readily patterned and etched and only require coarse photolithography registration.
7. The most critical alignments are between patterns 1552, 1576 for resist layer coating 1536 (FIGS. 15J and 15Q) and resist layer coating 1540A (FIGS. 15M and 15AE). The other alignments, i.e., for resist layer coatings 1536A, 1544B (FIGS. 15I, 15N, 15U and 15AA) are not as critical and may be done at a later time if so desired.
8. Note that the electro-optical material 1584 for the front plane (e.g., liquid crystal, OLEDs/PLEDs, electrophoretics, electrochromic, among others) will be on ITO layer 1528.
9. This configuration can use the storage-capacitor-on-gate design, or, alternatively, an independent storage capacitor can be made using metal or ITO deposition. Such a capacitor (not shown) can be deposited after the passivation Step X and before lamination to permanent substrate.
10. The TFT channel passivation may be readily done using localized coarse techniques, such as ink jet printing or screen printing using organic dielectrics, without any further need for patterning.
11. It will be readily appreciated by those skilled in the art that using more than one resist layer coating per surface provides additional degrees of freedom in manipulating the TFT pattern. For example, a black matrix may be integrated into the region surrounding the pixel electrode regions. This may be done to increase contrast or to reduce any photo-induced current in the TFT due to the gate and data line isolation sections that would allow light to impinge on the photoconductive amorphous silicon layers. This black matrix could be composed of organic or inorganic materials and may be applied by deposition or screen printing, among other ways.
12. The techniques revealed in this and other examples can be used to make backplanes for displays, X-rays sensors, RFID tags, image sensors for applications like optical character recognition, handy scanners, fingerprint scanners, name card scanners, scanner for personal computers, facsimile machines, photocopiers, computer aided design systems, measurement systems and electronic white boards, among many others.

Example 14

This Example is identical to Example 13 except that there is no deposition of passivation layer 1532 after Step G (deposition of ITO layer 1528), i.e., there is no Step H. In such a scheme, only a single resist layer coating 1536B (FIG. 15J) is required. Correspondingly, only mask pattern 1552 of FIG. 15Q is needed. In place of passivation layer 1532 (FIG. 15H), a passivation layer may be deposited and patterned after Step AD in the recipe of Example 13 above.

Following are some addition points of note relative to all aforementioned examples and embodiments:
1. In lieu of chemical etching, photoablation may be used for removing the photoresist layers and even the coatings layers, if so desired.
2. Photoablation and photo exposure may be integrated so as to create patterns and define underlying layers together.
3. The peelable protective coatings applied to the resist layers for protection may be peeled off prior to resist development. Alternatively, it may be etched off. Also, the exposure of the resist layers may be performed through the peelable coatings. In such cases, it is desirable that the protective coatings be transparent to the wavelength of light (or stimuli) that will be used to pattern the resist material.
4. The recipes of Examples 13 and 14 each utilize more than one imaging layer (in these examples, coating) per resist layer, as described. It will be appreciated that if gray scale lithography is employed, a similar result may be achieved using a single imaging layer.
5. It will be clear to skilled artisans that the channel-width-defining imaging layer (coating) and the gate-width-defining imaging layer (coating) need to be mutually very highly aligned. The other imaging layers may be exposed later if need be. As will be apparent to those skilled in the art, it is advantageous, though not necessary, to expose all imaging layers at once.
6. Inorganic resist materials may be used. Such materials may be deposited by vacuum evaporation or other techniques to yield layers having very uniform thickness. This would allow for very high resolution alignment between the image patterns in the various imaging layers. Such inorganic resist materials would not require any baking or other handling required for organic resist materials. Furthermore, inorganic resist materials may be heated up to high temperatures without destroying the latent image patterned therein during exposure. This unique characteristic would allow the deposition of ITO, pixel capacitor and passivation layers at high temperature after patterning without concern of resist (imaging) deterioration.

7. In current production methodologies for LCD backplanes on glass, fiduciary marks on the glass surface (coatings and photomasks) serve as alignment points for the multiple patterning steps that have to be taken to create a TFT circuit.

8. It will be readily appreciated by those skilled in the art that the techniques and methodologies revealed in the present disclosure may be used not only for opaque (to visible light) semiconductors materials like amorphous silicon and germanium, but also may be used to pattern organic semiconductors and transparent conductive oxides like ZnO, ZnO:Al, $TiO_2$ and TiO, among others.

9. As depicted in some of the examples presented, there can be a concern with photo-induced current in the TFT region due to exposed amorphous silicon under the gate and data bus lines. This can be readily address by creating a light-shield structure on top of the data and gate bus lines using non conductive, dark absorbing black paint, dye or coating (organic or inorganic). Generally, such structures are regularly employed in conventional TFT backplane fabrication technologies and are called "black matrix arrays." In the present invention, however black matrix array may be created both on one surface (data lines) and the other surface (gate lines), or only on one of these surfaces. In addition, black matrix arrays may be created on separate substrate (e.g., on a color filter substrate) or directly on the TFT backplane.

10. The bonding agent (mechanism) used to bond the permanency substrate to the TFT backplane may be an epoxy, adhesive or silicone, among others, as discussed above. This agent may be surface modified using plasma or UV radiation, among other things, to increase bonding strength, if desired. Furthermore, the bonding agent may be degassed to reduce/eliminate bubble formation during dispensing and curing. The bonding may take place in a vacuum environment, controlled gas environment or ambient air, as needed. Additionally, the bonding agent may serve as a planarization layer to smooth over and fill in the etched recesses of the TFT circuitry sheet before lamination. This could be done using liquid monomer, among other things. The planarization layer curing process may be activated by heat, light, UV radiation or microwave radiation, among other things.

As should be apparent from the foregoing disclosure, an EDM method of the present invention may be used in making virtually any of a wide variety of displays that compete in the overall display market. These include, but are not limited to: field-emission displays; LCD displays; OLED displays, including PLED displays; inorganic LED displays; ferroelectric/anti-ferroelectric displays; polymer dispersed liquid crystal displays; thin and thick film electroluminescent displays; thick dielectric film electroluminescent displays; touch panel displays; electrophoretic displays; electrochromic displays and rotating ball type displays. Some of these display are reflective, some are self emissive, whereas others are backlit and/or transparent. As is widely known, active matrix schemes allow for reduced power consumption, higher brightness and expanded gray scale capabilities.

In addition to the wide applicability of the present invention to the display industry, the present invention is also widely applicable to the electronics industry more generally. Similar to the production of TFTs, most electrical circuits (resistors, capacitors, inductors, bus lines, electrodes, etc.) can be miniaturized and realized using CMOS, MOS, FET, MOSFET, BJT, JFET and other semiconductor equivalents. Thus, an EDM method of the present invention allows for the creation of flexible, conformal, single and multi layer electrical integrated circuits. These may be used to create e.g.: two- and three-dimensional mesa structures; TFTs; thin film diodes; other thin film semiconductor devices, such as electrodes (eg. ITO and other transparent and opaque electrodes), silicon resistor elements; system on panel; system on chip; driver integration; integrated signal processors; graphic I/F; small scale memory; ring oscillators; electrodes; switching devices and elements; actuators such as piezoelectric devices; micro mirrors (piezo thin film ceramics); magnetic and magneto-optic recording media and thin film heads; coils; inductors; thin film material with high permeability; micro magnetic devices which may include semiconductor thin films; super conducting thin films; metallic multi-layered semiconductor thin films; ceramic multi-layered semiconductor thin films and multi-layered thin films including organic layers and other layers. All of the aforementioned can be executed in a variety of semiconductor material technologies, whether silicon, CMOS or other technology, including III-V materials.

An EDM method of the present invention may also be used to make integrated circuit (IC) tags, intelligent IC cards, paper thin smart labels, ultra-miniaturized electronic products, smart paper, multi chip modules, implantable chips, identification systems, RFID tags, wearable computers, as well as ILED, OLED, PLED and other electroluminescent devices for use in the lighting industry. These devices may operate not only in the visible spectrum, but also in the UV, NIR and FIR spectra.

Articles manufactured using an EDM method of the present invention allow for flexible, less power hungry and portable/mobile instruments. There are no particular limitations on the variety of electronic articles that can be made. Examples include mobile telephones, mobile video cameras, personal computers, head-mounted displays, and rear- and front-type projectors, a digital signal processing apparatuses, personal digital assistants, electronic organizers, electronic signboards and a displays for advertisements/announcements, to name only a few.

As another particular example, an EDM method of the present invention may be used un the electronic sensor industry. Most conventional sensors rely on a sensing element containing built-in circuitry, feed back loops, read out loops, drivers, etc. (or attached circuitry) in order to function. Similar sensor "packages" may be readily made using techniques of the present invention. For example, x-ray imaging sheets are used for a wide variety of applications, such as medical imaging, non-destructive testing, security imaging in airports and other settings, and home land security, among others. In a particular example, an EDM method of the present invention may be used to create large x-ray imaging sheets used in digital medical platforms. Currently, x-ray imaging sheets are manufactured in small sizes on rigid platforms. The methodology and techniques disclosed herein will allow the realization of x-ray sheets on rigid, flexible and/or conformal platforms and on dimensional scales currently not feasible. Furthermore, the present invention will allow for increased resolution sizes for images in medical diagnostics. Methodologies and techniques of the present invention may also be used to create low-cost, patterned nanotube sensors for toxic gases, medical monitoring, industrial controls, etc.

It is known that sensors and actuators can be distributed along the surfaces of aerospace structures (e.g., wings, fuselage and storage tanks) and can serve to monitor the development of structural flaws, such as cracks, corrosion, voids, de-lamination and joint integrity, or to modify the structure for enhanced performance. However, due to conventional centralized processing of the signals from these sensors, the monitoring system can have hundreds of wire connections and weigh hundreds of pounds. Typically, this processing includes amplification, signal conditioning, routing and switching and analog to digital conversion. The size weight of these systems has limited the use of these types of sensing and actuating techniques to specialized flight-test aircraft. There is a great desire to reduce the space and weight of these sensors and actuators, as well as to reduce the local processing of the sensor data or control of the actuators in order to make these systems more widely usable. In addition, the integration of both sensors and actuators with TFTs operating at the same high voltages of the micro electromechanical systems (MEMS) actuators, would benefit the space and weight requirements.

An EDM method of the present invention may be used to produce TFTs, sensors, and MEMS at low cost with high performance and yield. Such a method allows for conformal/flexible physical integrity monitoring/actuating devices for continual monitoring and actuating of aerospace and marine structures for both military and civilian uses. In addition, signal processors for analyzing the data may likewise be incorporated in these structures for additional functionality. This would allow for low cost, portable and active methods for the non-destructive testing and inspection of large multi-shape structures. Additionally, flexible and conformal digital x-ray TFT arrays may also be incorporated for such diagnostics.

In another example specific to the field of electronic sensors, tactical phased-array radar for battlefield applications involve beam-forming and steering, wherein the shape and angular resolution of a radar beam are a function of the physical size of the array, the number of radiating elements and the distance between them. An EDM method of the present invention may be used to place active phased array elements on flexible substrates, thereby realizing robust, lightweight, low cost, roll-up, portable (even man portable) antennas of array sizes measured in meters. In contrast, current state-of-the-art antenna manufacturing involves placing costly high-performance (i.e., fast switching) transistors, typically in discrete or modular packages, in the right locations within an array and interconnecting them together. Overall costs for larger arrays rapidly become too high to be economically feasible. The revealed process and methodologies allow for roll-to-roll manufacturing of such phased arrays for military and civilian applications.

Figure 16:
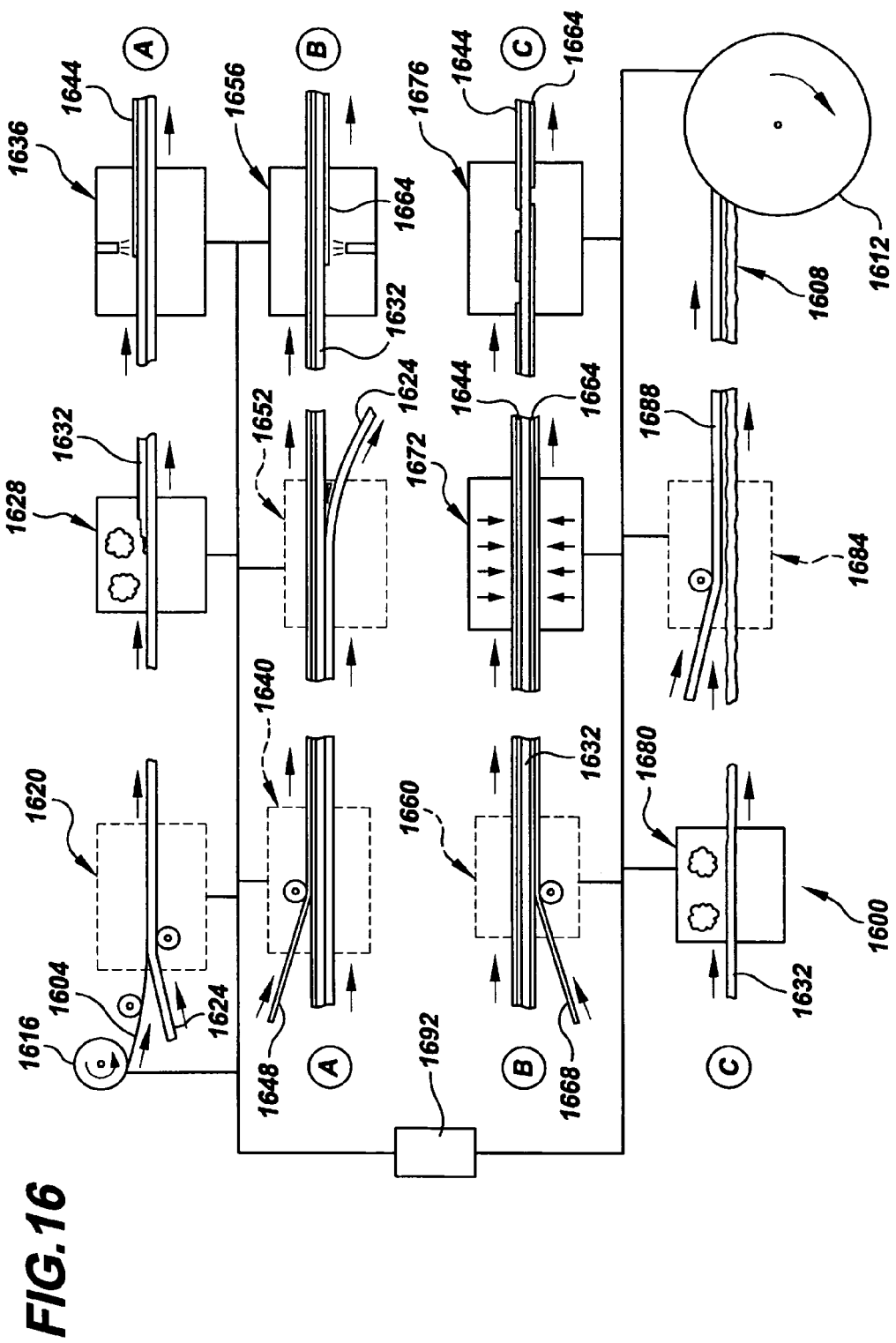
FIG. 16 is a high-level schematic of a roll-to-roll manufacturing system of the present invention.

An exemplary roll-to-roll (or reel-to-reel) system 1600 of the present invention is illustrated in FIG. 16. Roll-to-roll system 1600 may be utilized make virtually any type of circuitry sheet for any of the applications discussed above. Essentially all that is required for this is that at least the starting temporary substrate 1604 and the circuitry sheet 1608 as manufactured using roll-to-roll system 1600 be capable of winding onto and off of suitable rolls 1612, 1616. Roll-to-roll system 1600 may include a suitable number and type of processing stations necessary for performing the manufacturing steps necessary. In the present example, system 1600 is configured for performing various steps of EDM method 200 of FIGS. 2A-B. Those skilled in the art will readily appreciate that system 1600 of FIG. 16 is merely illustrative and that an actual roll-to-roll system of the present invention for performing a method of the present invention may indeed include a different number of stations, different types of stations, different arrangement of stations, etc., suited for the particular application. It is noted that system 1600 shown is a one-pass system, meaning that the sheet moving through the system proceeds in only one direction, generally from unwind roll 1616 to wind roll 1612. Of course, depending upon, e.g., the nature and/or number of the stations utilized, alternative systems of the present invention need not be a one-pass system.

Referring now to FIG. 16, and also to FIGS. 2A-B, as mentioned, roll-to-roll system 1600 is generally configured to perform various steps of EDM method of FIG. 20O, described in detail above. In this connection, system 1600 may include a stiffener attaching station 1620 at which a stiffener 1624 may be attached to temporary substrate 1604 in the manner of step A of FIG. 2A. One or more deposition stations 1628 may be provided for depositing a device layer stack 1632 to temporary substrate 1604 in the manner of step E of FIG. 2A. Although not shown, one or more release layer application stations may be provided for applying one or more release layers to temporary substrate upstream of deposition station(s) 1628 for the purposes discussed above relative to step D of FIG. 2A.

Downstream of deposition station 1628, roll-to-roll system 1600 may include a resist application station 1636 and a protective layer application station 1640 for applying, respectively, a resist layer 1644 and a protective layer 1648 over the resist layer in the manner of steps F and G of FIG. 2A. Next, system 1600 may include a removal station 1652 for removing, in this case, stiffener 1624. As discussed above relative to EDM method 200, removal station 1652 may not be necessary or may be modified so as to remove part or all of temporary substrate 1604 in addition to stiffener 1624. System 1600 may also include another resist application station 1656 and another protective layer application station 1660 for applying, respectively, a resist layer 1664 and a protective layer 1668 on the side of device layer stack 1632 opposite resist and protective layers 1644, 1648 in the manner of steps I and J of FIG. 2B.

Following protective layer application station 1660, roll-to-roll system 1600 may include one or more resist activation stations 1672 one or more resist developing stations 1676 and one or more material removal stations 1680 arranged in a manner suitable for activating and developing resist layers 1644, 1664, including exposing and developing separate imaging layers (not shown) within the resist layers, and then etching the appropriate layers of device layer stack 1632 in the order required for a particular recipe. The activation, e.g., exposure, of resist layers 1644, 1664 and etching are discussed generally above in connection with steps K and L, respectively, of FIG. 2B. Resist activation station 1672 may be a dual-side activation station, as shown, for activating resist layers 1644, 1664 on both sides of device layer stack 1632. For example, resist activation station 1644, 1664 may include, e.g., a multi-wavelength system for exposing multiple image levels within one or more resist layers as discussed above in the section titled "Lithography Techniques", among others Downstream of etching station 1680, roll-to-roll system may include a permanent substrate attaching station 1684 for attaching a permanent substrate 1688 to the processed resist layer stack 1632 in the manner of step M of FIG. 2B. After attaching temporary substrate, circuitry sheet 1608 may be wound onto roll 1612. It is noted that for convenience a number of stations are not shown in FIG. 16, but which those skilled in the art will readily recognize as being needed for performing various other steps of the present invention. For example, FIG. 16 does not illustrate roll-to-roll system 1600 has having various passivation layer application stations, protective layer removal stations and other permanent layer application station(s) for carrying out corresponding respective steps of a method of the present invention. Those skilled in the art will readily appreciate if and where any one or more of these stations should be incorporated into system 1600 given a particular recipe.

Roll-to-roll system 1600 may further include a suitable controller 1692 operatively configured to control the functioning of the system so as to achieve a properly functioning circuitry sheet 1608. Controller 1692 may be programmed via software and/or hardware to perform the necessary steps of, e.g., EDM method of FIGS. 2A-B. Depending upon the design of controller 1692, it may be configured for coarse control of roll-to-roll system 1600, e.g., control only the positioning of circuitry sheet 1608 and the on-off state of the various stations, or it may be configured for fine control so as to not only control these aspects, but also control the functions performed by any one or more or the stations. Those skilled in the art will understand how to design roll-to-roll system 1600 and program controller 1692 for any particular application.

Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. A method of manufacturing an electronic or optoelectronic circuitry sheet, comprising:
   a) forming a device layer stack having a plurality of unpatterned device layers;
   b) locating a resist layer in working relation with said device layer stack; and
   c) activating said resist layer so as to impart a plurality of images distinct from one another at different imaging levels within said resist layer, wherein said plurality of images are imparted substantially simultaneously.

2. A method according to claim 1, wherein said resist layer is a single coating layer.

3. A method according to claim 1, wherein said resist layer comprises a plurality of resist coating layers activated by differing stimuli, and step c) includes activating said resist layer with energy comprising said differing stimuli so as to activate each of said plurality of resist coating layers substantially independently from each other.

4. A method according to claim 1, wherein step c) comprises stimulating said resist layer with a plurality of stimuli corresponding respectively to said plurality of images, said plurality of stimuli selected from the group consisting of electromagnetic energy, thermal energy, electric field energy, magnetic field energy, e-beam energy and sonic energy.

5. A method according to claim 1, further comprising performing steps a), b) and c) sequentially in a roll-to-roll process.

6. A method according to claim 5, further comprising performing steps a), b) and c) in forming at least parts of a plurality of corresponding respective thin film transistors.

7. A method according to claim 1, wherein step a) includes forming said device layer stack on a temporary substrate.

8. A method according to claim 7, further comprising, prior to step b), removing said temporary substrate.

9. A method according to claim 1, wherein the step of locating a resist layer includes locating a positive photoresist layer in working relation with said device stack.

10. A method according to claim 1, wherein the step of locating a resist layer includes locating a negative photoresist layer in working relation with said device stack.

11. A method according to claim 1, wherein the step of locating a resist layer includes locating a hybrid photoresist layer in working relation with said device stack.

* * * * *